(12) United States Patent
Aiki

(10) Patent No.: US 11,099,391 B2
(45) Date of Patent: Aug. 24, 2021

(54) OPTICAL DEVICE, DISPLAY DEVICE, AND METHOD FOR MANUFACTURING LIGHT EMITTING ELEMENT

(71) Applicant: SONY CORPORATION, Tokyo (JP)

(72) Inventor: Kazuma Aiki, Tokyo (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/566,609

(22) Filed: Sep. 10, 2019

(65) Prior Publication Data

US 2020/0004024 A1   Jan. 2, 2020

Related U.S. Application Data

(63) Continuation of application No. 15/768,247, filed as application No. PCT/JP2016/075346 on Aug. 30, 2016, now Pat. No. 10,451,880.

(30) Foreign Application Priority Data

Oct. 28, 2015   (JP) ................................ 2015-211682

(51) Int. Cl.
*G02B 6/32*   (2006.01)
*G02B 27/01*  (2006.01)
(Continued)

(52) U.S. Cl.
CPC ......... *G02B 27/0172* (2013.01); *G02B 6/003* (2013.01); *H01L 27/156* (2013.01);
(Continued)

(58) Field of Classification Search
CPC .. G02B 27/0172; G02B 6/003; G02B 6/0026; G02B 6/005; G02B 2027/0112;
(Continued)

(56) References Cited

U.S. PATENT DOCUMENTS 6,507,379 B1 * 1/2003 Yokoyama ........ G02F 1/133603
349/69
7,623,560 B2 * 11/2009 El-Ghoroury .......... B82Y 20/00
372/50.121
(Continued)

FOREIGN PATENT DOCUMENTS

CN    101874330 A    10/2010
CN    104950442 A     9/2015
(Continued)

OTHER PUBLICATIONS

Non-Final Office Action for U.S. Appl. No. 15/768,247, dated Sep. 21, 2018, 08 pages.
(Continued)

*Primary Examiner* — Ellen E Kim
(74) *Attorney, Agent, or Firm* — Chip Law Group

(57) ABSTRACT

A display device includes a frame and an image display device. The image display device includes an image forming device, a light guide device, and a lens system. The image forming device includes light emitting elements 300 arranged in a two-dimensional matrix. Each of the light emitting elements 300 has a laminated structure 301 including at least one layer of light emitting laminates 310, 320, and 330 each including a first electrode, a second electrode, and a light emitting layer provided between the first electrode and the second electrode. The laminated structure 301 has a through hole 360 through which light from the light emitting layer is emitted toward the lens system. An antireflection layer 370 is formed in a portion of the laminated structure facing the lens system.

18 Claims, 34 Drawing Sheets

(51) Int. Cl.

| | | |
|---|---|---|
| *F21V 8/00* | (2006.01) | |
| *H01L 27/15* | (2006.01) | |
| *H01L 33/00* | (2010.01) | |
| *H01L 33/30* | (2010.01) | |
| *H01L 33/62* | (2010.01) | |
| *H01L 33/44* | (2010.01) | |
| *H01L 33/32* | (2010.01) | |
| *H01L 33/38* | (2010.01) | |
| *H01L 33/58* | (2010.01) | |

(52) U.S. Cl.
CPC .......... *H01L 33/0062* (2013.01); *H01L 33/30* (2013.01); *H01L 33/62* (2013.01); *G02B 6/005* (2013.01); *G02B 6/0026* (2013.01); *G02B 2027/0112* (2013.01); *G02B 2027/0118* (2013.01); *G02B 2027/0174* (2013.01); *G02B 2027/0178* (2013.01); *H01L 33/0075* (2013.01); *H01L 33/32* (2013.01); *H01L 33/382* (2013.01); *H01L 33/44* (2013.01); *H01L 33/58* (2013.01); *H01L 2933/0016* (2013.01); *H01L 2933/0025* (2013.01)

(58) Field of Classification Search
CPC .... G02B 2027/0118; G02B 2027/0174; G02B 2027/0178; H01L 27/156; H01L 33/0062; H01L 33/30; H01L 33/62; H01L 33/0075; H01L 33/32; H01L 33/382; H01L 33/58; H01L 2933/0016; H01L 2933/0025; H01L 33/44
See application file for complete search history.

(56) References Cited

U.S. PATENT DOCUMENTS

| | | |
|---|---|---|
| 9,753,284 B2 | 9/2017 | Machida et al. |
| 2002/0057053 A1* | 5/2002 | Hitoshi ............... H01L 51/5284 313/505 |
| 2004/0021833 A1* | 2/2004 | Koide ................. H04N 9/3138 353/31 |
| 2004/0189185 A1 | 9/2004 | Yotsuya |
| 2007/0285410 A1 | 12/2007 | Shibasaki et al. |
| 2009/0086170 A1 | 4/2009 | El-Ghoroury et al. |
| 2011/0241975 A1 | 10/2011 | Mukawa et al. |
| 2012/0133575 A1 | 5/2012 | Hasegawa |
| 2012/0248977 A1 | 10/2012 | Ootorii |
| 2013/0027714 A1* | 1/2013 | Yoshii ................ G01B 9/02004 356/497 |
| 2013/0082909 A1* | 4/2013 | Miura .................. H01L 51/5275 345/76 |
| 2013/0083404 A1 | 4/2013 | Takagi et al. |
| 2013/0128611 A1 | 5/2013 | Akutsu et al. |
| 2013/0207964 A1 | 8/2013 | Fleck et al. |
| 2014/0091419 A1 | 4/2014 | Hasegawa et al. |
| 2014/0197399 A1 | 7/2014 | Taka |
| 2015/0277125 A1 | 10/2015 | Hirano et al. |

FOREIGN PATENT DOCUMENTS

| | | |
|---|---|---|
| EP | 2208267 A | 7/2010 |
| EP | 2924490 A2 | 9/2015 |
| JP | 08-202288 A | 8/1996 |
| JP | 2002-026439 A | 1/2002 |
| JP | 2002-353519 A | 12/2002 |
| JP | 2005-136080 A | 5/2005 |
| JP | 2007-309045 A | 11/2007 |
| JP | 2010-541248 A | 12/2010 |
| JP | 2015-184561 A | 10/2015 |
| KR | 10-2010-0075566 A | 7/2010 |
| WO | 2009/042455 A2 | 4/2009 |

OTHER PUBLICATIONS

Non-Final Office Action for U.S. Appl. No. 15/768,247, dated Feb. 4, 2019, 08 pages.
Notice of Allowance for U.S. Appl. No. 15/768,247, dated Jun. 12, 2019, 09 pages.
International Search Report and Written Opinion of PCT Application No. PCT/JP2016/075346, dated Oct. 18, 2016, 10 pages of English Translation and 08 pages of ISRWO.
International Preliminary Report on Patentability of PCT Application No. PCT/JP2016/075346, dated May 11, 2018, 10 pages of English Translation and 05 pages of IPRP.

* cited by examiner

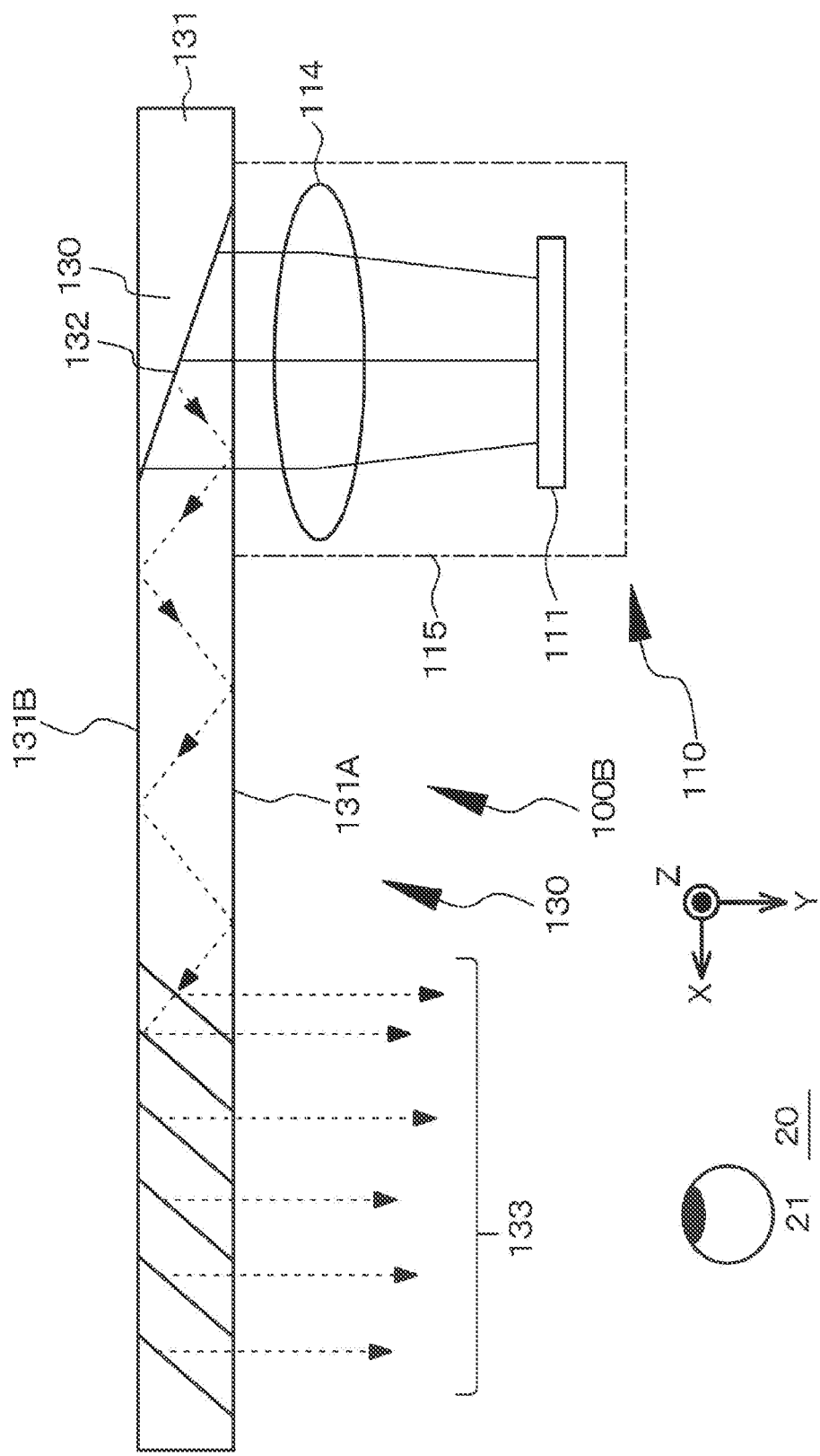

OPTICAL DEVICE, DISPLAY DEVICE, AND METHOD FOR MANUFACTURING LIGHT EMITTING ELEMENT

CROSS REFERENCE TO RELATED APPLICATIONS

This application is a continuation application of U.S. patent application Ser. No. 15/768,247, filed Apr. 13, 2018, which is a U.S. National Phase of International Patent Application No. PCT/JP2016/075346 filed Aug. 30, 2016, which claims priority benefit of Japanese Patent Application No. JP 2015-211682 filed in the Japan Patent Office Oct. 28, 2015. Each of the above-referenced applications is hereby incorporated herein by reference in its entirety.

TECHNICAL FIELD

The present disclosure relates to an optical device, a display device, and a method for manufacturing a light emitting element.

BACKGROUND ART

A display device for causing an observer to observe a two-dimensional image formed by an image forming device as an enlarged virtual image by a virtual image optical system is well known from, for example, Japanese Patent Application Laid-Open No. 2007-309045. As illustrated in the conceptual diagram of FIG. 34, the display device includes an image forming device 911 including a liquid crystal display device having a plurality of pixels arranged in a two-dimensional matrix, a lens system 114 on which an image emitted from the image forming device 911 is incident, and a light guide device 120 on which an image emitted from the lens system 114 is incident, which guides light, and which emits the light. The light guide device 120 includes: a light guide plate 121 from which light incident on the light guide device 120 is emitted after the light is propagated by total reflection inside the light guide device 120; a first deflecting unit 122 for reflecting light incident on the light guide plate 121 such that the light incident on the light guide plate 121 is totally reflected inside the light guide plate 121; and a second deflecting unit 123 for emitting the light propagated by total reflection inside the light guide plate 121 from the light guide plate 121. In addition, if such a display device constitutes, for example, a head mounted display (HMD), the weight and size of the device can be reduced. Each of the first deflecting unit 122 and the second deflecting unit 123 includes, for example, a reflection type volume hologram diffraction grating. In addition, by displaying an image on the display device, an observer 20 can view the displayed image superimposed on an image of an outside world. Incidentally, for the other reference numerals in FIG. 34, refer to reference numerals in a display device described in Example 1.

CITATION LIST

Patent Document

Patent Document 1: Japanese Patent Application Laid-Open No. 2007-309045
Patent Document 2: Japanese Translation of PCT International Application No. 2010-541248

SUMMARY OF THE INVENTION

Problems to be Solved by the Invention

By the way, when light emitted from the image forming device 911 is incident on the lens system 114 located near the image forming device 911, a part of the light is reflected on a surface of the lens system 114 on a side of the image forming device, and is returned to the image forming device 911. Note that such light is referred to as "return light" for convenience. An antireflection film is formed on a surface of the lens system 114, but such return light is still generated. Then, a phenomenon that such return light is reflected on a surface of the image forming device 911 and is incident on the lens system 114 again may occur. Such a phenomenon has a large adverse influence on HMD in which a displayed image superimposed on an image of an outside world is viewed. That is, when such a phenomenon occurs, extra light enters an image observed by the observer 20, and therefore image quality is deteriorated. According to the technology disclosed in the above-described patent publication, by appropriately disposing the image forming device 911 and the light guide device 120, it is possible to effectively prevent light which is emitted from the image forming device 911, passes through the lens system 114, is incident on the light guide device 120, and is reflected by the light guide device 120 from returning to the image forming device 911. However, the above-described patent publication does not describe anything about technology for preventing light reflected by the lens system 114 from returning to the image forming device 911, being reflected by the image forming device 911, and being incident on the lens system 114 again.

Therefore, an object of the present disclosure is to provide an optical device and a display device having a configuration and a structure capable of preventing a part of light emitted from an image forming device from being reflected by a lens system, returning to an image forming device, being reflected by the image forming device, and being incident on the lens system again, and a method for manufacturing a light emitting element constituting the optical device or the display device.

Solutions to Problems

In order to achieve the above object, an optical device of the present disclosure is an optical device including:
an image forming device; and
a lens system for projecting an image from the image forming device on an outside, in which
the image forming device includes light emitting elements arranged in a two-dimensional matrix,
each of the light emitting elements has a laminated structure including at least one layer of a light emitting laminate including a first electrode, a second electrode, and a light emitting layer provided between the first electrode and the second electrode,
the laminated structure has a through hole which is formed in a lamination direction of the laminated structure and through which light from the light emitting layer is emitted toward the lens system, and
an antireflection layer is formed in a portion of the laminated structure facing the lens system.

In order to achieve the above object, a display device of the present disclosure is a display device including:
(a) a frame mounted on the head of an observer; and
(b) an image display device attached to the frame, in which the image display device includes:

(A) an image forming device;
(B) a light guide device for guiding an image from the image forming device to the pupil of an observer; and
(C) a lens system for making an image from the image forming device incident on the light guide device, the image forming device includes light emitting elements arranged in a two-dimensional matrix, each of the light emitting elements has a laminated structure including at least one layer of a light emitting laminate including a first electrode, a second electrode, and a light emitting layer provided between the first electrode and the second electrode, the laminated structure has a through hole which is formed in a lamination direction of the laminated structure and through which light from the light emitting layer is emitted toward the lens system, and an antireflection layer is formed in a portion of the laminated structure facing the lens system.

In order to achieve the above object, a method for manufacturing a light emitting element of the present disclosure includes steps of:

forming a laminated structure including at least one layer of a light emitting laminate including a first electrode, a second electrode, and a light emitting layer provided between the first electrode and the second electrode; then forming an antireflection layer on the laminated structure; and then forming a through hole for emitting light from the light emitting layer toward an outside in the antireflection layer and the laminated structure in a lamination direction of the laminated structure.

Effects of the Invention

In the optical device or the display device of the present disclosure, an antireflection layer is formed in a portion of the laminated structure facing the lens system. In addition, in the method for manufacturing a light emitting element of the present disclosure, a through hole is formed in the antireflection layer and the laminated structure. Therefore, even when a part of light emitted from the image forming device is reflected by the lens system and is returned to the image forming device, the light is not reflected by the image forming device, and it is possible to reliably prevent extra light from entering an image observed by an observer, and it is possible to obtain an image with high image quality. Note that effects described herein are merely illustrative, and are not restrictive. Furthermore, an additional effect may be present.

BRIEF DESCRIPTION OF DRAWINGS

FIG. 14 is a conceptual diagram of an image forming device of Example 2.

FIGS. 26A, 26B, and 26C are diagrams schematically illustrating a change in a virtual image projection region of a light control device and the like.

FIGS. 33B and 330 are a schematic view of a light guide device in another modified example of the display device of Example 4 as viewed from above and a schematic view thereof as viewed from the front, respectively.

MODE FOR CARRYING OUT THE INVENTION

Figure 1:
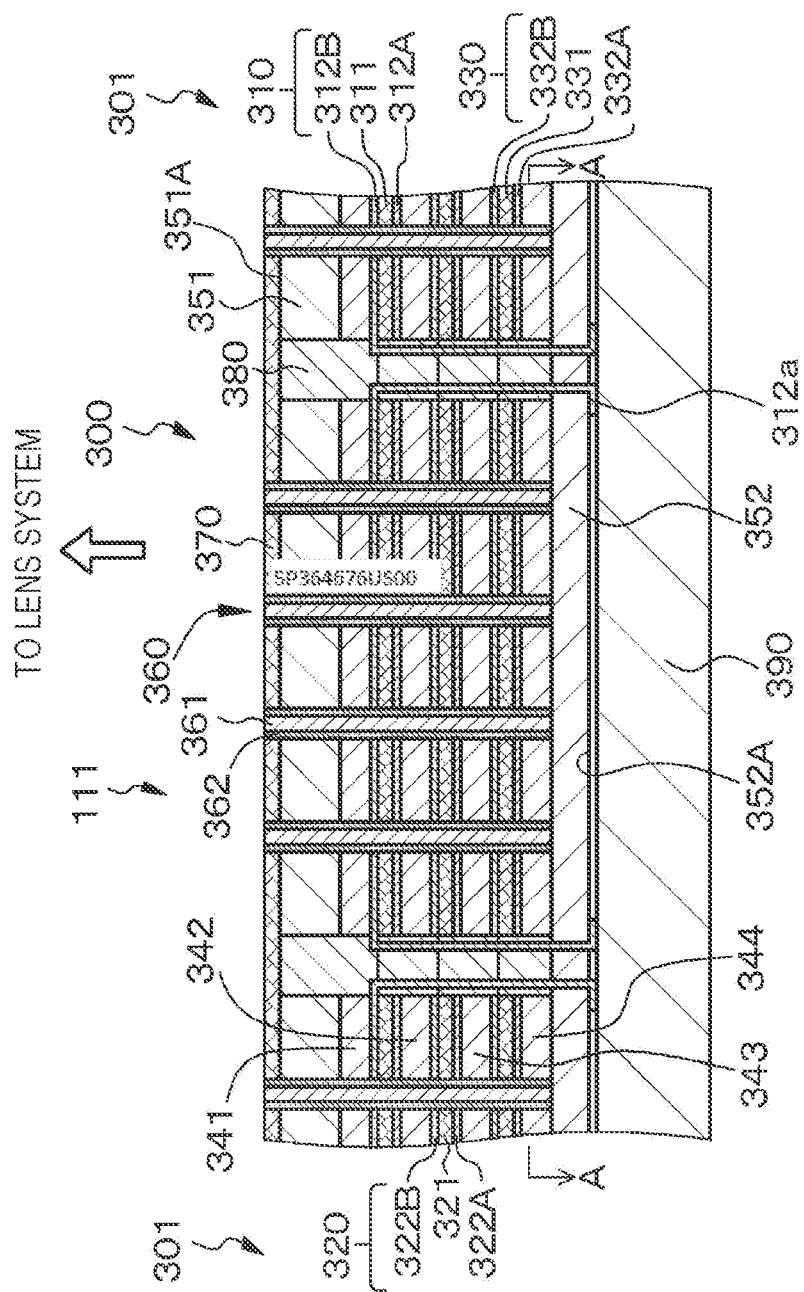
FIG. 1 is a schematic partial cross-sectional view obtained by cutting a light emitting element constituting a display device of Example 1 along a virtual vertical plane.
Figure 2:
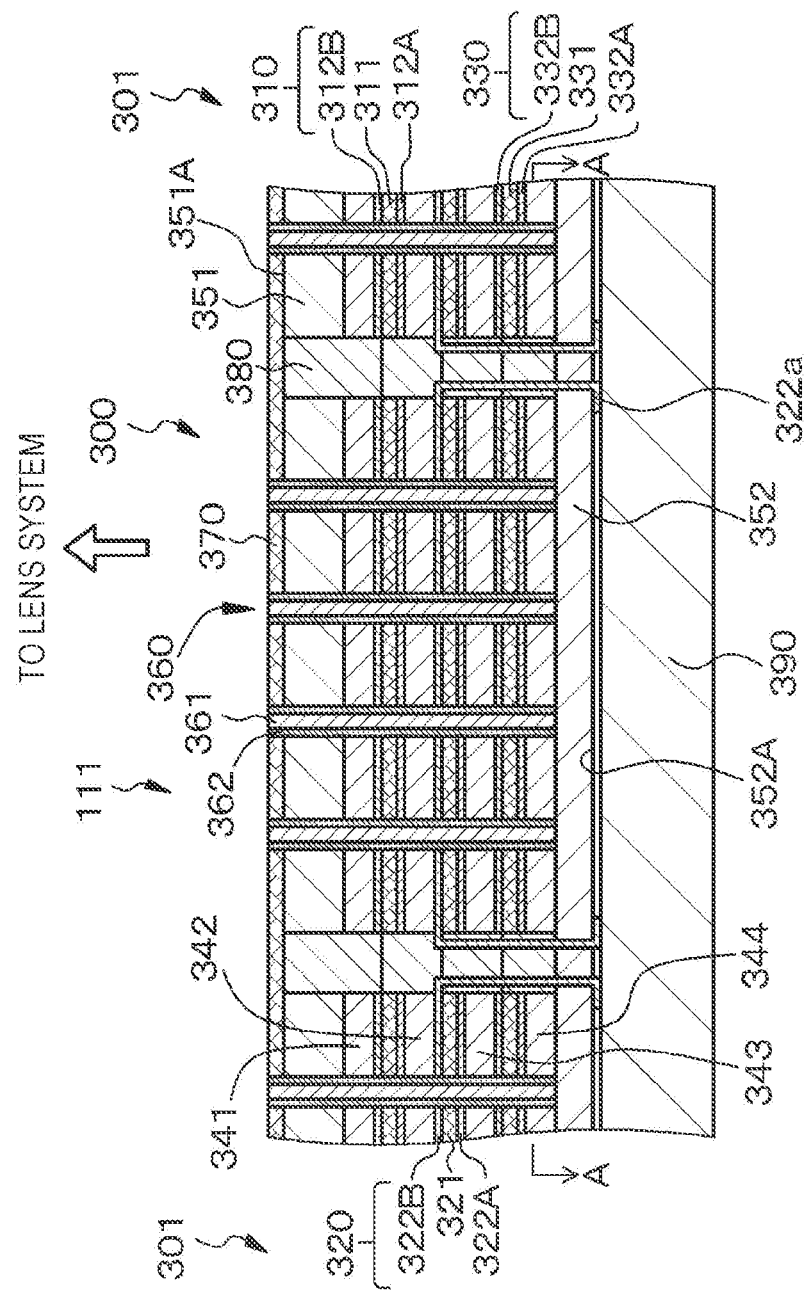
FIG. 2 is a schematic partial cross-sectional view obtained by cutting the light emitting element constituting the display device of Example 1 along a virtual vertical plane different from that in FIG. 1.
Figure 3:
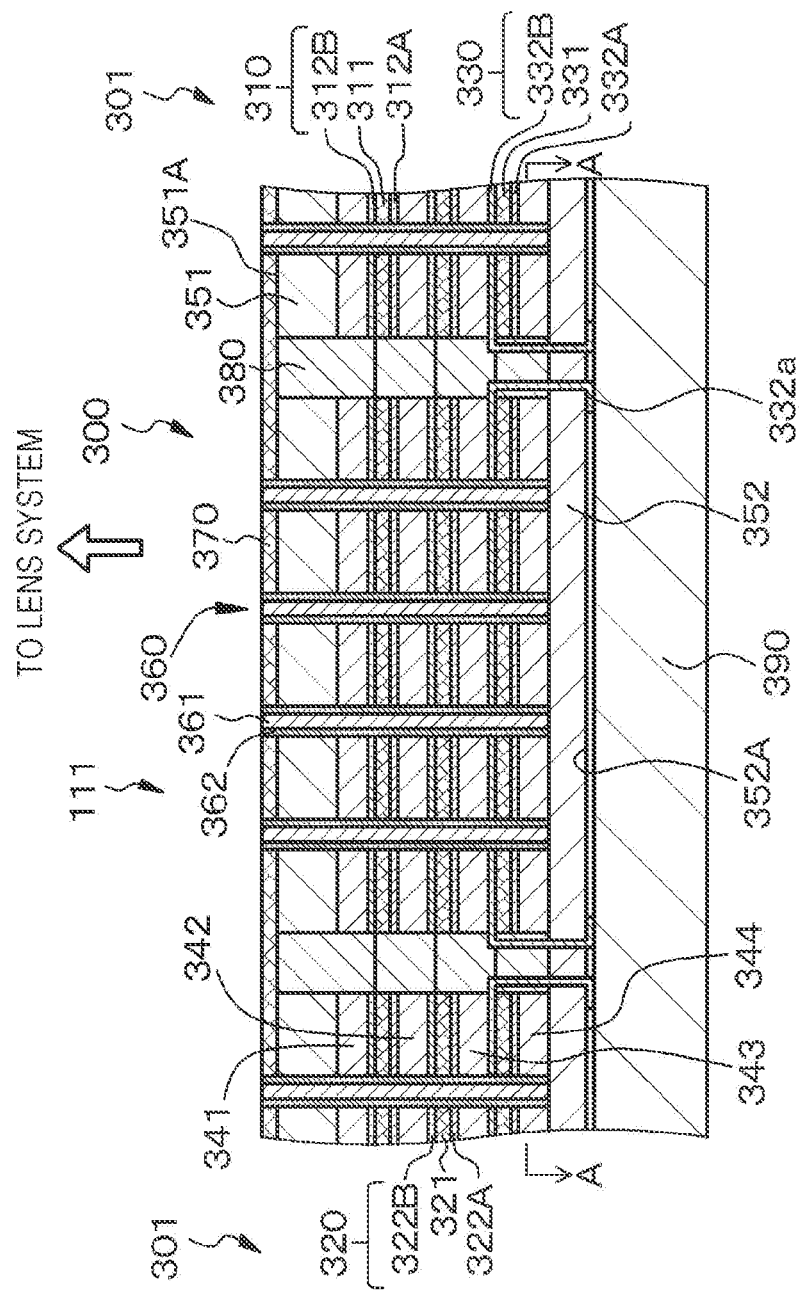
FIG. 3 is a schematic partial cross-sectional view obtained by cutting the light emitting element constituting the display device of Example 1 along a virtual vertical plane different from those in FIGS. 1 and 2.
Figure 4:
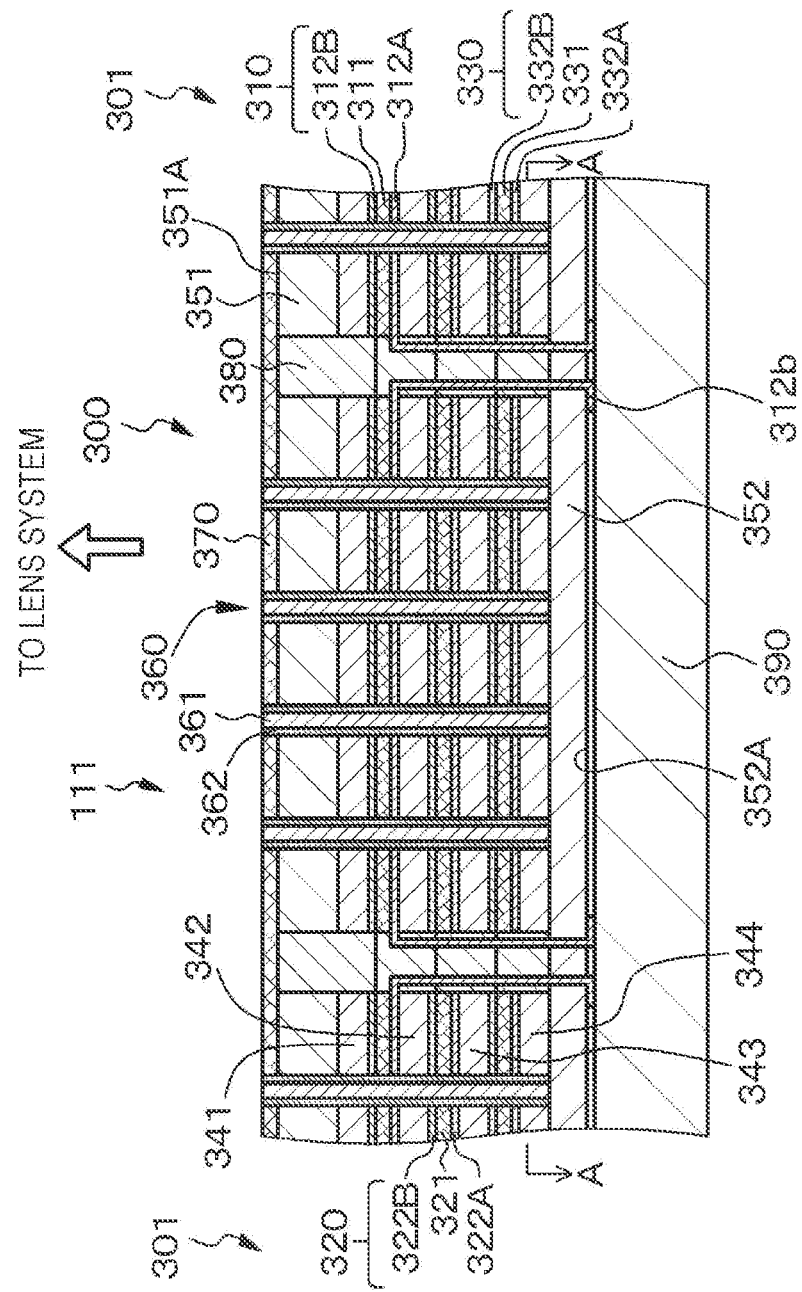
FIG. 4 is a schematic partial cross-sectional view obtained by cutting the light emitting element constituting the display device of Example 1 along a virtual vertical plane different from those in FIGS. 1, 2, and 3.
Figure 5:
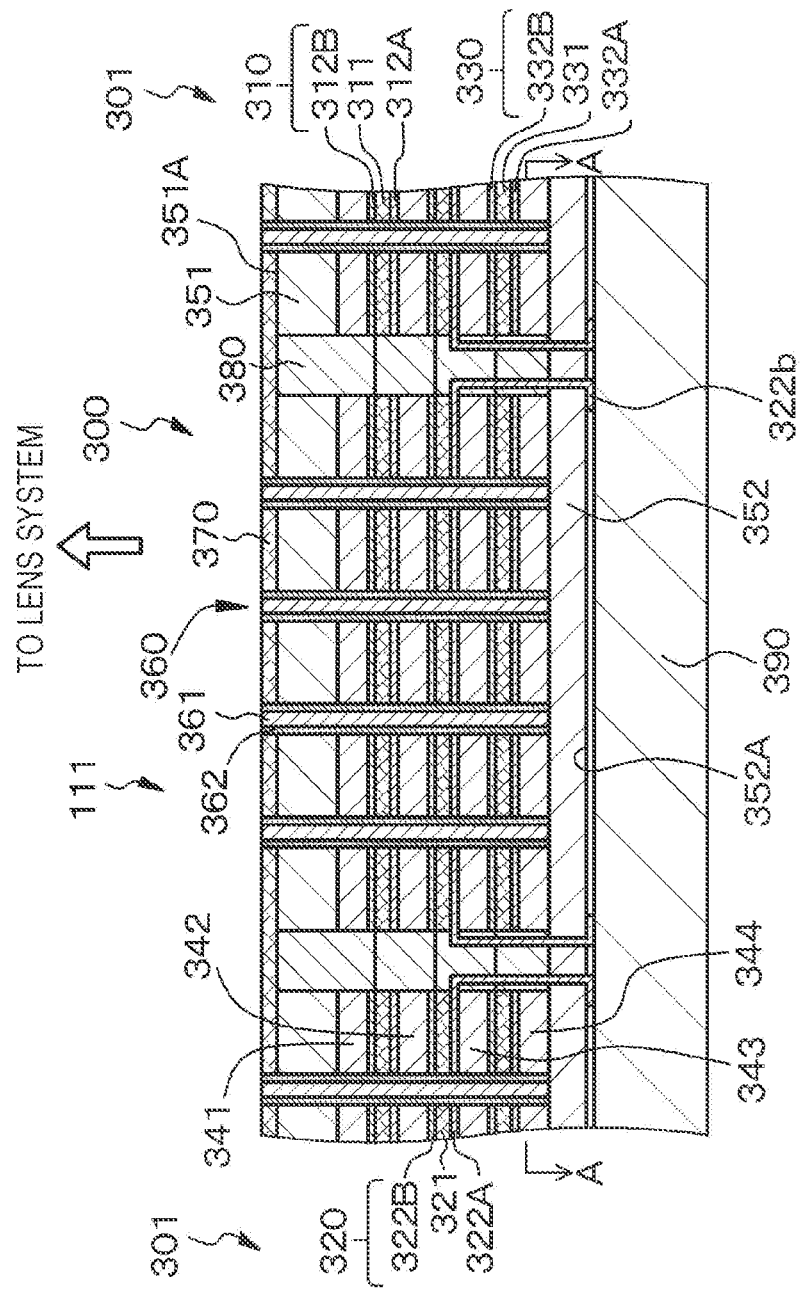
FIG. 5 is a schematic partial cross-sectional view obtained by cutting the light emitting element constituting the display device of Example 1 along a virtual vertical plane different from those in FIGS. 1, 2, 3, and 4.
Figure 6:
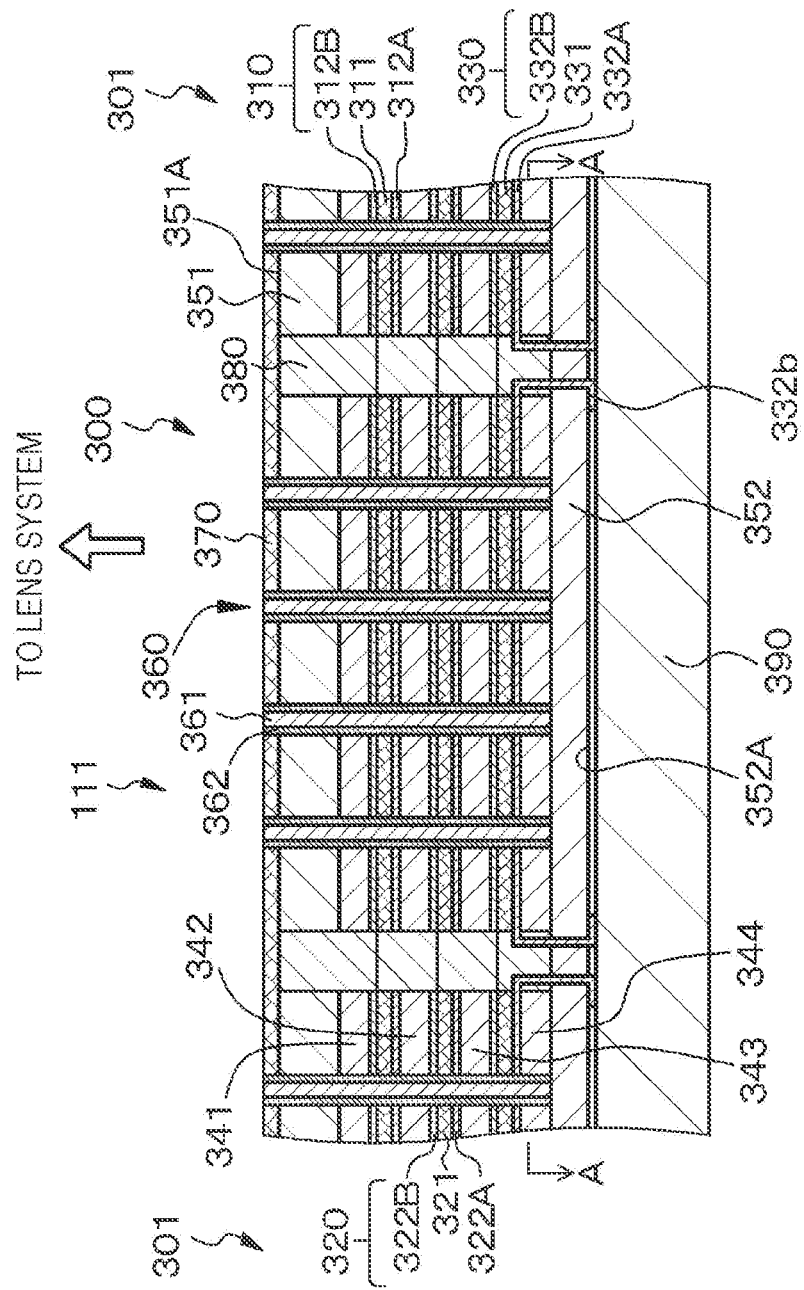
FIG. 6 is a schematic partial cross-sectional view obtained by cutting the light emitting element constituting the display device of Example 1 along a virtual vertical plane different from those in FIGS. 1, 2, 3, 4, and 5.

Hereinafter, the present disclosure will be described on the basis of Examples with reference to the drawings. However, the present disclosure is not limited to Examples, but various numerical values and materials in Examples are illustrative. Note that description will be made in the following order.
1. General description on optical device and display device of the present disclosure, and method for manufacturing light emitting element of the present disclosure
2. Example 1 (display device of the present disclosure, method for manufacturing light emitting element of the present disclosure, and light guide device of first-A configuration)
3. Example 2 (modification of Example 1 and light guide device of first-B configuration)
4. Example 3 (another modification of Example 1 and light guide device of second configuration)
5. Example 4 (still another modification of Example 1 and light guide device of second configuration)
6. Example 5 (modification of Examples 1 to 3 and light shielding member)
7. Example 6 (modification of Examples 1 to 5 and light control device)
8. Example 7 (modification of Example 6)
9. Example 8 (another modification of Example 6)
10. Example 9 (optical device of the present disclosure)
11. Others
<General Description on Optical Device and Display Device of the Present Disclosure, and Method for Manufacturing Light Emitting Element of the Present Disclosure>

In a light emitting element constituting an optical device or a display device of the present disclosure, an antireflection layer may be formed up to an edge portion of a through hole in a laminated structure. That is, when the light emitting element is viewed from a lens system, top surfaces of the antireflection layer and the through hole are visually recognized. More specifically, when the light emitting element is viewed from the lens system, the top surfaces of the antireflection layer and the through hole are visually recognized, and a top surface of the laminated structure is not visually recognized. In a light emitting element obtained by a method for manufacturing a light emitting element of the present disclosure, an antireflection layer is naturally formed up to an edge portion of a through hole in a laminated structure due to the manufacturing method. Incidentally, if an antireflection layer is formed even above a through hole, emitting of light from the through hole is hindered by the antireflection layer.

In the optical device or the display device of the present disclosure including the above preferable form, or in a light emitting element obtained by the method for manufacturing a light emitting element of the present disclosure, a light emitting element may have a laminated structure including three layers of a light emitting laminate that emits red light, a light emitting laminate that emits green light, and a light emitting laminate that emits blue light. The laminating order of these three light emitting laminates is essentially arbitrary.

Furthermore, in the optical device or the display device of the present disclosure including the above preferable form, or in a light emitting element obtained by the method for manufacturing a light emitting element of the present disclosure including the above preferable form, a light emitting element may further include a condenser lens for condensing light emitted from a through hole. Examples of a material constituting the condenser lens include an acrylic resin, an epoxy resin, and a silicone rubber. Examples of a method for forming (disposing) a condenser lens include a reflow method, a potting method, an imprinting method, a photolithography method, an etching method, and a printing method.

Furthermore, in the optical device or the display device of the present disclosure including the above preferable form, or in a light emitting element obtained by the method for manufacturing a light emitting element of the present disclosure including the above preferable form, an image forming device may further include a circuit board on which a light emitting element driving circuit is provided, and each light emitting element may be connected to the light emitting element driving circuit provided on a circuit board.

Furthermore, in the optical device or the display device of the present disclosure including the above preferable form, or in a light emitting element obtained by the method for manufacturing a light emitting element of the present disclosure including the above preferable form, an image forming device may further include a support substrate constituting a laminated structure on a light emitting side. Incidentally, in this case, an antireflection layer is formed on a surface of the support substrate (surface facing a lens system).

Specifically, for example, Japanese Translation of PCT International Application No. 2010-541248 discloses a light emitting element having a laminated structure including at least one layer of a light emitting laminate including a first electrode, a second electrode, and a light emitting layer provided between the first electrode and the second electrode, the laminated structure having a through hole formed in a lamination direction of the laminated structure.

An antireflection layer is formed in a portion of the laminated structure or a support substrate facing a lens system. However, in one form, the antireflection layer is formed on (on a top surface of) the laminated structure or the support substrate. In such a form, examples of a material constituting the antireflection layer include carbon, a metal thin film (for example, chromium, nickel, aluminum, molybdenum, or an alloy thereof), a metal oxide (for example, chromium oxide), a metal nitride (for example, chromium nitride), an organic resin, a glass paste, a glass paste containing conductive particles of a black pigment, silver, or the like, a black dye, and various inks (paints). Specific examples thereof include a photosensitive polyimide resin layer, a chromium oxide layer, and a chromium oxide/chromium laminated structure. In addition, the antireflection layer can be formed on the basis of a method appropriately selected depending on a material to be used, such as a vacuum deposition method, a sputtering method, a spin coating method, various printing methods including an inkjet printing method, a plating method, or a lithography technique. In addition, in another form, an antireflection layer is formed on a laminated structure or a support substrate. In such a form, the antireflection layer may have a moth-eye structure or a fine uneven structure. Specifically, the antireflection layer may have a structure in which a surface of a laminated structure or a support substrate is subjected to uneven processing, for example, on the basis of an etching technique to form unevenness on a surface of the laminated structure or the support substrate. Furthermore, these structures may be appropriately combined with each other.

If light reflectance obtained when visible light (wavelength 400 nm to 700 nm) is incident on a laminated structure or a support substrate having no antireflection layer formed thereon at a predetermined angle of incidence is represented by $R_0$, and light reflectance obtained when light is incident on a laminated structure or a support substrate having an antireflection layer formed thereon at a predetermined angle of incidence is represented by $R_1$, a value of $R_1/R_0$ is 0.5 or less, and desirably 0.1 or less. Note that it is only required to measure light reflectance on the basis of a method described in JIS Z8722:2009 5.3 "Method for measuring reflective object".

Examples of the support substrate include: a transparent inorganic substrate such as a silicon semiconductor substrate, a substrate including a group III-V semiconductor (specifically, GaAs, InP, GaN, AlN, GaP, GaSb, and InAs as a substrate including a III-V group semiconductor), a sapphire substrate, a SiC substrate, a glass substrate (for example, a soda glass substrate, a heat-resistant glass substrate, or a quartz glass substrate), or a quartz substrate; and a transparent plastic substrate or a film (a polyester resin such as polyethylene terephthalate (PET) or polyethylene naphthalate (PEN); a polycarbonate (PC) resin; a polyether sulfone (PES) resin; a polyolefin resin such as polystyrene, polyethylene, or polypropylene; a polyphenylene sulfide resin; a polyvinylidene fluoride resin; a tetraacetyl cellulose resin; a brominated phenoxy resin; an aramid resin; a polyimide resin; a polystyrene resin; a polyarylate resin; a polysulfone resin; an acrylic resin; an epoxy resin; a fluorocarbon resin; a silicone resin; a diacetate resin; a triacetate resin; a polyvinyl chloride resin; a cyclic polyolefin resin; and the like). Examples of a second support substrate described later include a silicon semiconductor substrate and a substrate including a III-V group semiconductor.

Examples of a circuit board on which a light emitting element driving circuit is provided include a silicon semiconductor substrate. It is only required to constitute the light emitting element driving circuit by a well-known driving circuit suitable for driving a light emitting element. Examples of a method for connecting a light emitting element to a light emitting element driving circuit provided on a circuit board include [A] a method for connecting these using a bump (that is, a method for connecting a contact portion provided in an image forming device and extending from a light emitting element to a connection portion including a bump portion provided on a circuit board, referred to as a flip-chip connection method), [B] a metal bonding method for connecting a contact portion provided in an image forming device and including copper (Cu) extending from a light emitting element to a connection portion provided on a circuit board and including copper (Cu), and [C] a connection method using through contact VIA (TCV). Note that it is only required to provide the contact portion, for example, on a second support substrate described later.

The laminated structure of the light emitting laminate itself including the first electrode, the second electrode, and the light emitting layer provided between the first electrode and the second electrode may be a well-known laminated structure. A method for manufacturing the laminated structure may be a well-known manufacturing method. The light emitting layer has a structure in which a plurality of compound semiconductor layers is laminated.

Examples of a layer configuration of a light emitting layer constituting the light emitting laminate that emits red light include a buffer layer including n-type GaAs and first compound semiconductor layer (for example, including a first clad layer including n-type AlGaAs)/active layer including GaAs, AlGaAs, or AlGaInP/second compound semiconductor layer (for example, including a second clad layer including p-type AlGaAs and a cap layer including p-type GaAs). However, the layer configuration is not limited to such a layer configuration. In addition, examples of a layer configuration of a light emitting layer constituting the light emitting laminate that emits green or blue light include a first compound semiconductor layer (for example, including an n-type AlGaN clad layer and an n-type GaN clad layer)/InGaN quantum well active layer/second compound semiconductor layer (for example, including a non-doped InGaN light guide layer, a p-type AlGaN electron barrier layer, a p-type GaN/AlGaN superlattice clad layer, and a p-type GaN contact layer). However, the layer configuration is not limited to such a layer configuration.

Examples of various compound semiconductor layers constituting a light emitting layer include a GaN-based compound semiconductor (including an AlGaN mixed crystal, an AlInGaN mixed crystal, or an InGaN mixed crystal), an InGaNAs-based compound semiconductor (including a GaInAs mixed crystal or a GaNAs mixed crystal), an AlGaInP-based compound semiconductor, an AlAs-based compound semiconductor, an AlGaInAs-based compound semiconductor, an AlGaAs-based compound semiconductor, a GaInAs-based compound semiconductor, a GaInAsP-based compound semiconductor, a GaInP-based compound semiconductor, a GaP-based compound semiconductor, an InP-based compound semiconductor, an InN-based compound semiconductor, and an AlN-based compound semiconductor. Examples of an n-type impurity added to a compound semiconductor layer include silicon (Si), selenium (Se), germanium (Ge), tin (Sn), carbon (C), and titanium (Ti). Examples of a p-type impurity include zinc (Zn), magnesium (Mg), beryllium (Be), cadmium (Cd), calcium (Ca), and barium (Ba), and oxygen (O). An active layer constituting a light emitting layer may include a single compound semiconductor layer, or may have a single quantum well structure (SQW structure) or a multiple quantum well structure (MQW structure). Examples of a method for forming a light emitting layer (film formation method) include a metal organic-chemical vapor deposition method (MOCVD method), a metal organic-vapor phase epitaxy method (MOVPE method), a molecular beam epitaxy method (MBE method), a hydride vapor phase epitaxy method (HVPE method) in which a halogen contributes to transport or a reaction, a plasma assisted physical vapor deposition method (PPD method), an atomic layer deposition method (ALD method), and a migration-enhanced epitaxy (MEE) method. However, the method is not limited thereto.

Here, in a case where a light emitting laminate that emits green light and a light emitting laminate that emits blue light are formed by a MOCVD method, examples of a gas used include a trimethylgallium (TMG) gas, a triethylgallium (TEG) gas, a trimethylaluminum (TMA) gas, a trimethylindium (TMI) gas, and arsine ($AsH_3$). Examples of a nitrogen source gas include an ammonia gas and a hydrazine gas. In addition, for example, in a case where silicon (Si) is added as an n-type impurity (n-type dopant), it is only required to use a monosilane gas ($SiH_4$ gas) as a Si source. In a case where selenium (Se) is added as an n-type impurity (n-type dopant), it is only required to use a $H_2Se$ gas as a Se source. Meanwhile, in a case where magnesium (Mg) is added as a p-type impurity (p-type dopant), it is only required to use a cyclopentadienyl magnesium gas, methylcyclopentadienyl magnesium, or biscyclopentadienyl magnesium ($Cp_2Mg$) as a Mg source. In a case where zinc (Zn) is added as a p-type impurity (p-type dopant), it is only required to use dimethyl zinc (DMZ) as a Zn source. Incidentally, examples of the n-type impurity (n-type dopant) further include Ge, Se, Sn, C, and Ti in addition to Si, and examples of the p-type impurity (p-type dopant) further include Zn, Cd, Be, Ca, Ba, and O in addition to Mg. In addition, in the light emitting laminate that emits red light, examples of a gas used include trimethyl aluminum (TMA), triethyl aluminum (TEA), trimethyl gallium (TMG), triethyl gallium (TEG), trimethyl indium (TMI), triethyl indium (TED, phosphine ($PH_3$), arsine ($AsH_3$), dimethylzinc (DMZ), diethylzinc (DEZ), $H_2S$, hydrogen selenide ($H_2Se$), and biscyclopentane diethylzinc.

In a case of forming a laminated structure of a plurality of light emitting laminates (for example, a first light emitting laminate, a second light emitting laminate, and a third light emitting laminate), a method for sequentially forming the first light emitting laminate, the second light emitting laminate, and the third light emitting laminate on a light emitting laminate manufacturing substrate (corresponding to a support substrate) may be adopted. Alternatively, the following method may be adopted. That is, in advance, a first light emitting laminate is formed on a first light emitting laminate manufacturing substrate, a second light emitting laminate is formed on a second light emitting laminate manufacturing substrate, and a third light emitting laminate is formed on a third light emitting laminate manufacturing substrate. Then, after the first light emitting laminate is laminated on a support substrate, the first light emitting laminate manufacturing substrate is removed, and the second light emitting laminate is laminated on the first light emitting laminate. Thereafter, the second light emitting laminate manufacturing substrate is removed, and the third light emitting laminate is laminated on the second light emitting laminate. Thereafter, the third light emitting laminate manufacturing substrate is removed, and a second support substrate is laminated on the third light emitting laminate. In a case of laminating, a short-circuit between electrodes may be prevented by interposing an insulating layer. The insulating layer may include a well-known insulating material such as silicon oxide ($SiO_X$), silicon nitride ($SiN_Y$), silicon oxynitride ($SiO_XN_Y$), tantalum oxide ($Ta_2O_5$), zirconium oxide ($ZrO_2$), aluminum oxide ($Al_2O_3$), aluminum nitride (AlN), titanium oxide ($TiO_2$), magnesium oxide (MgO), chromium oxide ($CrO_x$), vanadium oxide ($VO_x$), or tantalum nitride (TaN).

Examples of a method for removing a light emitting laminate manufacturing substrate include a laser ablation method and a heating method in addition to a wet etching method and a dry etching method. Examples of a method for laminating a light emitting laminate on a support substrate and a method for laminating a light emitting laminate on a light emitting laminate include a method using an adhesive, a metal bonding method, a semiconductor bonding method, a metal/semiconductor bonding method, a diffusion bonding method, and an anode bonding method.

Examples of the light emitting laminate manufacturing substrate, the first light emitting laminate manufacturing substrate, the second light emitting laminate manufacturing substrate, and the third light emitting laminate manufacturing substrate include a GaN substrate, an AlGaN substrate, an InGaN substrate, an AlInGaN substrate, an InN substrate, an AlInN substrate, a GaAs substrate, a GaP substrate, an InGaP substrate, an AlInGaP substrate, an AlP substrate, an AlGaP substrate, an AlInP substrate, an InP substrate, a sapphire substrate, a SiC substrate, an alumina substrate, a ZnS substrate, a ZnO substrate, an AlN substrate, a LiMgO substrate, a $LiGaO_2$ substrate, a $MgAl_2O_4$ substrate, a Si substrate, a Ge substrate, and those obtained by forming an underlayer or a buffer layer on surfaces (main surfaces) of these substrates. In a case of forming a GaN-based compound semiconductor layer on a substrate, use of a GaN substrate is preferable because of a low defect density. It is known that characteristics of the GaN substrate change among polar/nonpolar/semipolar properties depending on a growth surface. However, any main surface of the GaN substrate can be used for forming a compound semiconductor layer. For a main surface of a substrate, some crystal structures (for example, a cubic type or a hexagonal type) can use a crystal orientation plane referred to as so-called A plane, B plane, C plane, R plane, M plane, N plane, S plane, or the like, planes obtained by turning off these planes in a specific direction, and the like.

For example, the first electrode desirably has a single layer configuration or a multilayer configuration including at least one metal (including an alloy) selected from the group consisting of gold (Au), silver (Ag), palladium (Pd), platinum (Pt), nickel (Ni), Ti (titanium), vanadium (V), tungsten (W), chromium (Cr), Al (aluminum), Cu (copper), Zn (zinc), tin (Sn), and indium (In). Specific examples thereof include Ti/Au, Ti/Al, Ti/Al/Au, Ti/Pt/Au, Ni/Au, Ni/Au/Pt, Ni/Pt, Pd/Pt, Ag/Pd, and Sn/Au. Incidentally, the further forward a layer in "/" of the multilayer configuration is located, the closer to a light emitting layer the layer is located. For example, the second electrode may have a single layer configuration or a multilayer configuration including at least one metal (including an alloy) selected from the group consisting of palladium (Pd), nickel (Ni), platinum (Pt), gold (Au), cobalt (Co), and rhodium (Rh) (for example, a laminated structure of palladium layer/platinum layer in which the palladium layer is in contact with a second compound semiconductor layer or a laminated structure of palladium layer/nickel layer in which the palladium layer is in contact with a second compound semiconductor layer).

The above-described contact portion desirably has a single layer configuration or a multilayer configuration including at least one metal selected from the group consisting of Ti (titanium), aluminum (Al), Pt (platinum), Au (gold), Ni (nickel), Pd (palladium), and copper (Cu). Alternatively, the contact portion may have a multilayer configuration such as a Ti/Pt/Au multilayer configuration, a Ti/Au multilayer configuration, a Ti/Pd/Au multilayer configuration, a Ti/Pd/Au multilayer configuration, a Ti/Ni/Au multilayer configuration, or a Ti/Ni/Au/Cr/Au multilayer configuration. In some cases, a connection portion provided on the above-described circuit board for connecting the contact portion to the first electrode or the second electrode only needs to be selected appropriately from materials constituting the first electrode, the second electrode, and the contact portion.

The first electrode, the second electrode, and the contact portion can be formed by various PVD methods, various CVD methods, or a plating method. Here, examples of the PVD method include (a) various vacuum vapor deposition methods such as an electron beam heating method, a resistance heating method, a flash vapor deposition method, and pulse laser deposition (PLD method), (b) a plasma vapor deposition method, (c) various sputtering methods such as a dipole sputtering method, a direct current sputtering method, a direct current magnetron sputtering method, a high frequency sputtering method, a magnetron sputtering method, an ion beam sputtering method, and a bias sputtering method, (d) various ion plating methods such as a direct current (DC) method, an RF method, a multi-cathode method, an activation reaction method, a hollow cathode discharge (HCD) method, an electric field vapor deposition method, a high frequency ion plating method, and a reactive ion plating method, and (e) an ion vapor deposition method (IVD method). In addition, examples of the CVD method include an atmospheric pressure CVD method, a reduced pressure CVD method, a thermal CVD method, a plasma CVD method, a photo CVD method, and a laser CVD method.

Examples of a method for patterning the first compound semiconductor layer, the active layer, the second compound semiconductor layer, the first electrode, the second electrode, and the contact portion include a dry etching method such as an RIE method and a wet etching method.

If light is emitted in a light emitting laminate, an evanescent field is formed in a boundary region between the light emitting laminate and a through hole. That is, light penetrates through an inside of a through hole that reflects light under a specific condition in a reflection phenomenon of light. This light which has penetrated is called an evanescent field. Light emitted from the evanescent field is called evanescent light or near-field light. In the optical device or the display device of the present disclosure, a light emitting element emits the evanescent light (near-field light) to the lens system, and an image is displayed.

The through hole (vertical waveguide) formed in a laminated structure in a lamination direction of the laminated structure can be formed by a dry etching method such as RIE method, for example. Examples of a cross-sectional shape of the through hole (cross-sectional shape obtained by cutting the through hole with a virtual vertical plane perpendicular to a direction in which the through hole extends (virtual horizontal plane)) include a circle. A side surface of the through hole can be vertical or can have a tapered shape extending to a light emitting side. The through hole may include a core portion and a clad layer disposed between the laminated structure and the core portion. The core portion is filled, for example, with air or a dielectric material such as $SiO_2$, SiN, or $Ta_2O_5$. Meanwhile, the clad layer includes, for example, an outer clad layer (layer in contact with the laminated structure) including an insulating material such as $SiO_2$ and an inner clad layer (layer facing the core portion) including a light-reflecting metal such as aluminum (Al), silver (Ag), or gold (Au). Alternatively, for example, the through hole may be a through hole in which the core portion includes $TiO_2$ and the clad layer includes $SiO_2$, or for example, the through hole may be a through hole in which the core portion includes $TiO_2$, the inner clad layer includes $SiO_2$, and the outer clad layer includes SiN. Alternatively, a polydiacetylene-based compound layer or a polydithienothiophene-based compound layer may be disposed between the laminated structure and the clad layer, and this makes it possible to reduce power consumption of a light emitting element. In addition, the core portion does not have to fill all the through holes. That is, the core portion may be formed in a light emitting layer of a light emitting laminate, or in a region of a through hole facing a light emitting layer and the vicinity thereof.

The optical device of the present disclosure can constitute a so-called projector. That is, by connecting the optical device of the present disclosure to a DVD player or a personal computer, an image can be projected on a screen on the basis of an image signal output from the DVD player or the personal computer. Alternatively, the optical device of the present disclosure can be used as a displaying device in which an observer directly observes an image emitted from the optical device of the present disclosure, and in this case, a lens system may be unnecessary. Furthermore, the optical device of the present disclosure can constitute a part of the display device of the present disclosure.

The display device of the present disclosure can constitute, for example, a head mounted display (HMD). In addition, this makes it possible to reduce the weight and size of the display device, to largely reduce discomfort when the display device is mounted, and further to reduce manufacturing cost. The display device of the present disclosure can also be used as a stereoscopic displaying device. In this case, if necessary, it is only required to detachably attach a polarizing plate or a polarizing film to a light guide plate described later, or to bond the polarizing plate or the polarizing film to the light guide plate.

Examples of the number of pixels (the number of light emitting elements) of the optical device or the display device of the present disclosure include 320×240, 432×240, 640×480, 854×480, 1024×768, and 1920×1080.

A light guide device constituting the display device of the present disclosure can include, for example, a light guide plate, a first deflecting unit, and a second deflecting unit. The first deflecting unit and the second deflecting unit are attached to the light guide plate. Light which has been emitted from the image forming device and has passed through the lens system is incident on the first deflecting unit. Then, the light deflected by the first deflecting unit repeats total reflection inside the light guide plate, is deflected by the second deflecting unit, is emitted from the light guide plate, and reaches the pupil of an observer. Note that the light guide device having such a structure is referred to as a "light guide device of a first configuration" for convenience. Here, the term "total reflection" means total internal reflection or total reflection inside the light guide plate. A virtual image forming region of the light guide device is constituted by the second polarizing unit.

Alternatively, the light guide device may include a semi-transmissive mirror or a polarizing beam splitter (PBS) that receives light emitted from the image forming device and emits the light toward the pupil of an observer. In the former configuration, light forms an image directly on the retina of an observer. The semi-transmissive mirror or the polarizing beam splitter forms a virtual image forming region of the light guide device. Light emitted from the image forming device may be propagated in air to be incident on the semi-transmissive mirror or the polarizing beam splitter. For example, the light may be propagated inside a transparent member such as a glass plate to be incident on the semi-transmissive mirror or the polarizing beam splitter. The semi-transmissive mirror or the polarizing beam splitter may be attached to the image forming device via a transparent member, may be attached to the image forming device via a member different from the transparent member, or may be provided inside the transparent member. Alternatively, the light guide device may include a prism on which light emitted from the image forming device is incident and from which the light is emitted toward the pupil of an observer. Note that the light guide device having various structures described above is referred to as a "light guide device of a second configuration" for convenience.

Hereinafter, the light guide device of the first configuration will be described.

Specifically, the light guide device of the first configuration includes a first deflecting unit for deflecting light incident from a lens system, a light guide plate for propagating the light deflected by the first deflecting unit by total reflection therein, and a second deflecting unit for deflecting and emitting the light propagated by total reflection inside the light guide plate. The light guide plate may be disposed so as to face an image forming device with the lens system interposed therebetween.

Each of the first deflecting unit and the second deflecting unit may include a hologram diffraction grating. Such a light guide device of the first configuration is referred to as a "light guide device of a first-A configuration" for convenience. The hologram diffraction grating may be constituted by a reflection type hologram diffraction grating or a transmission type hologram diffraction grating. Alternatively, in a case where a deflecting unit includes a plurality of hologram diffraction gratings, some of the hologram diffraction gratings may be constituted by a reflection type hologram diffraction grating, and the other hologram diffraction gratings may be constituted by a transmission type hologram diffraction grating. In the hologram diffraction grating, incident light is diffracted and reflected. Note that examples of the reflection type hologram diffraction grating include a reflection type volume hologram diffraction grating. The reflection type volume hologram diffraction grating means a hologram diffraction grating that diffracts and reflects only +1st order diffracted light. In addition, in the following description, a first deflecting unit or the like including a reflection type volume hologram diffraction grating may be referred to as a "first diffraction grating member" for convenience, and a second deflecting unit or the like including a reflection type volume hologram diffraction grating may be referred to as a "second diffraction grating member" for convenience.

The image display device in the present disclosure can display an image of a single color (for example, green). In addition, in this case, although not limited, for example, by dividing an angle of view into two (more specifically, for example, by dividing the angle of view into two equal parts), each of the first diffraction grating member and the second diffraction grating member can be formed by laminating two diffraction grating members corresponding to groups of the angle of view divided into two. Alternatively, in a case where a color image is displayed, each of the first diffraction grating member and the second diffraction grating member can be formed by laminating P diffraction grating layers each including a reflection type volume hologram diffraction grating so as to correspond to diffraction reflection of P types of light having different P types (for example, P=3, and three types of red, green, and blue) of wavelength bands (or wavelengths). In each diffraction grating layer, an interference fringe corresponding to one type of wavelength band (or wavelength) is formed. Alternatively, each of the first diffraction grating member and the second diffraction grating member each including one diffraction grating layer may have P types of interference fringes formed so as to correspond to diffraction reflection of P types of light having different P types of wavelength bands (or wavelengths). Alternatively, for example, a diffraction grating member including a diffraction grating layer including a reflection type volume hologram diffraction grating for diffracting and reflecting light having a red wavelength band (or wavelength) may be disposed on a first light guide plate, a diffraction grating member including a diffraction grating layer including a reflection type volume hologram diffraction grating for diffracting and reflecting light having a green wavelength band (or wavelength) may be disposed on a second light guide plate, a diffraction grating member including a diffraction grating layer including a reflection type volume hologram diffraction grating for diffracting and reflecting light having a blue wavelength band (or wavelength) may be disposed on a third light guide plate, and the first light guide plate, the second light guide plate, and the third light guide plate may be stacked with a gap therebetween. Alternatively, for example, a diffraction grating member including a diffraction grating layer including a reflection type volume hologram diffraction grating for diffracting and reflecting light having a certain color wavelength band (or wavelength) may be disposed on a first light guide plate, a diffraction grating member including a diffraction grating layer including a reflection type volume hologram diffraction grating for diffracting and reflecting light having another color wavelength band (or wavelength) may be disposed on a second light guide plate, and the first light guide plate and the second light guide plate may be stacked with a gap therebetween. Alternatively, for example, by dividing an angle of view into three equal parts, each of the first diffraction grating member and the second diffraction grating member can be formed by laminating diffraction grating layers corresponding to the divided angles of view. In addition, by adopting these configurations, it is possible to increase diffraction efficiency, to increase a diffraction reception angle, and to optimize a diffraction angle when light having each wavelength band (or wavelength) is diffracted and reflected by the first diffraction grating member and the second diffraction grating member.

Examples of a method for manufacturing a diffraction grating member include a method for forming a dry film-shaped photopolymer layer and a method for forming a photopolymer layer sequentially on a support including glass, plastic, or the like in a desired order on the basis of a coating method. Examples of a method for coating a photopolymer include a known coating method such as a die coating method, a gravure coating method, a roll coating method, a blade coating method, a curtain coating method, a dip coating method, a spin coating method, or a printing method. Incidentally, not only a single layer coating method but also a method for simultaneously coating a plurality of layers such as a multilayer slide coating method can be adopted. A protective layer (spacer layer) may be disposed between photopolymer layers by a well-known coating means or a laminating method, as necessary.

In manufacturing a diffraction grating member, by irradiating a photopolymer layer with a reference laser beam and an object laser beam, an interference fringe is recorded on a hologram material (photopolymer) on the basis of refractive index modulation. That is, an interference fringe having a desired surface pitch Λ and slant angle φ is formed. Specifically, for example, by irradiating a photopolymer layer with an object laser beam from a first predetermined direction on one side, and at the same time, by irradiating the photopolymer layer with a reference laser beam from a second predetermined direction on the other side, it is only required to record an interference fringe formed by the object laser beam and the reference laser beam inside the photopolymer layer. By appropriately selecting the first predetermined direction, the second predetermined direction, and the wavelengths of the object laser beam and the reference laser beam, it is possible to obtain a desired surface pitch Λ of an interference fringe in the photopolymer layer and a desired slant angle (inclination angle) of the interference fringe. Here, the slant angle of the interference fringe means an angle formed by a surface of a diffraction grating member and an interference fringe. In a case of forming a plurality of photopolymer layers, it is only required to distribute the photopolymer layers disposed on two light guide plates. For example, in a case where it is necessary to form four photopolymer layers as a first diffraction grating member, it is only required to manufacture the four photopolymer layers by disposing two photopolymer layers on each of the two light guide plates. This makes it possible to secure manufacturing stability of optical characteristics of a diffraction grating member. A photopolymer layer may be formed on each of both surfaces of one light guide plate.

In order to protect a diffraction grating member, a transparent protective member may be disposed. Specifically, an outer edge portion of a light guide plate and an outer edge portion of a transparent protective member may be sealed with a sealing member, or may be bonded to each other. Examples of the sealing member also referred to as a seal agent include various resins including a thermosetting resin, a photocurable resin, a moisture-curable resin, and an anaerobic curing resin, such as an epoxy resin, a urethane-based resin, an acrylic resin, a vinyl acetate-based resin, an ene-thiol-based resin, a silicone-based resin, or a modified polymer resin.

Alternatively, the first deflecting unit may reflect light incident on a light guide plate, and the second deflecting unit may transmit, reflect, and diffract light propagated by total reflection inside the light guide plate a plurality of times. Such a light guide device of the first configuration is referred to as a "light guide device of a first-B configuration" for convenience. In addition, in this case, the first deflecting unit may function as a reflecting mirror, and the second deflecting unit may function as a semi-transmissive mirror. Specifically, for example, the first deflecting unit may include a metal including an alloy, may include a light reflecting film (a kind of mirror) for reflecting light incident on a light guide plate, or may include a multilayer film in which many dielectric laminated films are laminated, a half mirror, or a polarizing beam splitter. In addition, the second deflecting unit may include a multilayer film in which many dielectric laminated films are laminated, a half mirror, a polarizing beam splitter, or a hologram diffraction grating film. In addition, the first deflecting unit and the second deflecting unit are disposed inside a light guide plate (incorporated in the light guide plate). In the first deflecting unit, light incident on the light guide plate is reflected so as to be totally reflected inside the light guide plate. Meanwhile, in the second deflecting unit, light propagated by total reflection inside the light guide plate is reflected or diffracted a plurality of times, and is emitted from the light guide plate.

Assuming a (X, Y, Z) orthogonal coordinate system, the light guide plate has two parallel surfaces (first surface and second surface) extending parallel to an axis of the light guide plate (longitudinal direction and horizontal direction, corresponding to an X axis direction). A width direction (height direction and vertical direction) of the light guide plate corresponds to a Z axis direction, and a normal line of the light guide plate corresponds to a Y axis direction. An interference fringe of a hologram diffraction grating extends substantially in parallel with the Z axis direction. Examples of a material constituting the light guide plate include various glasses including a quartz glass, an optical glass such as BK7 or SK5, a soda lime glass (blue plate glass), a white plate glass, a borosilicate glass, various tempered glasses, and a glass which has been subjected to a chemical treatment (for example, Gorilla (registered trademark) and Eagle XG (registered trademark) available from Corning Incorporated). By performing a chemical treatment, it is possible to increase a specific ion density on a glass surface and to strengthen a glass plate. Alternatively, examples of a material constituting the light guide plate include a plastic material (for example, PMMA, a polycarbonate resin, an acrylic resin, an amorphous polypropylene-based resin, or a styrene-based resin including an AS resin). The shape of the light guide plate is not limited to a flat plate, and may be a curved shape.

The first diffraction grating member may be attached to the second surface of the light guide plate, and the second diffraction grating member may be attached to the second surface of the light guide plate. The first diffraction grating member may be attached to the second surface of the light guide plate, and the second diffraction grating member may be attached to the first surface of the light guide plate. The first diffraction grating member may be attached to the first surface of the light guide plate, and the second diffraction grating member may be attached to the second surface of the light guide plate. The first diffraction grating member may be attached to the first surface of the light guide plate, and the second diffraction grating member may be attached to the first surface of the light guide plate. The first deflecting unit may include two first diffraction grating members (first A diffraction grating member and first B diffraction grating member). The first A diffraction grating member may be attached to the first surface, and the first B diffraction grating member may be attached to the second surface. Alternatively, using two light guide plates, the first A diffraction grating member may be attached to one of the light guide plates, the first B diffraction grating member may be attached to the other light guide plate, and the second diffraction grating member may be attached to either one of the light guide plates. That is, if a surface of a light guide plate on which light is first incident is referred to as a light guide plate incidence surface and a surface of the light guide plate from which light is finally emitted is referred to as a light guide plate emission surface, the first surface may constitute the light guide plate incidence surface and the light guide plate emission surface, or the first surface may constitute the light guide plate incidence surface and the second surface may constitute the light guide plate emission surface.

For convenience, if a surface of the light guide plate facing an observer is the first surface, the image forming device and the lens system may be disposed on the first surface side or the second surface side of the light guide plate.

The lens system in the display device of the present disclosure is an optical system for making light emitted from the image forming device parallel light. A request to make the light incident on the light guide device (light guide plate) parallel light is on the basis of a fact that light wavefront information when the light is incident on the light guide device (light guide plate) needs to be stored even after being emitted from the light guide device via the first deflecting unit and the second deflecting unit. Incidentally, in order to generate parallel light, specifically, for example, it is only required to locate a light emitting portion of the image forming device, for example, at a position (location) of a front focal point in the lens system. The lens system has a function of converting position information of a pixel into angle information in an optical system of the light guide device. Examples of the lens system include an optical system having a positive optical power as a whole, such as a convex lens, a concave lens, a free cured surface prism, or a hologram lens, or a combination thereof. A light shielding portion having an opening may be disposed between the lens system and the light guide device in order to prevent undesired light emitted from the lens system from being incident on the light guide device.

In the light guide device of the first configuration in which the image forming device and the lens system are disposed on the first surface side of the light guide plate, a light shielding member may be disposed outside the second surface of the light guide plate so as to cover the first deflecting unit. In addition, in this case, an orthogonally projected image of the first deflecting unit on the light guide plate may be included in an orthogonally projected image of the light shielding member on the light guide plate.

Alternatively, in the light guide device of the first configuration, a light shielding member for shielding incidence of external light on the light guide device may be disposed in a region of the light guide device on which light emitted from the image forming device is incident. By disposing the light shielding member for shielding incidence of external light on the light guide device in a region of the light guide device on which light emitted from the image forming device is incident, external light is not incident on the region of the light guide device on which light emitted from the image forming device is incident. Therefore, image display quality is not deteriorated by generation of undesirable stray light or the like. Note that the region of the light guide device on which light emitted from the image forming device is incident is preferably included in the orthogonally projected image of the light shielding member on the light guide device.

Specifically, the light shielding member may be disposed on the second surface side of the light guide plate so as to be separated from the light guide plate. In such a configuration, the light shielding member may be manufactured, for example, from an opaque plastic material. In addition, such a light shielding member may integrally extend from a casing of the image display device, may be attached to the casing of the image display device, may integrally extend from a frame, or may be attached to the frame. Alternatively, the light shielding member may be attached to the light guide plate, or may be attached to or disposed in a portion of the light guide plate on the opposite side to the side where the image forming device is disposed. Alternatively, the light shielding member may be disposed in a light control device described next. In this case, an orthogonally projected image of an end portion of the light control device on the light guide plate is preferably included in an orthogonally projected image of the light shielding member on the light guide plate. For example, a light shielding member including an opaque material may be formed on a surface of the light guide plate on the basis of a physical vapor deposition method (PVD method) or a chemical vapor deposition method (CVD method), or a printing method. A film, a sheet, or a foil including an opaque material (plastic material, metal material, alloy material, or the like) may be bonded to the surface of the light guide plate. A projected image of an end portion of the light control device on the light guide plate is preferably included in a projected image of the light shielding member on the light guide plate. By inclusion of the light control device in this way, it is possible to prevent occurrence of such a problem that sufficient contrast cannot be imparted to an image observed by an observer in a case where an environment around the image display device is very bright or according to some contents of a displayed image.

The light control device may be disposed on the second surface side of the light guide plate. The light control device may include, for example, a first substrate, a second substrate facing the first substrate, a first transparent electrode provided on a surface facing the first substrate facing the second substrate, a second transparent electrode provided on a surface facing the second substrate facing the first substrate, and a light control layer sandwiched between the first transparent electrode and the second transparent electrode. In addition, in this case, for example, the first transparent electrode may include a plurality of band-shaped first transparent electrode segments extending in a first direction. The second transparent electrode may include a plurality of band-shaped second transparent electrode segments extending in a second direction different from the first direction. A light shielding ratio of a portion of the light control device corresponding to an overlap region between the first transparent electrode segments and the second transparent electrode segments (minimum unit region in which the light shielding ratio of the light control device changes) may be controlled on the basis of control of voltages applied to the first transparent electrode segments and the second transparent electrode segments. That is, the light shielding ratio can be controlled on the basis of a simple matrix method. The first direction and the second direction may be orthogonal to each other, for example.

Alternatively, a thin film transistor (TFT) may be provided in each of the minimum unit regions in order to control a light shielding ratio of the minimum unit region in which a light shielding ratio of the light control device changes. That is, the light shielding ratio may be controlled on the basis of an active matrix method. Alternatively, at least one of the first transparent electrode and the second transparent electrode may be a so-called solid electrode (electrode not patterned).

The light guide plate may also serve as the first substrate. With such a configuration, it is possible to reduce the weight of the entire display device, and there is no fear to cause a user of the display device to feel uncomfortable. The second substrate may be thinner than the first substrate. In the light guide device of the first configuration including the light control device, the size and the position of a region of the light control device for actually controlling light are determined on the basis of a signal for displaying an image in the image forming device. The size of the light control device may be the same as, larger than, or smaller than that of the light guide plate. In short, the second deflecting unit (or virtual image forming region) only needs to be located in an orthogonally projected image of the light control device.

A maximum light transmittance of the light control device may be 50% or more, and a minimum light transmittance of the light control device may be 30% or less. Incidentally, an upper limit value of the maximum light transmittance of the light control device may be 99%, and a lower limit value of the minimum light transmittance of the light control device may be 1%. Here, there is a relationship of (light transmittance)=1−(light shielding ratio).

The light control device may include an optical shutter in which a light transmission control material layer includes a liquid crystal material layer. Alternatively, the light control device may include an optical shutter in which a light transmission control material layer includes an inorganic electroluminescence material layer. However, the light control device is not limited thereto. In addition, the light control device may include an optical shutter including an electrophoretic dispersion liquid including many charged electrophoretic particles and a dispersion medium having a color different from that of the electrophoretic particles, an optical shutter using an electrodeposition method (electrodeposition·electric field deposition) applying an electrodeposition/dissociation phenomenon generated by a reversible oxidation-reduction reaction of metal (for example, a silver particle), an optical shutter applying a color change of a substance generated by an oxidation-reduction reaction of an electrochromic material, or an optical shutter for controlling a light transmittance by an electrowetting phenomenon.

Here, in a case where the light control device includes an optical shutter in which a light transmission control material layer includes a liquid crystal material layer, a material constituting the light transmission control material layer is not limited, but examples thereof include a twisted nematic (TN) type liquid crystal material and a super twisted nematic (STN) type liquid crystal material. In addition, in a case where the light control device includes an optical shutter in which a light transmission control material layer includes an inorganic electroluminescence material layer, a material constituting the light transmission control material layer is not limited, but examples thereof include tungsten oxide ($WO_3$).

Specific examples of a material constituting the first substrate and the second substrate in the light control device include a transparent glass substrate such as a soda lime glass or a white plate glass, a plastic substrate, a plastic sheet, and a plastic film. Here, examples of the plastic include polyethylene terephthalate, polyethylene naphthalate, polycarbonate, a cellulose ester such as cellulose acetate, a fluorocarbon polymer such as polyvinylidene fluoride or a copolymer of polytetrafluoroethylene and hexafluoropropylene, a polyether such as polyoxymethylene, polyacetal, polystyrene, a polyolefin such as polyethylene, polypropylene, or methylpentene polymer, a polyimide such as polyamideimide or polyetherimide, polyamide, polyether sulfone, polyphenylene sulfide, tetraacetyl cellulose, brominated phenoxy, polyarylate, and polysulfone. The plastic sheet and the plastic film may have rigidity that does not easily bend or may have flexibility. In a case where each of the first substrate and the second substrate includes a transparent plastic substrate, a barrier layer including an inorganic material or an organic material may be formed on an inner surface of the substrate.

Examples of the first transparent electrode and the second transparent electrode include a so-called transparent electrode. Specific examples thereof include an indium-tin composite oxide (indium tin oxide (ITO), including Sn-doped $In_2O_3$, crystalline ITO, and amorphous ITO), fluorine-doped $SnO_2$ (FTO), F-doped $In_2O_3$ (IFO), antimony-doped $SnO_2$ (ATO), $SnO_2$, ZnO (including Al-doped ZnO and B-doped ZnO), indium-zinc composite oxide (indium zinc oxide (IZO)), a spinel type oxide, an oxide having a $YbFe_2O_4$ structure, and a conductive polymer such as polyaniline, polypyrrole, or polythiophene, but are not limited thereto. In addition, two or more kinds thereof can be used in combination. The first transparent electrode and the second transparent electrode can be formed on the basis of a physical vapor deposition method (PVD method) such as a vacuum vapor deposition method or a sputtering method, various chemical vapor deposition methods (CVD methods), various kinds of coating, and the like. Basically, patterning of an electrode is unnecessary. However, in a case of patterning as desired, patterning can be performed by an arbitrary method such as an etching method, a lift-off method, or a method using various masks.

The first substrate and the second substrate are sealed with a sealing member to be bonded to each other at an outer edge portion. Examples of the sealing agent also referred to as a seal agent include various resins including a thermosetting resin, a photocurable resin, a moisture-curable resin, and an anaerobic curing resin, such as an epoxy resin, a urethane-based resin, an acrylic resin, a vinyl acetate-based resin, an ene-thiol-based resin, a silicone-based resin, or a modified polymer resin.

In some cases, light passing through the light control device can be colored to a desired color by the light control device. In addition, in this case, a color to which light is colored by the light control device may be variable or fixed. In the former case, for example, it is only required to laminate a light control device colored in red, a light control device colored in green, and a light control device colored in blue. In addition, in the latter case, a color to which light is colored by the light control device is not limited, but may be brown, for example.

Furthermore, in some cases, the light control device may be detachably disposed. In order to detachably dispose the light control device, for example, the light control device may be attached, for example, to a frame using a screw manufactured from a transparent plastic. Alternatively, the light control device may be attached to a frame by forming a groove in the frame and engaging the light control device with the groove or by attaching a magnet to the frame. Alternatively, the light control device may be fitted in a slide portion by forming the slide portion in a frame. In addition, it is only required to attach a connector to the light control device, and to electrically connect the light control device to a control circuit (for example, included in a control device for controlling an image forming device) for controlling a light shielding ratio (light transmittance) of the light control device via the connector or wiring. The light control device may be curved.

The light shielding member and/or the light control device described above can also be appropriately applied to the light guide device of the second configuration.

The display device of the present disclosure including the light control device may further include an environmental illuminance measuring sensor for measuring illuminance of an environment in which the display device is placed, and may control a light shielding ratio of the light control device on the basis of a measurement result of the environmental illuminance measuring sensor. Alternatively, the display device may further include an environmental illuminance measuring sensor for measuring illuminance of an environment in which the display device is placed, and may control brightness of an image formed by the image forming device on the basis of a measurement result of the environmental illuminance measuring sensor. These forms may be combined with each other.

Alternatively, the display device of the present disclosure including the light control device may further include a transmitted light illuminance measuring sensor for measuring illuminance based on light which has passed through the light control device from an external environment, and may control a light shielding ratio of the light control device on the basis of a measurement result of the transmitted light illuminance measuring sensor. Alternatively, the display device may further include a transmitted light illuminance measuring sensor for measuring illuminance based on light which has passed through the light control device from an external environment, and may control brightness of an image formed by the image forming device on the basis of a measurement result of the transmitted light illuminance measuring sensor. Note that the transmitted light illuminance measuring sensor is desirably disposed closer to an observer than the light guide plate. At least two transmitted light illuminance measuring sensors may be disposed, and illuminance based on light which has passed through a portion with a high light shielding ratio and illuminance based on light which has passed through a portion with a low light shielding ratio may be measured. These forms may be combined with each other. Furthermore, these forms may be combined with the above-described form in which control is performed on the basis of a measurement result of the environmental illuminance measuring sensor.

As described above, if a transmittance of the light control device is controlled on the basis of a measurement result of the environmental illuminance measuring sensor, brightness of an image formed by the image forming device is controlled on the basis of a measurement result of the environmental illuminance measuring sensor, a transmittance of the light control device is controlled on the basis of a measurement result of the transmitted light illuminance measuring sensor, and brightness of an image formed by the image forming device is controlled on the basis of a measurement result of the transmitted light illuminance measuring sensor, it is possible not only to impart a high contrast to an image observed by an observer but also to optimize an observation state of an image depending on illuminance of an environment around the display device. The illuminance sensor (environmental illuminance measuring sensor or transmitted light illuminance measuring sensor) only needs to be constituted by a well-known illuminance sensor, and only needs to be controlled on the basis of a well-known control circuit.

When a measurement result of the environmental illuminance measuring sensor becomes a predetermined value (also referred to as "first illuminance measurement value" for convenience) or more, a light transmittance of the light control device may be set to a predetermined value (also referred to as a "first light transmittance" for convenience) or less. Alternatively, when a measurement result of the environmental illuminance measuring sensor becomes a predetermined value (also referred to as "second illuminance measurement value" for convenience) or less, a light transmittance of the light control device may be set to a predetermined value (also referred to as a "second light transmittance" for convenience) or more. Furthermore, in view of illuminance of the environmental illuminance measuring sensor, in a case where a measurement result of the transmitted light illuminance measuring sensor is not desired illuminance, or in a case where even more delicate illumination adjustment is desired, it is only required to adjust a light transmittance of the light control device while a value of the transmitted light illuminance measuring sensor is monitored. Here, the first illuminance measurement value may be 10 lux, and the first light transmittance may be any value of 1% to 30%, the second illuminance measurement value may be 0.01 lux, and the second light transmittance may be any value of 51% to 99%. In addition, in a case where an illuminance measurement value of the environmental illuminance measuring sensor is $1 \times 10^{-3}$ lux or less, for example, a driving voltage of the light control device is preferably controlled to shorten driving time and to increase a light transmittance of the light control device.

As described above, the light guide device is a semi-transmissive type (see-through type). Specifically, at least a portion of the light guide device facing the eyeball (pupil) of an observer is made semi-transmissive (see-through), and an outside scene can be viewed through this portion (and further through a light control device in a case where the light control device is disposed) of the light guide device. The display device of the present disclosure may include one image display device (single eye type) or two display devices (binocular type). In a case where a light control device is disposed, in a binocular type, on the basis of a signal for displaying an image, a light transmittance of a part of the light control device may be changed in both image display devices, or a light transmittance of a part of the light control device may be changed in one of the image display devices. Incidentally, here, the term "semi-transmissive" may be used, and the term "semi-transmissive" does not mean that a half (50%) of incident light is transmitted or reflected, but means that a part of incident light is transmitted and the remaining light is reflected.

The frame includes a front portion disposed in front of an observer and two temple portions rotatably attached to both ends of the front portion via hinges. Note that a modern portion is attached to a distal end portion of each of the temple portions. The front portion may have a rim. The image display device is attached to the frame. Specifically, for example, it is only required to attach the image forming device to the temple portions. In addition, the front portion and the two temple portions may be integrally formed. That is, when the entire display device of the present disclosure is viewed, the frame has substantially the same structure as ordinary eyeglasses. A material constituting the frame including a pad portion may be the same material as a material constituting ordinary eyeglasses, such as metal, alloy, plastic, or a combination thereof. Furthermore, a nose pad may be attached to the front portion. That is, when the entire display device of the present disclosure is viewer, an assembly of the frame (including a rim in some cases) and the nose pad has substantially the same structure as ordinary eyeglasses. The nose pad may also have a well-known configuration and structure.

In a case where a light control device is disposed, the light control device may be disposed in the front portion. In addition, the light guide device may be attached to the light control device. Incidentally, the light guide device may be attached to the light control device while being in a close contact thereto, or may be attached to the light control device with a gap therebetween. In addition, the light control device may be fitted in a rim. Alternatively, at least one of the first substrate and the second substrate may be attached to the frame, for example. However, the present disclosure is not limited thereto. From an observer side, the light guide device and the light control device may be disposed in this order, or the light control device and the light guide device may be disposed in this order.

Wiring (signal line, power supply line, or the like) from one or two image forming devices desirably extends from a distal end portion of a modern portion to an outside via a temple portion and an inside of the modern portion to be connected to a control device (control circuit or control means) from a viewpoint of design of the display device or ease of mounting. Furthermore, more desirably, each image forming device includes a headphone portion, and headphone portion wiring from each image forming device extends from a distal end of the modern portion to the headphone portion via the temple portion and an inside of the modern portion. Examples of the headphone portion include an inner ear type headphone portion and a canal type headphone portion. More specifically, the headphone portion wiring preferably extends from a distal end portion of the modern portion to the headphone portion so as to go around a back side of the auricle (auditory capsule). In addition, an imaging device may be attached to the central portion of the front portion. Specifically, the imaging device includes, for example, a solid-state imaging element including a CCD or CMOS sensor and a lens. Wiring from the imaging device only needs to be connected to one of the image display devices (or the image forming devices), for example, via the front portion. Furthermore, the wiring only needs to be included in wiring extending from the image display device (or the image forming device). The imaging device may be attached to the central portion or an end portion of the frame or may be attached to the temple portion.

Alternatively, in a case where the display device of the present disclosure is a binocular type, a light guide plate may be disposed on a central side of the face of an observer with respect to an image forming device as a whole. The display device may further include a connecting member to connect two image display devices to each other. The connecting member may be attached to a side facing an observer in a central portion of a frame located between the two pupils of the observer. A projected image of the connecting member may be included in a projected image of the frame.

In this way, if a connecting member is attached to a central portion of a frame located between the two pupils of an observer, that is, if an image display device is not directly attached to the frame, a temple portion expands outward when the observer wears the frame on the head. As a result, even if the frame deforms, due to the deformation of the frame, displacement (position change) of an image forming device or a light guide plate is not generated, or is extremely small even if the displacement (position change) is generated. Therefore, it is possible to reliably prevent a convergence angle of left and right images from changing. In addition, there is no need to increase rigidity of a front portion of the frame. Therefore, an increase in weight of the frame, deterioration of designability, and an increase in cost are not caused. In addition, the image display device is not directly attached to the frame. Therefore, it is possible to freely select design, color, and the like of the frame according to preference of an observer, there are few restrictions on the design of the frame, and the degree of freedom in design is high. In addition, the connecting member is disposed between an observer and the frame, and a projected image of the connecting member is included in a projected image of the frame. In other words, when the head mounted display is viewed from the front of an observer, the connecting member is concealed by the frame. Therefore, the head mounted display can have a high design property and design characteristic.

Note that the connecting member is preferably attached to a side facing an observer in a central portion of the front portion (corresponding to a bridge portion in ordinary eyeglasses) located between the two pupils of the observer.

The two image display devices are connected by the connecting member. Specifically, the image forming device may be attached to each end portion of the connecting member such that an attachment state can be adjusted. In addition, in this case, each image forming device is preferably located outside the pupils of an observer. Furthermore, in such a configuration, if a distance between the center of an attachment portion of one of the image forming devices and one end portion (one endpiece, wraparound endpiece) of the frame is represented by $\alpha$, a distance between the center of the connecting member and one end portion (one endpiece) of the frame is represented by $\beta$, a distance between the center of an attachment portion of the other image forming device and one end portion (one endpiece) of the frame is represented by $\gamma$, and the length of the frame is represented by L, $0.01 \times L \leq \alpha \leq 0.30 \times L$ is satisfied, $0.05 \times L \leq \alpha \leq 0.25 \times L$ and $0.35 \times L \leq \beta \leq 0.65 \times L$ are preferably satisfied, $0.45 \times L \leq \beta \leq 0.55 \times L$ and $0.70 \times L \leq \gamma \leq 0.99 \times L$ are preferably satisfied, and $0.75 \times L \leq \gamma \leq 0.95 \times L$ is preferably satisfied. In attachment of the image forming device to each end portion of the connecting member, specifically, for example, through holes are formed at three end portions of the connecting member, screwing portions corresponding to the through holes are formed on the image forming device, and screws are caused to pass through the through holes to be screwed into the screwing portions formed in the image forming device. A spring is inserted between each of the screws and each of the screwing portions. In this way, an attachment state of the image forming device (inclination of the image forming device with respect to the connecting member) can be adjusted according to a fastening state of the screws.

Here, the center of the attachment portion of the image forming device refers to a bisecting point of a portion where a projected image of the image forming device obtained by projecting the image forming device and the frame onto a virtual plane overlaps with a projected image of the frame in an axial direction of the frame while the image forming device is attached to the connecting member. In addition, the center of the connecting member refers to a bisecting point of a portion where the connecting member is in contact with the frame in the axial direction of the frame while the connecting member is attached to the frame. The length of the frame is the length of a projected image of the frame in a case where the frame is curved. Note that a projection direction is assumed to be a direction perpendicular to the face of an observer.

Alternatively, specifically, the connecting member may connect the two light guide plates to each other although the two image display devices are connected to each other by the connecting member. Note that there is a case where the two light guide plates are integrally manufactured. In such a case, the connecting member is attached to the integrally manufactured light guide plates. However, such a form is also included in a form in which the connecting member connects the two light guide plates to each other. If a distance between the center of one of the image forming devices and one end portion of the frame is represented by $\alpha'$ and a distance between the center of the other image forming device and one end portion of the frame is represented by $\gamma'$, values of $\alpha'$ and $\gamma'$ are desirably set to similar values to the above values α and γ. Note that the center of the image forming device refers to a bisecting point of a portion where a projected image of the image forming device obtained by projecting the image forming device and the frame onto a virtual plane overlaps with a projected image of the frame in an axial direction of the frame while the image forming device is attached to the light guide plate.

The shape of the connecting member is essentially arbitrary as long as a projected image of the connecting member is included in a projected image of the frame, and examples thereof include a bar shape or an elongated plate shape. Examples of a material constituting the connecting member include metal, alloy, plastic, and a combination thereof.

The display device of the present disclosure can receive a signal for displaying an image in the image display device (a signal for forming a virtual image in the light guide device) from an outside. In such a form, information and data regarding an image displayed on the image display device is recorded, kept, and stored, for example, in a so-called cloud computer or a server. By inclusion of a communication unit such as a mobile phone or a smartphone in the display device or by combination of the display device and a communication unit, various kinds of information and data can be transmitted and exchanged between the cloud computer or the server and the display device, and a signal based on various kinds of information and data, that is, a signal for displaying an image in the image display device (a signal for forming a virtual image in the light guide device) can be received. Alternatively, a signal for displaying an image in the image display device (a signal for forming a virtual image in the light guide device) may be stored in the display device. Note that an image displayed on the image display device includes various kinds of information and various kinds of data. Alternatively, the display device may include an imaging device. An image imaged by the imaging device may be sent to a cloud computer or a server via a communication unit. The cloud computer or the server may retrieve various kinds of information and data corresponding to the image imaged by the imaging device. The various kinds of retrieved information and data may be sent to the display device via the communication unit, and may be displayed on the image display device.

When the image imaged by the imaging device is sent to the cloud computer or the server via the communication unit, the image imaged by the imaging device may be displayed on the image display device to be confirmed by the light guide device. Specifically, an outer edge of a space region imaged by the imaging device may be displayed in a frame shape in the light control device. Alternatively, the light shielding ratio of a region of the light control device corresponding to the space region imaged by the imaging device may be higher than the light shielding ratio of a region of the light control device corresponding to an outside of the space region imaged by the imaging device. In such a form, an observer sees the space region imaged by the imaging device darker than an outside of the space region imaged by the imaging device. Alternatively, the light shielding ratio of a region of the light control device corresponding to the space region imaged by the imaging device may be lower than the light shielding ratio of a region of the light control device corresponding to an outside of the space region imaged by the imaging device. In such a form, an observer sees the space region imaged by the imaging device brighter than an outside of the space region imaged by the imaging device. In addition, this makes it possible for an observer to easily and reliably recognize a position in an outside to be imaged by the imaging device.

A position in a region of the light control device corresponding to the space region captured by the imaging device is preferably calibrated. Specifically, for example, by inclusion of a mobile phone or a smartphone in the display device or by combination of the display device with a mobile phone, a smartphone, or a personal computer, in a mobile phone, a smartphone, or a personal computer, the mobile phone, the smartphone, or the personal computer can display a space region imaged by the imaging device. In addition in a case where there is a difference between the space region displayed on the mobile phone, the smartphone, or the personal computer and a region of the light control device corresponding to a space region imaged by the imaging device, by moving/rotating/swiveling or enlarging/reducing a region of the light control device corresponding to a space region imaged by the imaging device using a control circuit (which can be substituted by a mobile phone, a smartphone, or a personal computer) for controlling a light shielding ratio (light transmittance) of the light control device, it is only required to eliminate the difference between the space region displayed on the mobile phone, the smartphone, or the personal computer and the region of the light control device corresponding to a space region imaged by the imaging device.

The display device of the present disclosure including the above-described various modified examples can be used, for example, for receiving/displaying an electronic mail; displaying various kinds of information or the like in various sites on the Internet; display of various explanations, for example, for driving, operating, maintaining, or disassembling an observation object such as various devices, a symbol, a sign, a mark, an emblem, a design, or the like; display of various explanations concerning an observation object such as a person or an article, a symbol, a sign, a mark, an emblem, a design, or the like; display of a moving image and a still image; display of subtitles of a movie and the like; display of descriptive text concerning video synchronized with video and closed caption; display of various explanations concerning an observation object in play and kabuki, Noh, Kyogen, opera, concert, ballet, various dramas, an amusement park, a museum, a sightseeing spot, a holiday destination, tourist information, and the like, and descriptive text for explaining contents thereof, progress status thereof, backgrounds thereof, and the like; and display of closed caption. In play and kabuki, Noh, Kyogen, opera, concert, ballet, various dramas, an amusement park, a museum, a sightseeing spot, a holiday destination, tourist information, and the like, it is only required to display characters as an image relating to an observation object on the display device at an appropriate timing. Specifically, for example, in accordance with progress status of a movie or the like, or in accordance with progress status of a play or the like, an image control signal is sent to the display device, and an image is displayed on the display device on the basis of a predetermined schedule or time allocation by operation of an operator or under control of a computer or the like. In addition, various kinds of explanations concerning an observation object such as various devices, a person, or an article are displayed. If the imaging device photographs (images) an observation object such as various devices, a person, or an article, and the display device analyzes the photographed (imaged) contents, the display device can display previously-created various explanations concerning an observation object such as various devices, a person, or an article.

An image signal to the image forming device may include not only an image signal (for example, character data) but also, for example, brightness data (brightness information)

concerning an image to be displayed, chromaticity data (chromaticity information), or brightness data and chromaticity data. The brightness data may correspond to brightness of a predetermined region including an observation object viewed through the light guide device. The chromaticity data may correspond to chromaticity of a predetermined region including an observation object viewed through the light guide device. In this way, by inclusion of brightness data concerning an image, brightness (lightness) of an image displayed can be controlled. By inclusion of chromaticity data concerning an image, chromaticity (color) of an image displayed can be controlled. By inclusion of brightness data and chromaticity data concerning an image, brightness (lightness) and chromaticity (color) of an image displayed can be controlled. In a case where brightness data corresponds to brightness of a predetermined region including an observation object viewed through the image display device, it is only required to set a value of brightness data such that the higher a value of brightness of a predetermined region including an observation object viewed through the image display device is, the higher a value of brightness of an image is (that is, the brighter an image is displayed). In addition, in a case where chromaticity data corresponds to chromaticity of a predetermined region including an observation object viewed through the image display device, it is only required to set a value of chromaticity data such that chromaticity of a predetermined region including an observation object viewed through the image display device has a roughly complementary color relationship with chromaticity of an image to be displayed. A complementary color refers to a combination of colors diametrically opposed to each other in a color circle. The complementary color also means a complementary color, for example, green for red, violet for yellow, and orange for blue. The complementary color also means a color to cause a decrease in color saturation by mixing a certain color with another color at an appropriate ratio, for example, white in a case of light and black in a case of an object. However, a complementary property in visual effects in parallel disposition is different from a complementary property in mixing. The complementary color is also referred to as a surplus color, a control color, or an opposite color. However, the opposite color directly indicates a color opposite to a complementary color, whereas a range indicated by the complementary color is slightly wide. A color combination of complementary colors has a synergistic effect for bringing mutual colors into prominence, and this is referred to as complementary color harmony.

Example 1

Figure 7:
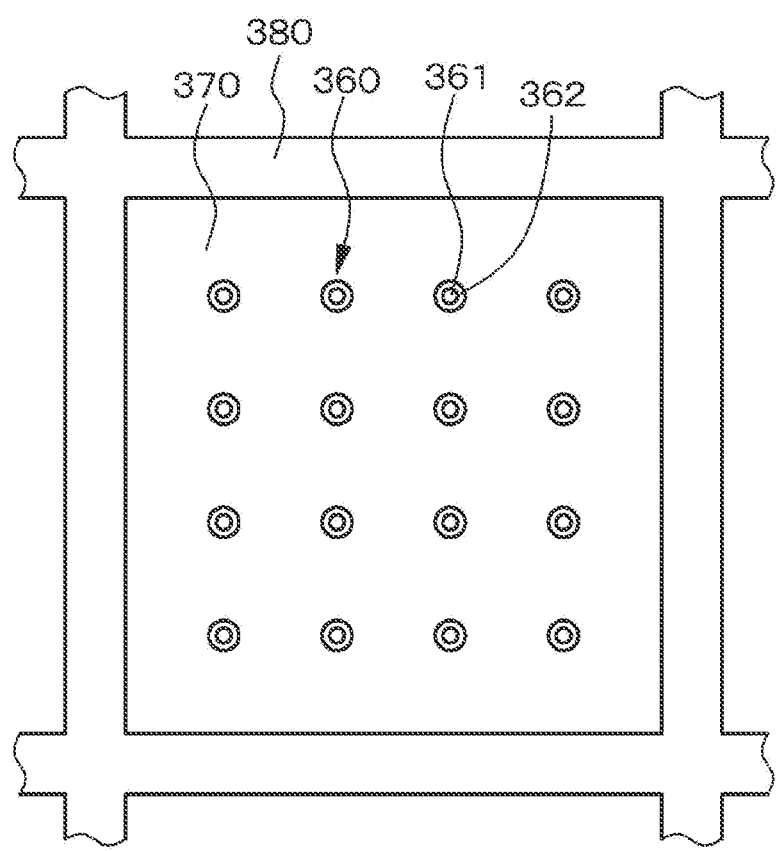
FIG. 7 is a schematic partial plan view of the light emitting element constituting the display device of Example 1 as viewed from a side of a lens system.
Figure 8:
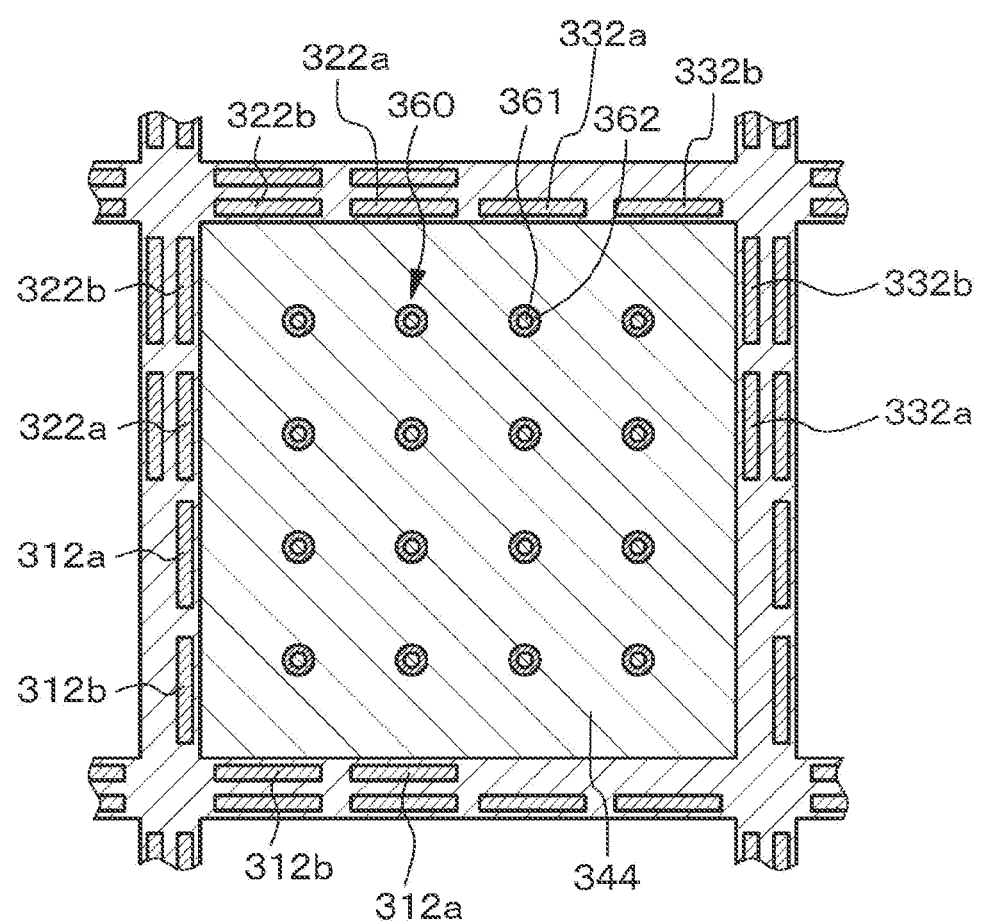
FIG. 8 is a schematic partial cross-sectional view obtained by cutting the light emitting element constituting the display device of Example 1 along a virtual horizontal plane along arrow A-A in FIG. 1.
Figure 9:
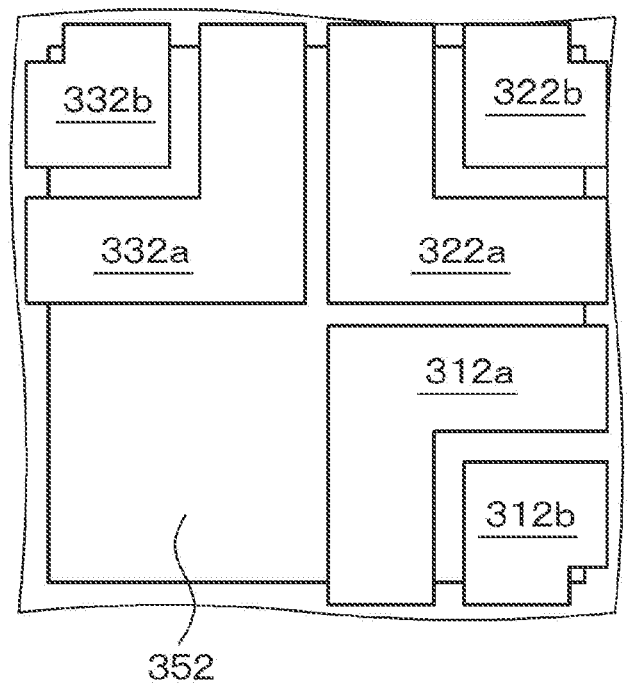
FIG. 9 is a schematic partial plan view of the light emitting element constituting the display device of Example 1 as viewed from the opposite side to the side of the lens system.
Figure 10:
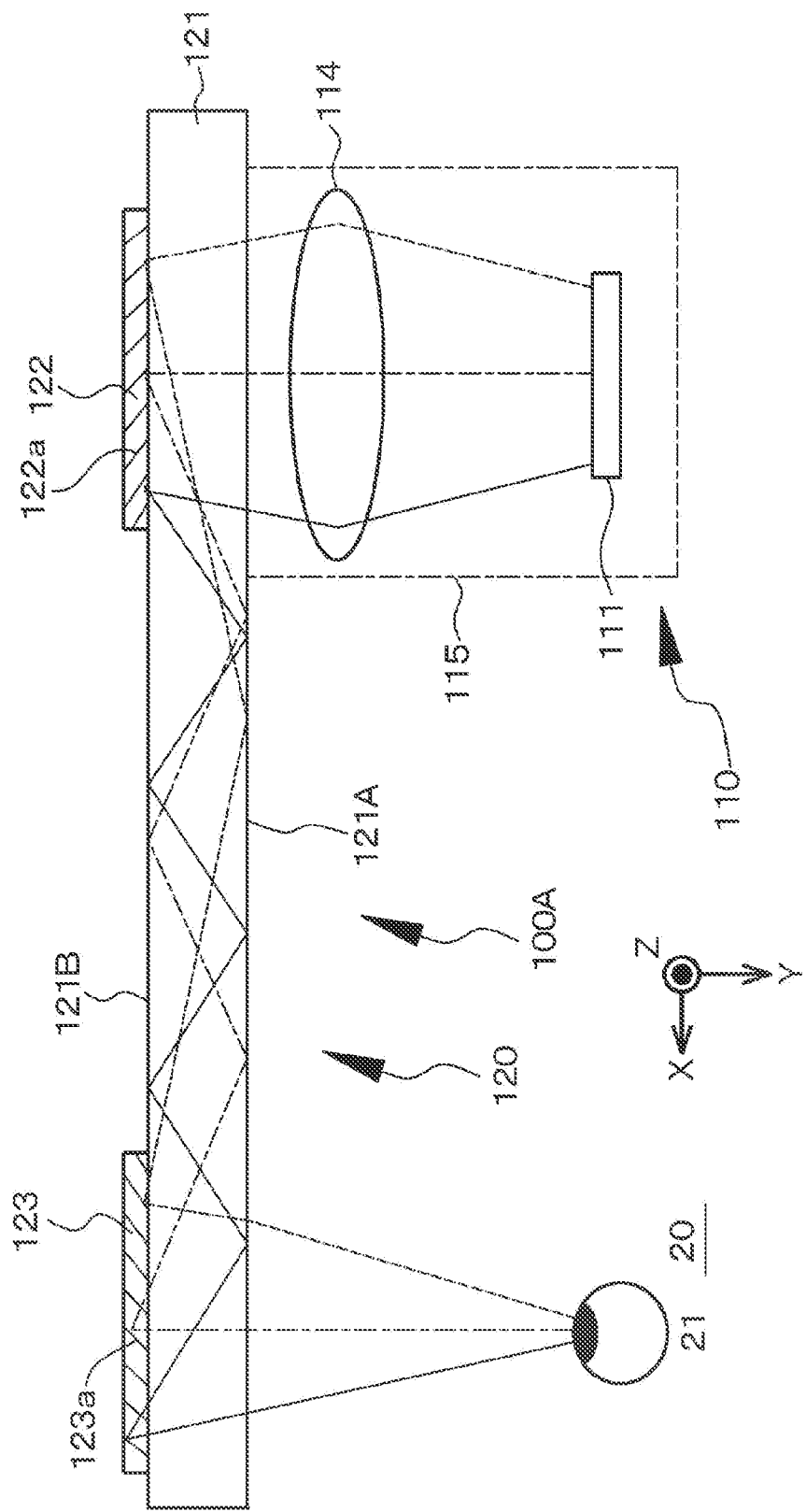
FIG. 10 is a conceptual diagram of an image forming device of Example 1.
Figure 11:
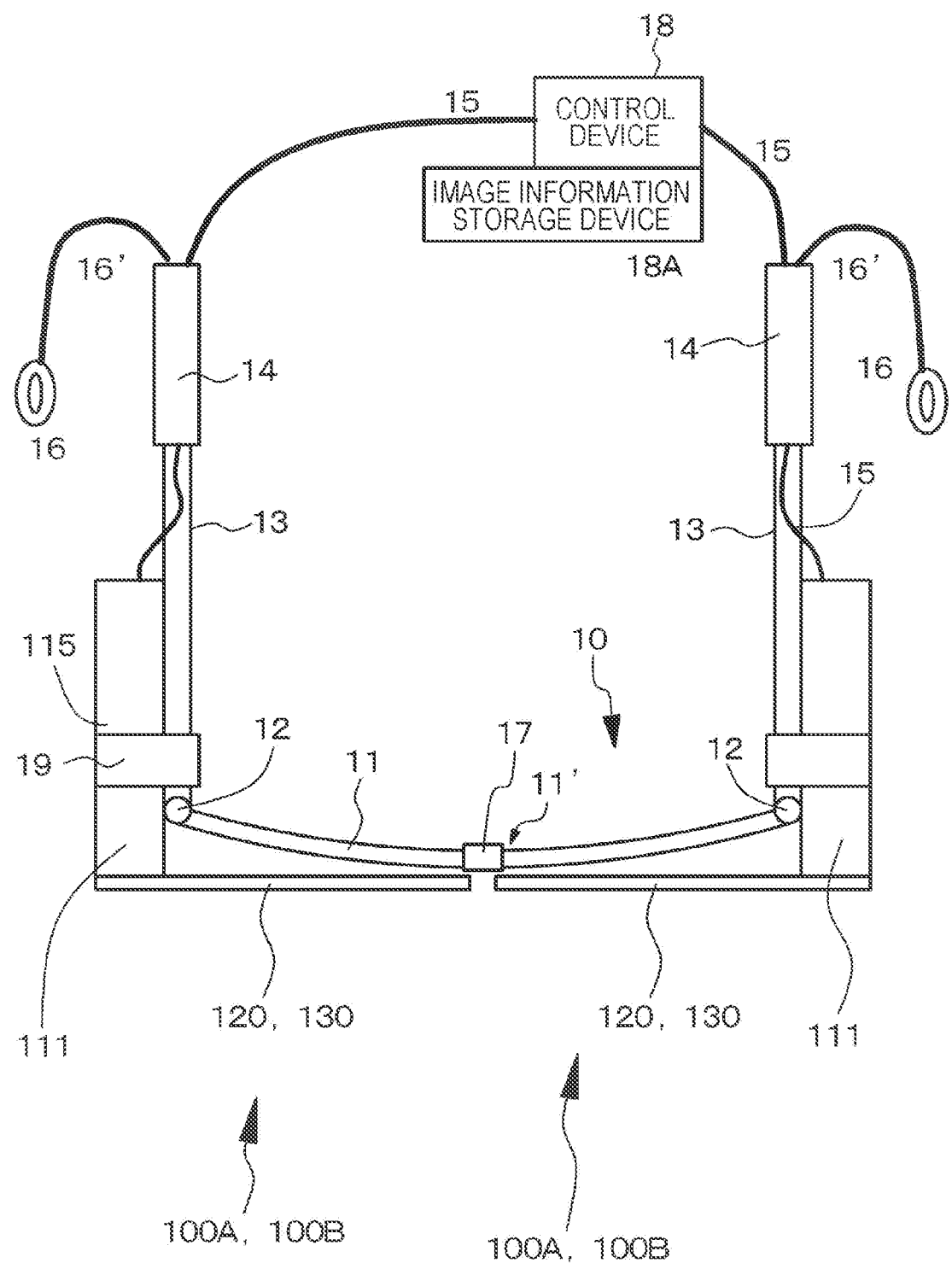
FIG. 11 is a schematic view of the display device of Example 1 as viewed from above.
Figure 12:
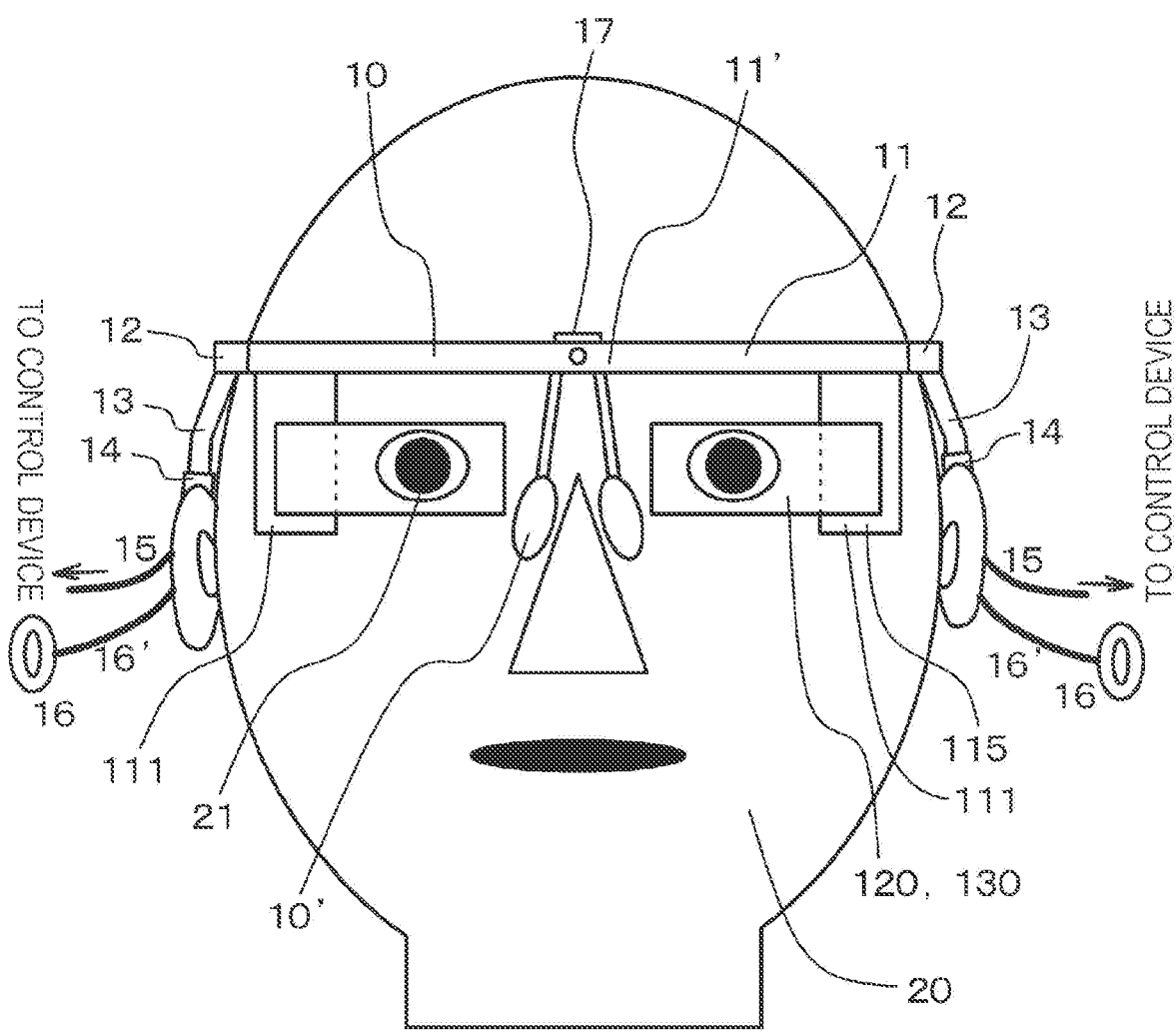
FIG. 12 is a schematic view of the display device of Example 1 as viewed from the front.
Figure 13A:
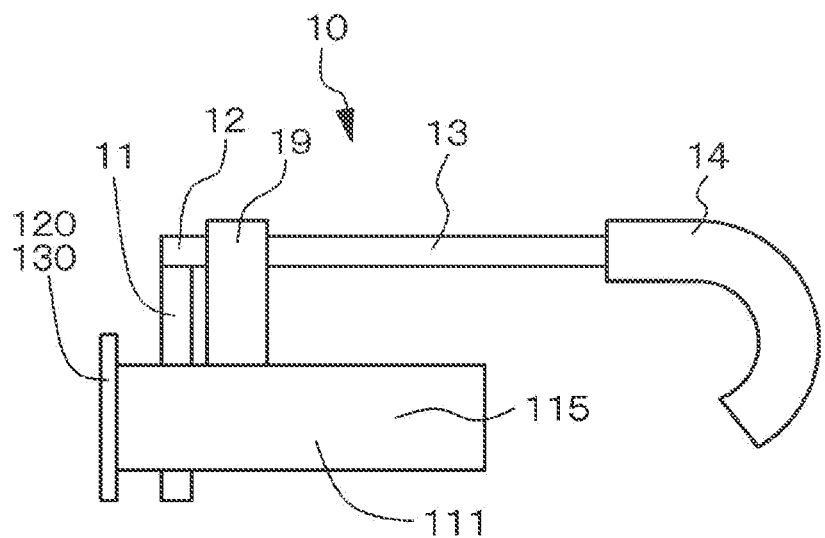
FIGS. 13A, 13B, and 13C are a schematic view of the display device of Example 1 as viewed from a side, a diagram schematically illustrating a propagation state of light in a light guide plate constituting an image display device, and a schematic cross-sectional view illustrating a part of a reflection type volume hologram diffraction grating in an enlarged manner, respectively.
Figure 13B:
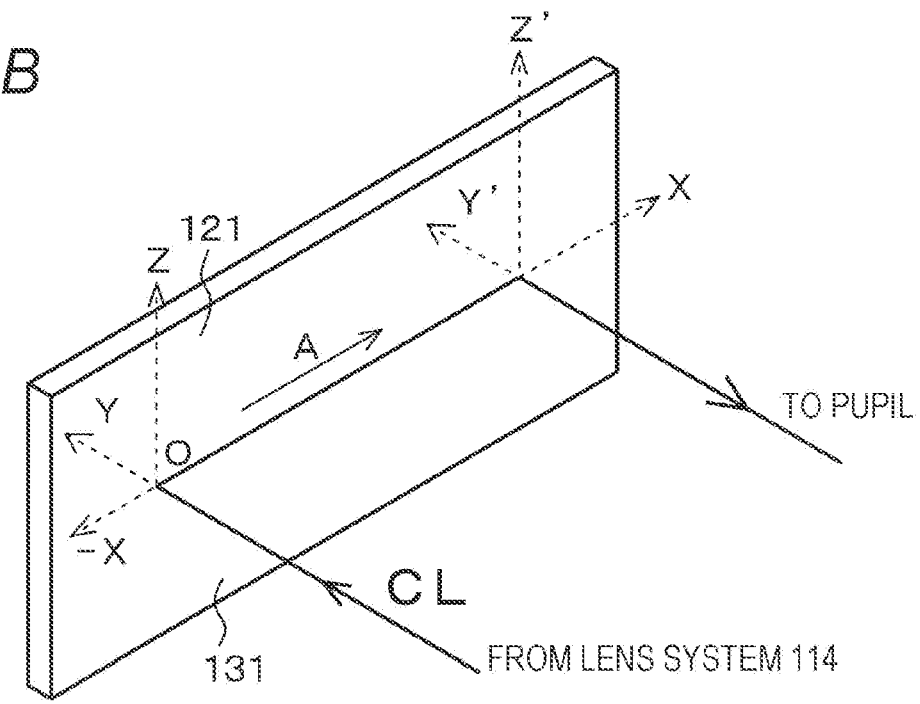
Figure 13C:
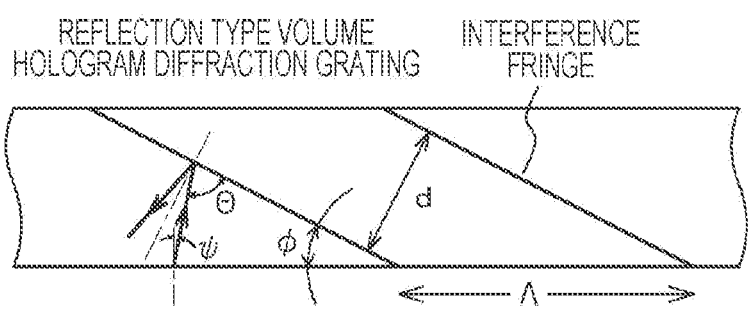

Example 1 relates to the display device of the present disclosure and the method for manufacturing a light emitting element of the present disclosure. FIGS. 1, 2, 3, 4, 5, and 6 illustrate schematic partial cross-sectional views of a light emitting element constituting the optical device of the present disclosure and the display device of the present disclosure, and a light emitting element obtained by the method for manufacturing a light emitting element of the present disclosure. FIG. 7 illustrates a schematic partial plan view of a light emitting element as viewed from a lens system side. FIG. 8 illustrates a schematic cross-sectional view of a light emitting element along an arrow A-A in FIG. 1 or the like. FIG. 9 illustrates a schematic partial plan view of a light emitting element as viewed from the opposite side to the lens system side. Furthermore, FIG. 10 illustrates a conceptual diagram of an image forming device of Example 1. FIG. 11 illustrates a schematic view of the display device (specifically, head mounted display (HMD)) of Example 1 as viewed from above. FIG. 12 illustrates a schematic view of the display device of Example 1 as viewed from the front. FIG. 13A illustrates a schematic view of the display device of Example 1 as viewed from a side. FIG. 13B schematically illustrates a propagation state of light in a light guide plate constituting an image display device. FIG. 13C illustrates a schematic cross-sectional view illustrating a part of a reflection type volume hologram diffraction grating in an enlarged manner. In FIG. 7, the antireflection layer covers a top surface of a separation groove. In order to clearly illustrate a formation position of the separation groove, the separation groove is illustrated.

More specifically, the display device of Example 1 or any one of Examples 2 to 8 described later is a head mounted display (HMD), and includes (a) a frame 10 attached to the head of an observer 20 (for example, eyeglass-type frame 10), and (b) an image display device 100A, 100B, 200A, or 200B attached to the frame 10. Incidentally, the display device of Example 1 or any one of Examples 2 to 8 described later is specifically a binocular type including two image display devices, but may be a single eye type including one image display device. For example, an image forming device 111 displays a color image. In addition, the image display device 100A, 100B, 200A, or 200B in Example 1 or any one of Examples 2 to 8 described later includes (A) the image forming device 111, (B) light guide device 120, 130, 220, or 230 for guiding an image from the image forming device 111 to a pupil 21 of the observer 20, and (C) a lens system 114 for making an image from the image forming device 111 incident on the light guide device 120, 130, 220, or 230. The image forming device 111 includes light emitting elements 300 arranged in a two-dimensional matrix. The light emitting elements 300 will be described in detail later.

The light guide device 120 in the display device of Example 1 is the light guide device of the first configuration, more specifically, the light guide device of the first-A configuration. That is, the light guide device 120 in the display device of Example 1 includes a light guide plate 121, a first deflecting unit 122, and a second deflecting unit 123. Light which has been emitted from the image forming device 111 and has passed through the lens system 114 is incident on the first deflecting unit 122. Then, the light deflected by the first deflecting unit 122 repeats total reflection inside the light guide plate 121, is deflected by the second deflecting unit 123, is emitted from the light guide plate 121, and reaches the pupil 21 of the observer 20. A surface of the light guide plate 121 facing the lens system 114 is referred to as a first surface 121A, and a surface facing the first surface 121A is referred to as a second surface 121B. The first deflecting unit 122 and the second deflecting unit 123 are disposed on (more specifically, bonded to) the second surface 121B of the light guide plate 121. However, the present disclosure is not limited to such a disposition. The first surface 121A constitutes a light guide plate incidence surface and a light guide plate emission surface. The observer 20 faces the first surface 121A of the light guide plate 121.

More specifically, the light guide device 120 in Example 1 includes the first deflecting unit 122 for deflecting light incident from the lens system 114, the light guide plate 121 for propagating the light deflected by the first deflecting unit 122 by total reflection therein, and the second deflecting unit 123 for deflecting and emitting the light propagated by total reflection inside the light guide plate 121. The light guide plate 121 is disposed so as to face the image forming device 111 with the lens system 114 interposed therebetween. In the lens system 114, the light emitted from the image forming device 111 is converted into a parallel light beam and is made incident on the light guide device 120.

A (X, Y, Z) orthogonal coordinate system is assumed. In addition, a point where a central light beam CL which is a light beam which has been emitted from the center of the image forming device 111 and has passed through a node of the lens system 114 on the image forming device side (that is, a light beam emitted from the center of the image forming device 111 in a normal direction of the image forming device 111) is incident on the light guide plate 121 or 131 is referred to as a light guide plate center point O. In addition, an axis passing through the light guide plate center point O and being parallel to an axial direction of the light guide plate 121 or 131 (a direction in which light is propagated through the light guide plate 121 or 131) is referred to as an X axis. An axis passing through the light guide plate center point O and coinciding with a normal line of the light guide plate 121 or 131 is referred to as a Y axis. A Z axis passes through the light guide plate center point O and extends in a height direction of the light guide plate 121 or 131. The center point of the first deflecting unit 122 or 132 is the light guide plate center point O. That is, as illustrated in FIG. 13B, in the image display device 100A or 100B, the central light beam CL which has been emitted from the center of the image forming device 111 and has passed through a node of the lens system 114 on the image forming device side collides with the light guide plate 121 or 131, for example, vertically. In other words, the central light beam CL is incident on the light guide plate 121 or 131 at an incident angle of 0 degrees.

In Example 1, each of the first deflecting unit (first diffraction grating member) 122 and the second deflecting unit (second diffraction grating member) 123 includes a hologram diffraction grating, specifically, a reflection type hologram diffraction grating, more specifically, a reflection type volume hologram diffraction grating, and diffracts and reflects incident light. The reflection type volume hologram diffraction grating includes, for example, a plurality of diffraction grating layers (photopolymer layers). In each diffraction grating layer including a photopolymer material, an interference fringe corresponding to one type of wavelength band (or wavelength) is formed, and is manufactured by a conventional method. A pitch of the interference fringe 122a or 123a formed in the diffraction grating layer (diffraction grating member) is constant, and the interference fringe is linear and parallel to the Z direction of the light guide plate. Note that FIGS. 10, 18, 21, and 22 illustrate one diffraction grating layer for simplification of the drawings.

As illustrated in the enlarged schematic partial cross-sectional view of the reflection type volume hologram diffraction grating in FIG. 13C, an interference fringe having an inclination angle (slant angle) φ is formed in the reflection type volume hologram diffraction grating. Here, the inclination angle φ refers to an angle formed by a surface of the reflection type volume hologram diffraction grating and an interference fringe. The interference fringe is formed from an inside to a surface of the reflection type volume hologram diffraction grating. The interference fringe satisfies Bragg condition. Here, the Bragg condition means a condition satisfying the following formula (A). In formula (A), m represents a positive integer, λ represents a wavelength, d represents a pitch of a lattice plane (an interval in a normal direction of a virtual plane including an interference fringe), and Θ represents a complementary angle of an angle incident on the interference fringe. In addition, a relationship among Θ, an inclination angle φ, and an incident angle Ψ in a case where light enters a diffraction grating member at the incident angle Ψ is as illustrated in formula (B). Furthermore, a pitch Λ of an interference fringe on a surface of a diffraction grating member is as illustrated in formula (C).

$$m \cdot \lambda = 2 \cdot d \cdot \sin(\Theta) \tag{A}$$

$$\Theta = 90° - (\varphi + \Psi) \tag{B}$$

$$\Lambda = d/\sin(\varphi) \tag{C}$$

The image display device 100A, 100B, 200A, or 200B may be attached to the frame 10 fixedly or detachably. The light guide devices 120 and 130 are semi-transmissive (see-through). Specifically, at least portions of a light guide device facing both eyes of the observer 20 (more specifically, the light guide plate 121 or 131 and the second deflecting unit 123 or 133) are semi-transmissive (see-through).

In Example 1, the image forming device 111 includes a plurality of (for example, 640×480) pixels arranged in a two-dimensional matrix. Each of the pixels is constituted by the light emitting element 300 described later. The entire image forming device 111 is housed in a casing 115 (indicated by the one dot chain line in FIG. 10). The lens system 114 includes, for example, a convex lens, and generates parallel light. Light emitted from the light emitting element 300 constituting the image forming device 111 is incident on the lens system (parallel light emitting optical system, collimating optical system) 114, and the light is emitted as parallel light from the lens system 114.

The frame 10 includes a front portion 11 disposed in front of the observer 20, two temple portions 13 rotatably attached to both ends of the front portion 11 via hinges 12, and a modern portion (also referred to as a leading cell, an earmuff, or an ear pad) 14 attached to a distal end portion of each of the temple portions 13. In addition, a nose pad 10' is attached. That is, basically, an assembly of the frame 10 and the nose pad 10' has substantially the same structure as ordinary eyeglasses. Furthermore, each casing 115 is detachably attached to the temple portion 13 by an attachment member 19. The frame 10 is manufactured from metal or plastic. Note that each casing 115 may be attached to the temple portion 13 by the attachment member 19 so as not to be detachable. In addition, for an observer owing and wearing eyeglasses, each casing 115 may be detachably attached to the temple portion 13 of the frame 10 of the eyeglasses owned by the observer by the attachment member 19. Each casing 115 may be attached to an outside or an inside of the temple portion 13. Alternatively, the light guide plate 121 may be fitted in a rim included in the front portion 11.

Furthermore, wiring (signal line, power supply line, or the like) 15 extending from one of the image forming devices 111 extends to an outside from a distal end portion of the modern portion 14 via the temple portion 13 and an inside of the modern portion 14, and is connected to a control device (control circuit or control unit) 18. Furthermore, the image forming device 111 includes a headphone portion 16. Headphone portion wiring 16' extending from the image forming device 111 extends from a distal end portion of the modern portion 14 to the headphone portion 16 via the temple portion 13 and an inside of the modern portion 14. More specifically, the headphone portion wiring 16' extends from a distal end portion of the modern portion 14 to the headphone portion 16 so as to go around a back side of the auricle (auditory capsule). With such a configuration, an impression that the headphone portion 16 or the headphone portion wiring 16' is disorderedly disposed is not given, and a simple display device can be obtained. As described above, the wiring (signal line, power supply line, or the like) 15 is connected to the control device (control circuit) 18. The control device 18 includes, for example, an image information storage device 18A. In addition, the control device 18 performs processing for image display. Each of the control device 18 and the image information storage device 18A may include a well-known circuit.

An imaging device 17 including a solid-state imaging element including a CCD or CMOS sensor and a lens (these are not illustrated) as necessary is attached to a central portion 11' of the front portion 11 with a suitable attachment member (not illustrated). A signal from the imaging device 17 is sent to the control device (control circuit) 18 via wiring (not illustrated) extending from the imaging device 17.

Hereinafter, the light emitting element 300 in the image forming device 111 constituting the display device of Example 1 will be described.

The light emitting element 300 includes a laminated structure 301 including at least one layer of a light emitting laminate including a first electrode (n-side electrode), a second electrode (p-side electrode), and a light emitting layer provided between the first electrode and the second electrode. In the laminated structure 301, a through hole 360 formed in a lamination direction of the laminated structure 301 for emitting light from the light emitting layer toward the lens system 114 is formed. An antireflection layer (light absorbing layer) 370 is formed in a portion of the laminated structure 301 facing the lens system 114. One light emitting element 300 has a plurality of through holes 360 formed. In addition, the light emitting elements 300 are electrically and optically separated from each other by a separation groove 380, and have a structure in which optical crosstalk hardly occurs.

Here, the antireflection layer 370 is formed up to an edge portion of the through hole 360 in the laminated structure 301. That is, when the light emitting element 300 is viewed from a lens system side, top surfaces of the antireflection layer 370 and the through hole 360 are visually recognized. In other words, when the light emitting element 300 is viewed from the lens system 114, the top surfaces of the antireflection layer 370 and the through hole 360 are visually recognized, and a top surface of the laminated structure 301 is not visually recognized. Specifically, the antireflection layer 370 includes metal oxide (for example, chromium oxide).

The through hole 360 includes, for example, a core portion 361 and a clad layer 362 disposed between the laminated structure 301 and the core portion 361. The core portion 361 is filled, for example, with air or a dielectric material such as $SiO_2$, SiN, or $Ta_2O_5$. Meanwhile, the clad layer 362 includes, for example, an outer clad layer (layer in contact with the laminated structure 301) including an insulating material such as $SiO_2$ and an inner clad layer (layer facing the core portion 361) including a light-reflecting metal such as aluminum (Al), silver (Ag), or gold (Au). Specifically, for example, the core portion 361 includes SiN, the inner clad layer (layer facing the core portion 361) includes a silver (Ag) layer having a thickness of 50 nm, and the outer clad layer (layer in contact with the laminated structure 301) includes $SiO_2$. However, the configuration and structure of the through hole 360 are not limited to the above-described configuration and structure.

In addition, the light emitting element 300 has a laminated structure 301 including three layers of a light emitting laminate that emits red light (first light emitting laminate) 310, a light emitting laminate that emits green light (second light emitting laminate) 320, and a light emitting laminate that emits blue light (third light emitting laminate) 330.

Furthermore, the image forming device 111 includes a circuit board 390 in which a light emitting element driving circuit (not illustrated) is provided, and each light emitting element 300 is connected to the light emitting element driving circuit provided on the circuit board 390. In addition, the image forming device 111 further includes a support substrate 351 constituting the laminated structure 301 on a light emitting side. In Example 1, more specifically, the antireflection layer 370 is formed on a surface (surface facing the lens system 114) 351A (on a top surface) of the support substrate 351. A second support substrate 352 is disposed between the third light emitting laminate 330 and the circuit board 390. The support substrate 351, the second support substrate 352, and the circuit board 390 are each constituted, for example, by a silicon semiconductor substrate. A light emitting element driving circuit constituted by a well-known driving circuit suitable for driving the light emitting element 300 is connected to the light emitting element 300, for example, using a bump portion, by a metal bonding method for connecting a contact portion (specifically, formed on the second support substrate 352) including copper (Cu) and connected to the light emitting element 300 to a connection portion including copper (Cu) and provided on the circuit board 390, or on the basis of a connection method using TCV.

The light emitting laminates 310, 320, and 330 including the first electrodes (n-side electrodes) 312A, 322A, and 332A, the second electrodes (p-side electrodes) 312B, 322B, and 332B, and the light emitting layers 311, 321, and 331 provided between the first electrodes 312A, 322A, and 332A and the second electrodes 312B, 322B, and 332B have well-known laminated structures themselves. The light emitting layer has a structure obtained by laminating a plurality of compound semiconductor layers, that is, a structure obtained by laminating a first compound semiconductor layer, an active layer, and a second compound semiconductor layer.

For example, the light emitting layer 311 constituting the light emitting laminate (first light emitting laminate) 310 that emits red light has a layer configuration including a buffer layer including n-type GaAs and a first compound semiconductor layer (for example, including a first clad layer including n-type AlGaAs)/active layer including GaAs, AlGaAs, or AlGaInP/second compound semiconductor layer (for example, including a second clad layer including p-type AlGaAs and a cap layer including p-type GaAs). However, the layer configuration is not limited to such a layer configuration. In addition, for example, the light emitting layer 321 or 331 constituting the light emitting laminate (second light emitting laminate or third light emitting laminate) 320 or 330 that emits green or blue light has a layer configuration including a first compound semiconductor layer (for example, including an n-type AlGaN clad layer and an n-type GaN clad layer)/InGaN quantum well active layer/second compound semiconductor layer (for example, including a non-doped InGaN light guide layer, a p-type AlGaN electron barrier layer, a p-type GaN/AlGaN super-lattice clad layer, and a p-type GaN contact layer). However, the layer configuration is not limited to such a layer configuration. Films of various compound semiconductor layers constituting the light emitting layer can be formed, for example, on the basis of a MOCVD method.

Hereinafter, a method for manufacturing the light emitting element 300 including the laminated structure 301 will be described.

[Step-100]

First, the laminated structure 301 including at least one layer (three layers in Example 1) of the light emitting laminates 310, 320, and 330 including the first electrodes 312A, 322A, and 332A, the second electrodes 312B, 322B, and 332B, and the light emitting layers 311, 321, and 331 provided between the first electrodes 312A, 322A, and 332A and the second electrodes 312B, 322B, and 332B is formed.

Specifically, in advance, the first light emitting laminate 310 is formed on the first light emitting laminate manufacturing substrate except for the first electrode 312A, the second light emitting laminate 320 is formed on the second light emitting laminate manufacturing substrate except for the first electrode 322A, and the third light emitting laminate 330 is formed on the third light emitting laminate manufacturing substrate except for the first electrode 332A.

More specifically, the light emitting layer 311 is formed on the first light emitting laminate manufacturing substrate on the basis of a well-known MOCVD method, and the second electrode 312E is formed on the light emitting layer 311, and is patterned into a desired shape. In addition, the light emitting layer 321 is formed on the second light emitting laminate manufacturing substrate on the basis of a well-known MOCVD method, and the second electrode 322B is formed on the light emitting layer 321, and is patterned into a desired shape. Furthermore, the light emitting layer 331 is formed on the third light emitting laminate manufacturing substrate on the basis of a well-known MOCVD method, and the second electrode 332B is formed on the light emitting layer 331, and is patterned into a desired shape.

Then, the support substrate 351 on which a first insulating layer 341 is formed is prepared. The support substrate 351 is bonded to the second electrode 312B via the first insulating layer 341. Thereafter, the first light emitting laminate manufacturing substrate is removed on the basis of a well-known method. Then, the first electrode 312A is formed on the exposed light emitting layer 311. The first electrode 312A is patterned into a desired shape. Thereafter, a second insulating layer 342 is formed on the entire surface. In this way, the first light emitting laminate 310 can be formed on the support substrate 351.

Subsequently, a first separation groove for separating the light emitting elements 300 from each other is formed. Specifically, a first recess is formed by etching the first light emitting laminate 310 from the opposite side to the support substrate 351. Thereafter, the first recess is filled with an insulating material by a well-known method to form the first separation groove. Then, a first $A_1$ connection groove (connection portion, the same applies hereinafter) connected to the first electrode 312A and a first $B_1$ connection groove connected to the second electrode 312B are formed in the first separation groove. The first $A_1$ connection groove and the first $B_1$ connection groove are filled with a conductive material.

Subsequently, the first light emitting laminate 310 is bonded to the second electrode 322B via the second insulating layer 342. Thereafter, the second light emitting laminate manufacturing substrate is removed on the basis of a well-known method. Then, the first electrode 322A is formed on the exposed light emitting layer 321. The first electrode 322A is patterned into a desired shape. Thereafter, a third insulating layer 343 is formed on the entire surface. In this way, the second light emitting laminate 320 can be formed on the first light emitting laminate 310.

Subsequently, a second separation groove for separating the light emitting elements 300 from each other is formed. Specifically, a second recess is formed by etching the second light emitting laminate 320 from the opposite side to the first light emitting laminate 310. Thereafter, the second recess is filled with an insulating material by a well-known method to form the second separation groove. Then, a second $A_2$ connection groove connected to the first electrode 322A and a second $B_2$ connection groove connected to the second electrode 322B are formed in the second separation groove. In addition, a first $A_2$ connection groove connected to the first $A_1$ connection groove and a first $B_2$ connection groove connected to the first $B_1$ connection groove are formed in the second separation groove. These connection grooves are also filled with a conductive material.

Thereafter, the second light emitting laminate 320 is bonded to the second electrode 332B via the third insulating layer 343. Thereafter, the third light emitting laminate manufacturing substrate is removed on the basis of a well-known method. Then, the first electrode 332A is formed on the exposed light emitting layer 331. The first electrode 332A is patterned into a desired shape. Thereafter, a fourth insulating layer 344 is formed on the entire surface. In this way, the third light emitting laminate 330 can be formed on the second light emitting laminate 320.

Subsequently, a third separation groove for separating the light emitting elements 300 from each other is formed. Specifically, a third recess is formed by etching the third light emitting laminate 330 from the opposite side to the second light emitting laminate 320. Thereafter, the third recess is filled with an insulating material by a well-known method to form the third separation groove. Then, a third $A_3$ connection groove connected to the first electrode 332A and a third $B_3$ connection groove connected to the second electrode 332B are formed in the third separation groove. In addition, a first $A_3$ connection groove connected to the first $A_2$ connection groove, a first $B_3$ connection groove connected to the first $B_2$ connection groove, a second $A_3$ connection groove connected to the second $A_2$ connection groove, and a second $B_3$ connection groove connected to the second $B_2$ connection groove are formed in the third separation groove. These connection grooves are also filled with a conductive material.

In this way, the separation groove 380 for separating the light emitting elements 300 from each other is formed, and at the same time, a connection groove is formed in the separation groove 380. In addition, the laminated structure 301 in which the first light emitting laminate 310, the second light emitting laminate 320, and the third light emitting laminate 330 are laminated can be obtained. The separation groove 380 is filled with an insulating material having a lower refractive index than a compound semiconductor material constituting a light emitting layer, and a connection groove having a light shielding property is formed in a part thereof. Therefore, the light emitting elements 300 are separated from each other not only electrically but also optically, and a structure in which optical crosstalk hardly occurs is formed.

Then, the fourth insulating layer 344 is bonded to the second support substrate 352. Subsequently, in portions of the second support substrate 352 located above the first $A_3$ connection groove, the first $B_3$ connection groove, the second $A_3$ connection groove, the second $B_3$ connection groove, the third $A_3$ connection groove, and the third $B_3$ connection groove, connection groove portions reaching these connection grooves are formed. Thereafter, a conductive material layer is formed on the second support substrate 352 including the connection groove portion, and the conductive material layer on the second support substrate 352 is patterned. In this way, a contact portion including a conductive material layer can be formed on the second support substrate 352. A first A contact portion 312*a* is electrically connected to the first electrode 312A constituting the first light emitting laminate 310 via the first $A_3$ connection groove, the first $A_2$ connection groove, and the first $A_1$ connection groove. A first B contact portion 312*b* is electrically connected to the second electrode 312B constituting the first light emitting laminate 310 via the first $B_3$ connection groove, the first $B_2$ connection groove, and the first $B_1$ connection groove. A second A contact portion 322*a* is electrically connected to the first electrode 322A constituting the second light emitting laminate 320 via the second $A_3$ connection groove and the second $A_2$ connection groove. A second B contact portion 322*b* is electrically connected to the second electrode 322B constituting the second light emitting laminate 320 via the second $B_3$ connection groove and the second $B_2$ connection groove. A third A contact portion 332*a* is electrically connected to the first electrode 332A constituting the third light emitting laminate 330 via the third $A_3$ connection groove. A third B contact portion 332*b* is electrically connected to the second electrode 332B constituting the third light emitting laminate 330 via the third $B_3$ connection groove.

Thereafter, a recess reaching the separation groove 380 is formed in the support substrate 351 and the first insulating layer 341 on the basis of an etching method, and the recess is filled with an insulating material to complete the separation groove 380.

[Step-110]

Next, the antireflection layer (light absorbing layer) 370 is formed on the laminated structure 301. Specifically, the antireflection layer 370 is formed on the surface 351A of the support substrate 351, for example, on the basis of a sputtering method.

[Step-120]

Then, the through hole 360 for emitting light from the light emitting layers 311, 321, and 331 toward an outside is formed in the antireflection layer 370 and the laminated structure 301 in a lamination direction of the laminated structure 301, for example, on the basis of a RIE method. A cross-sectional shape obtained by cutting the through hole 360 with an imaginary horizontal plane is a circle. The antireflection layer 370 is formed up to an edge portion of the through hole 360 in the laminated structure 301. Subsequently, the clad layer 362 and the core portion 361 are sequentially formed inside the through hole 360 on the basis of a well-known method. The clad layer 362 is disposed between the laminated structure 301 and the core portion 361. Thereafter, if top surfaces of the antireflection layer 370, the clad layer 362, and the core portion 361 are polished so as to be flat, it is possible to avoid occurrence of a problem that emitted light is scattered on a top surface of the through hole 360 to reduce efficiency, and this is preferable.

In this way, the light emitting element 300 including the laminated structure 301 can be obtained. Incidentally, in a case of forming a laminated structure of a plurality of light emitting laminates (for example, a first light emitting laminate, a second light emitting laminate, and a third light emitting laminate), a method for sequentially forming the first light emitting laminate, the second light emitting laminate, and the third light emitting laminate on a light emitting laminate manufacturing substrate (corresponding to a support substrate) may be adopted.

[Step-130]

Thereafter, the light emitting element 300 is connected to a light emitting element driving circuit including a well-known driving circuit suitable for driving the light emitting element 300 on the basis of a well-known method. In this way, it is possible to obtain the image forming device 111 constituting the display device of Example 1.

In the display device of Example 1 or an optical device of Example 9 described later, an antireflection layer (light absorbing layer) is formed in a portion of the laminated structure facing a lens system. In addition, in the method for manufacturing a light emitting element, a through holes is formed in each of the antireflection layer (light absorbing layer) and the laminated structure. Therefore, even when a part of light emitted from the image forming device is reflected by the lens system and is returned to the image forming device, the light is not reflected by the image forming device, and it is possible to reliably prevent extra light from entering an image observed by an observer, and it is possible to obtain an image with high image quality. In addition, the light emitting elements are separated from each other not only electrically but also optically, and have a structure in which optical crosstalk hardly occurs. Note that the support substrate is constituted by a silicon semiconductor substrate. Therefore, in a case where the antireflection layer is not formed, occurrence of a phenomenon that return light is reflected on a surface of an image forming device (support substrate) and is incident on a lens system again is significant.

Example 2

Example 2 is a modification of Example 1, and relates to the light guide device of the first-B configuration. As illustrated in the conceptual diagram of the image forming device in FIG. 14, in Example 2, the first deflecting unit 132 reflects light incident on the light guide plate 131, and the second deflecting unit 133 transmits, reflects, and diffracts light propagated by total reflection inside the light guide plate 131 a plurality of times. The first deflecting unit 132 functions as a reflecting mirror, and the second deflecting unit 133 functions as a semi-transmissive mirror. Specifically, the first deflecting unit 132 includes, for example, a metal film (for example, aluminum, Al) containing an alloy, and includes a light reflecting film (a kind of mirror) for reflecting light incident on the light guide plate 131. In addition, the second deflecting unit 133 includes, for example, a dielectric multilayer film obtained by laminating many dielectric laminated films. The dielectric laminated film includes, for example, a $TiO_2$ film as a high dielectric constant material and a $SiO_2$ film as a low dielectric constant material. Japanese Translation of PCT International Application No. 2005-521099 discloses a dielectric multilayer film obtained by laminating many dielectric laminated films. The first deflecting unit 132 and the second deflecting unit 133 are disposed inside the light guide plate 131 (incorporated in the light guide plate 131). In the drawings, the second deflecting unit 133 is illustrated as a unit including six dielectric laminated films, but is not limited thereto. A thin piece including the same material as a material constituting the light guide plate 131 is sandwiched between the dielectric laminated films. Incidentally, reference numeral 131A indicates a first surface of the light guide plate 131 facing the lens system 114, and reference numeral 131B indicates a second surface facing the first surface 131A.

As for the first deflecting unit 132, by cutting out a portion in which the first deflecting unit 132 is provided in the light guide plate 131, a slope to form the first deflecting unit 132 is formed in the light guide plate 131, a metal film is formed on the slope (for example, the metal film can be formed by a vacuum vapor deposition method), and then the cut-out portion of the light guide plate 131 only needs to be bonded to the first deflecting unit 132. In addition, as for the second deflecting unit 133, a film of a member obtained by laminating many layers of the same material (for example, glass) as a material constituting the light guide plate 131 and dielectric laminated films is formed, a portion in which the second deflecting unit 133 is provided in the light guide plate 131 is cut out to form a slope, the member is bonded to the slope, and polishing or the like only needs to be performed to adjust an outer shape. In this way, the light guide device 130 in which the first deflecting unit 132 and the second deflecting unit 133 are provided inside the light guide plate 131 can be obtained.

In Example 2, the image forming device 111 is constituted by a similar image forming device to that in Example 1. In addition, the light guide device 130 has substantially the same configuration and structure as those of the light guide device 120 of Example 1 except that the configurations and structures of the first deflecting unit and the second deflecting unit are different.

Example 3

Figure 15:
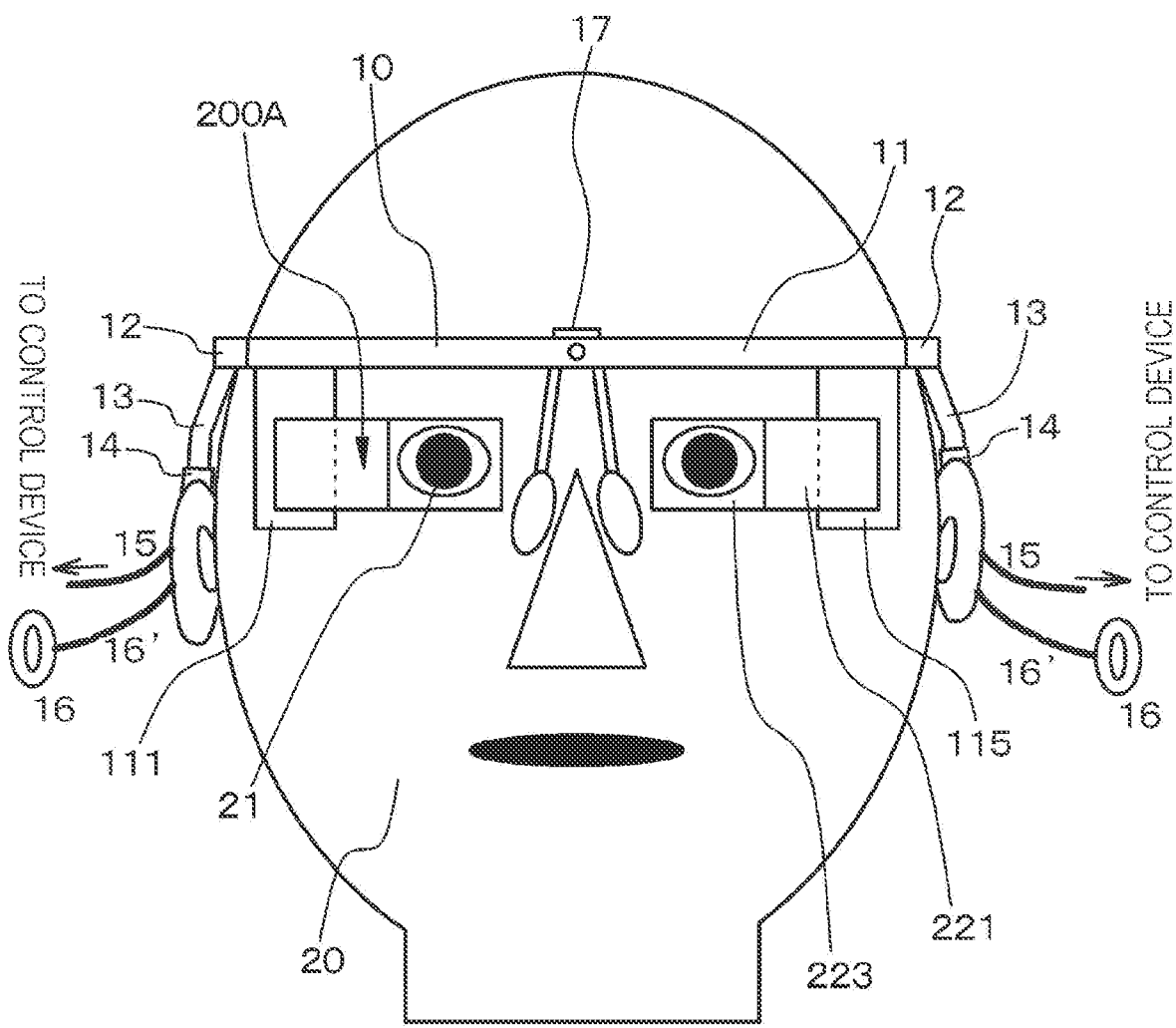
FIG. 15 is a schematic view of a display device of Example 3 as viewed from the front.

Example 3 is also a modification of the image display device in Example 1. FIG. 15 illustrates a schematic view of the display device of Example 3 as viewed from the front, and FIG. 16 illustrates a schematic view thereof as viewed from above.

In Example 3, the light guide device 220 constituting the image display device 200A includes a first deflecting unit (not illustrated) including a reflecting mirror, a transparent member 221 such as a glass plate or a plastic plate, and a second deflecting unit 223 including a semi-transmissive mirror. The casing 115 housing the image forming device 111 and the lens system 114 is attached to the front portion 11. In addition, the second deflecting unit 223 is attached to the transparent member 221, and the transparent member 221 is attached to the image forming device 111.

Figure 16:
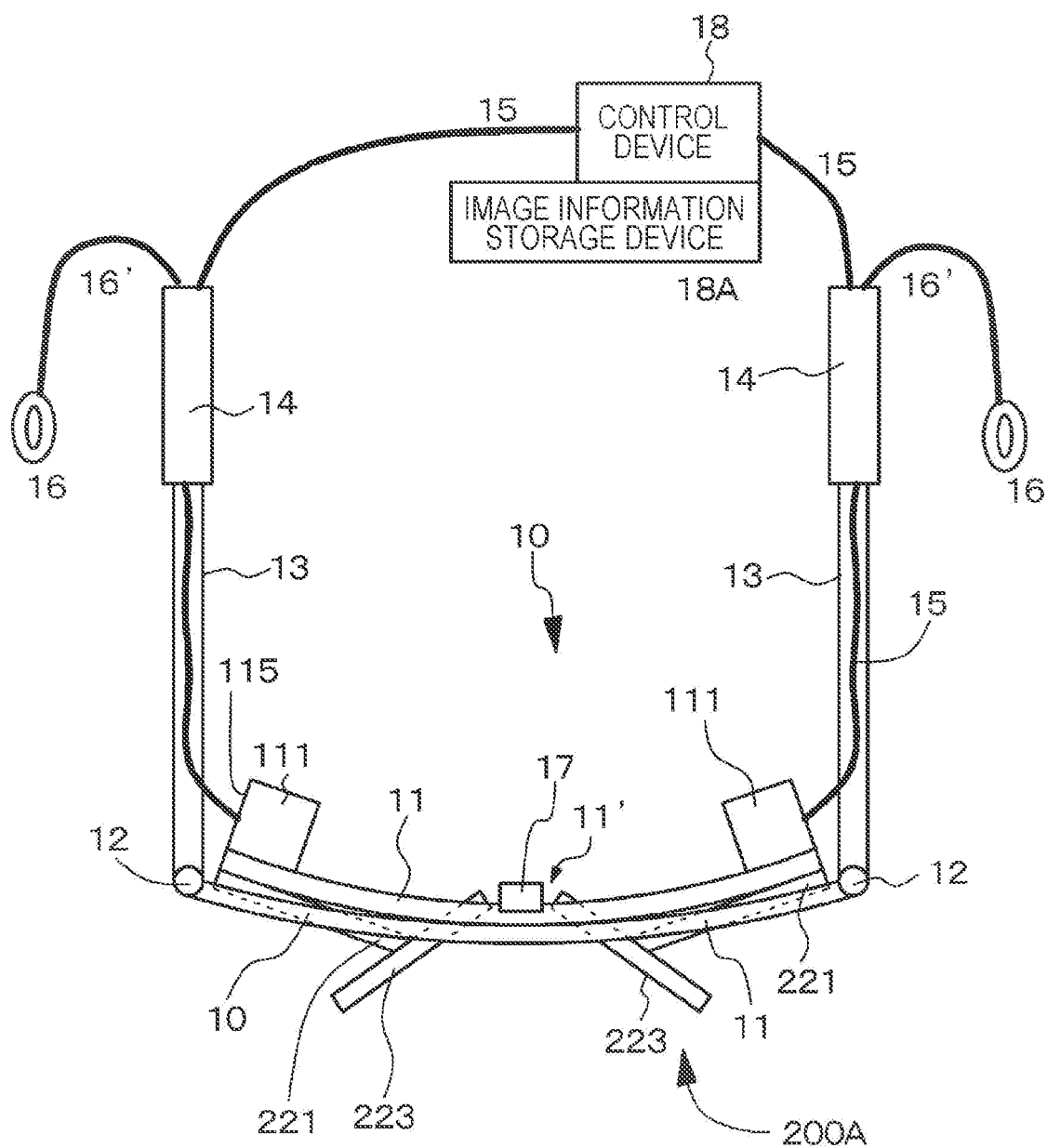
FIG. 16 is a schematic view of the display device of Example 3 as viewed from above.

In Example 3, light which has been emitted from the image forming device 111 (not specifically illustrated) in FIGS. 15 and 16 housed in the casing 115 and has passed through the lens system 114 (not specifically illustrated in FIGS. 15 and 16) is deflected by the first deflecting unit. The light deflected by the first deflecting unit is propagated in the transparent member 221, is deflected by the second deflecting unit 223, and is emitted toward the pupil 21 of the observer 20. Note that light deflected by the first deflecting unit without being propagated in the transparent member 221 may be propagated in air, may be deflected by the second deflecting unit 223, and may be emitted toward the pupil 21 of the observer 20.

The display device of Example 3 has substantially the same configuration and structure as those of the display device of Example 1 except for the above difference, and therefore detailed description thereof will be omitted.

Example 4

Figure 17:
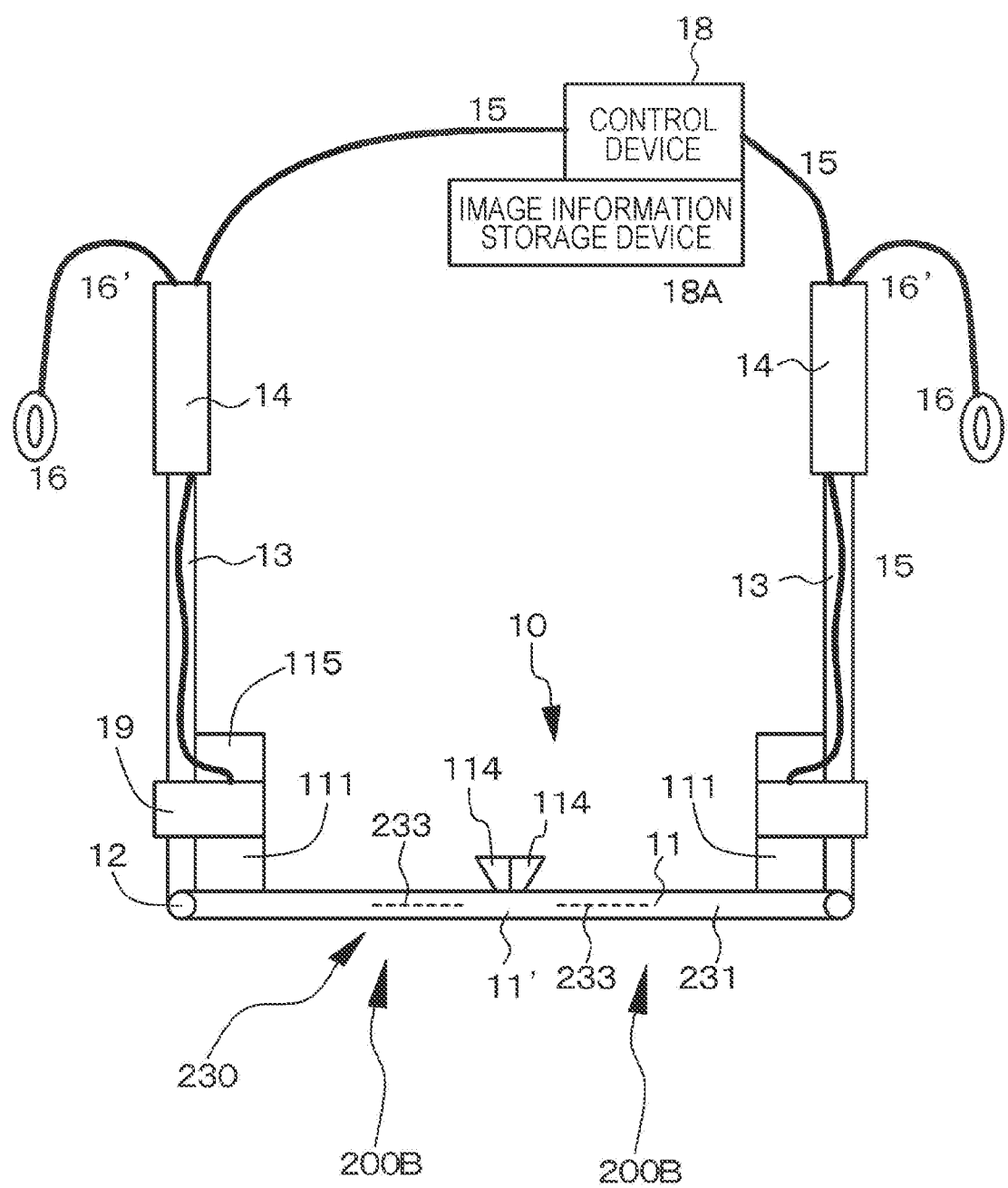
FIG. 17 is a schematic view of a display device of Example 4 as viewed from above.
Figure 18:
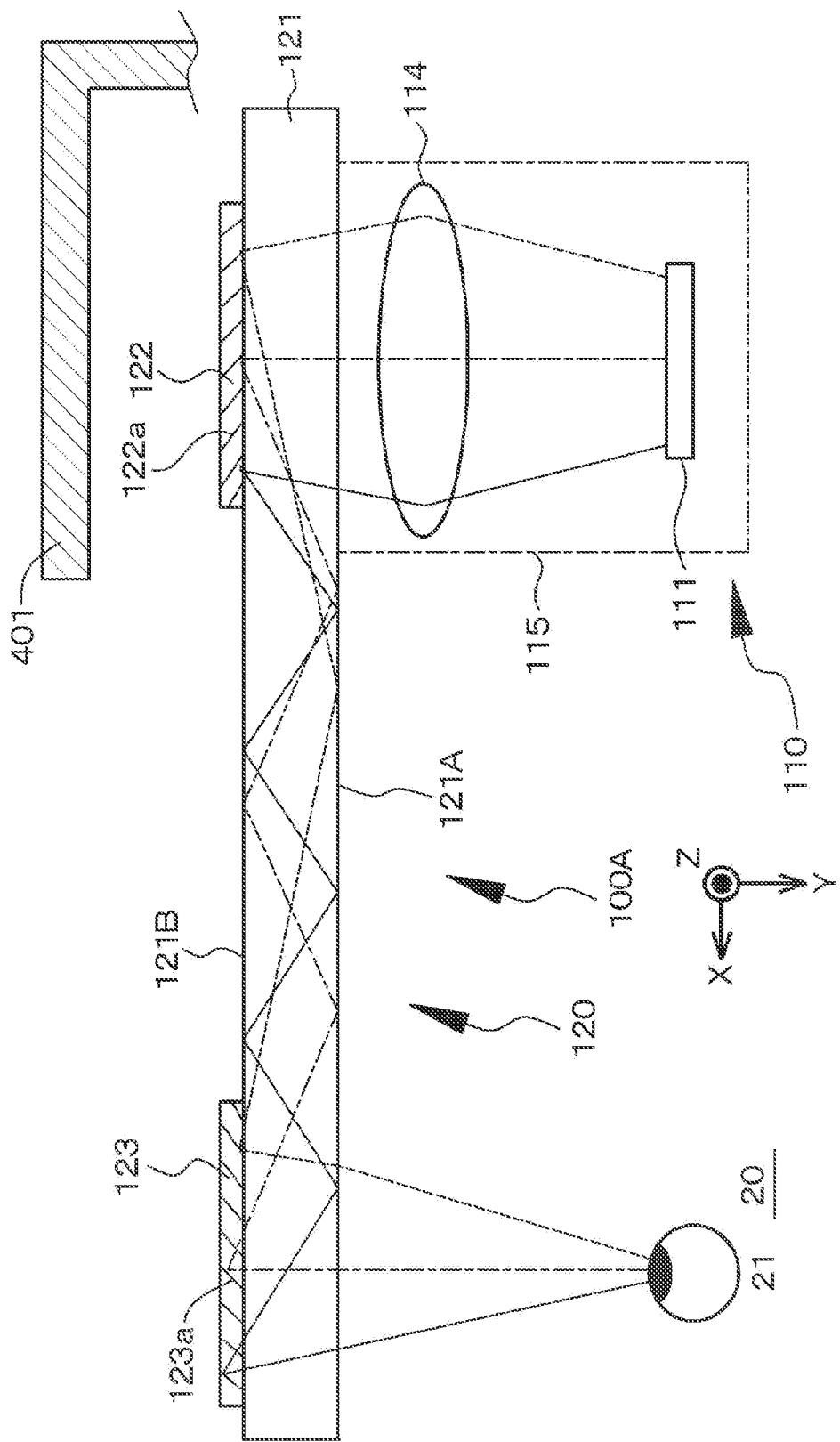
FIG. 18 is a conceptual diagram of an image display device in a display device of Example 5.

Example 4 is also a modification of the image display device in Example 1. FIG. 17 illustrates a schematic view of the display device of Example 4 as viewed from above. Note that the imaging device 17 is not illustrated in FIG. 17.

In Example 4, the light guide device 230 constituting the image display device 200B includes a semi-transmissive mirror 233 on which light emitted from the image forming device 111 is incident and from which the light is emitted toward the pupil 21 of the observer 20. That is, the light guide device 230 includes a glass plate 231, and the semi-transmissive mirror 233 is formed on the glass plate 231. The image forming device 111 can have similar configuration and structure to the image forming device 111 described in Example 1. However, in Example 4, unlike Example 1, light emitted from the image forming device 111 disposed in the casing 115 is propagated inside an optical fiber (not illustrated), and is, for example, incident on the lens system 114 attached to the portion 11' of the frame 10 near a nose pad. The light from the lens system 114 is incident on the semi-transmissive mirror 233. Alternatively, the light emitted from the image forming device 111 disposed in the casing 115 is propagated in an optical fiber (not illustrated), and is, for example, incident on the lens system 114 disposed above portions of the frame 10 corresponding to both eyes. The light from the lens system 114 is incident on the semi-transmissive mirror 233. Alternatively, the light emitted from the image forming device 111 disposed in the casing 115 passes through the lens system 114 disposed in the casing 115, and is directly incident on the semi-transmissive mirror 233. Then, light reflected by the semi-transmissive mirror 233 is incident on the pupil 21 of the observer 20. The display device of Example 4 has substantially the same configuration and structure as those of the display device of Example 1 except for the above difference, and therefore detailed description thereof will be omitted.

Example 5

Figure 19:
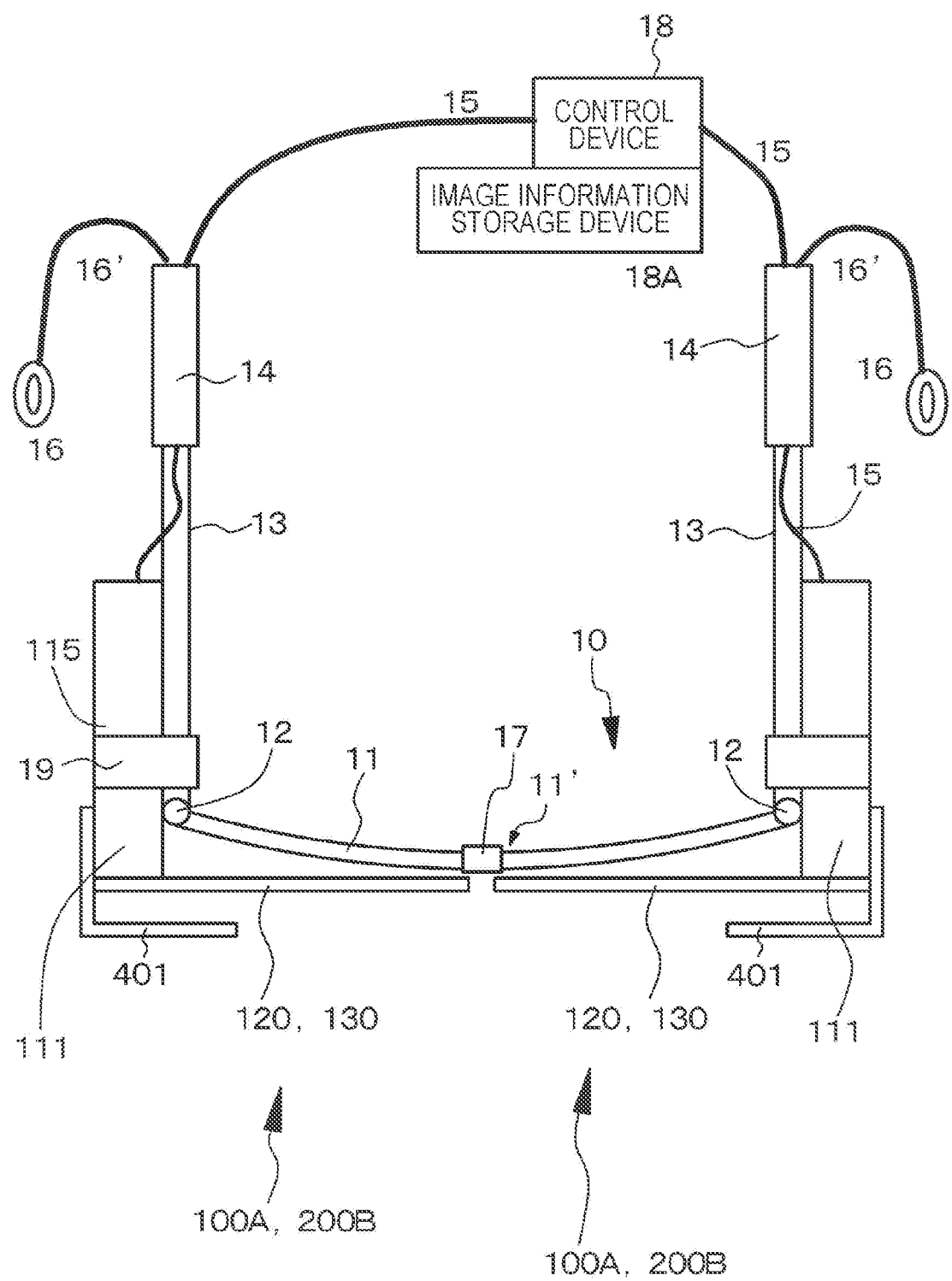
FIG. 19 is a schematic view of the display device of Example 5 as viewed from above.
Figure 20:
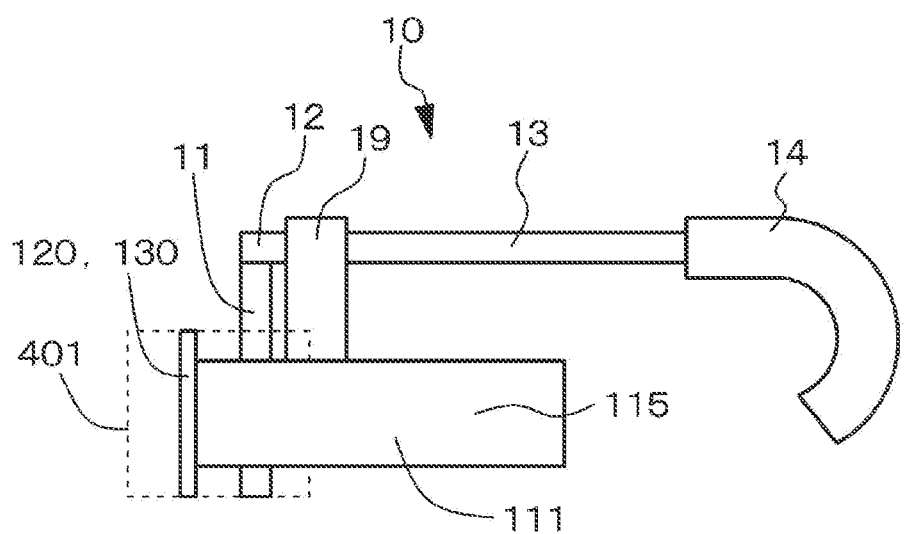
FIG. 20 is a schematic view of the display device of Example 5 as viewed from a side.

Example 5 is a modification of Examples 1 to 3. As illustrated in the conceptual diagram of an image display device in FIG. 18, the schematic view of the display device as viewed from above in FIG. 19, and the schematic view thereof viewed from a side in FIG. 20, in the display device of Example 5, a light shielding member 401 is disposed or provided outside the second surface 121B or 131B of the light guide plate 121 or 131 so as to cover the first deflecting unit 122 or 132. Here, orthogonally projected images of the first deflecting unit 122 or 132 to the light guide plate 121 or 131 are included in an orthogonally projected image of the light shielding member 401 to the light guide plate 121 or 131.

Specifically, for example, in a region of the light guide device 120 or 130 on which light emitted from the image forming device 111 is incident, specifically, in a region where the first deflecting unit 122 or 132 is provided, the light shielding member 401 for shielding incidence of external light on the light guide device 120 or 130 is disposed. Here, the region of the light guide device 120 or 130 on which light emitted from the image forming device 111 is incident is included in a projected image of the light shielding member 401 on the light guide device 120 or 130. The light shielding member 401 is disposed away from the light guide device 120 or 130 on the opposite side to a side where the image forming device 111 is disposed in the light guide device 120 or 130. The light shielding member 401 is manufactured, for example, from an opaque plastic material. The light shielding member 401 integrally extends from the casing 115 of the image forming device 111, is attached to the casing 115 of the image forming device 111, extends integrally from the frame 10, is attached to the frame 10, or is attached to the light guide device 120 or 130. Incidentally, in the illustrated example, the light shielding member 401 integrally extends from the casing 115 of the image forming device 111. In this way, the light shielding member 401 for shielding incidence of external light on the light guide device 120 or 130 is disposed in a region on which light emitted from the image forming device is incident in the light guide device 120 or 130. Therefore, external light is not incident on the region on which light emitted from the image forming device 111 is incident in the light guide device 120 or 130, specifically on the first deflecting unit 122 or 132. Therefore, image display quality in a display device is not deteriorated by generation of undesirable stray light or the like.

Figure 21:
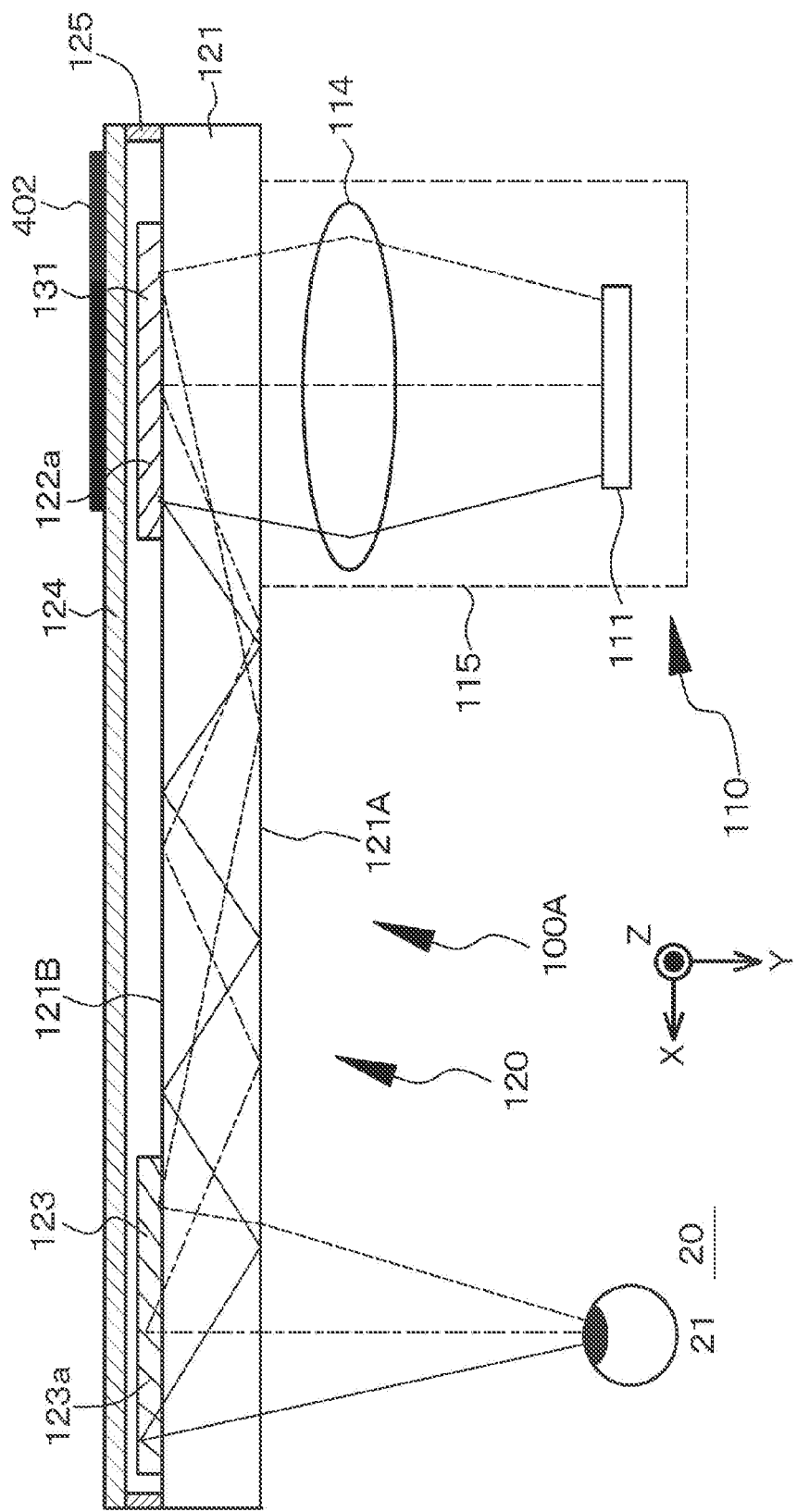
FIG. 21 is a conceptual diagram of a modified example of the image display device in the display device of Example 5.

Alternatively, as illustrated in FIG. 21, a light shielding member 402 is disposed in a portion of the light guide device 120 or 130 on the opposite side to a side where the image forming device 111 is disposed. Specifically, by printing an opaque ink on the light guide device 120 or 130 (specifically, a transparent protective member 124 covering the second surface 121B or 131B of the light guide plate 121 or 131), the light shielding member 402 can be formed. Outer edge portions of the light guide plate 121 or 131 and an outer edge portion of the transparent protective member 124 are sealed with a sealing member 125, or are bonded to each other. Note that the light shielding member 401 can be combined with the light shielding member 402. The light shielding members 401 and 402 can also be applied to the light guide device 220 described in Example 3.

Example 6

Figure 22:
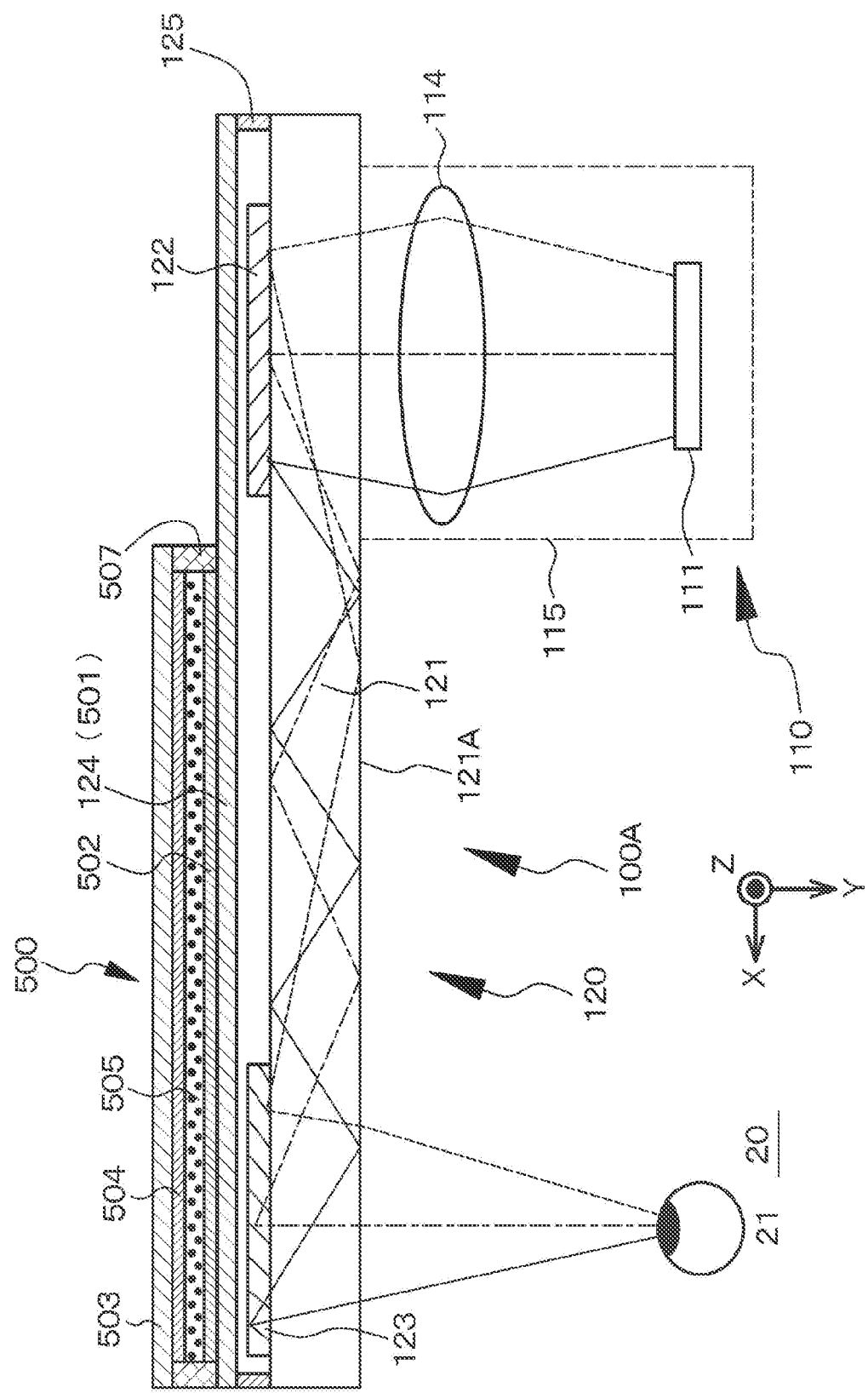
FIG. 22 is a conceptual diagram of an image display device in a display device of Example 6.
Figure 23:
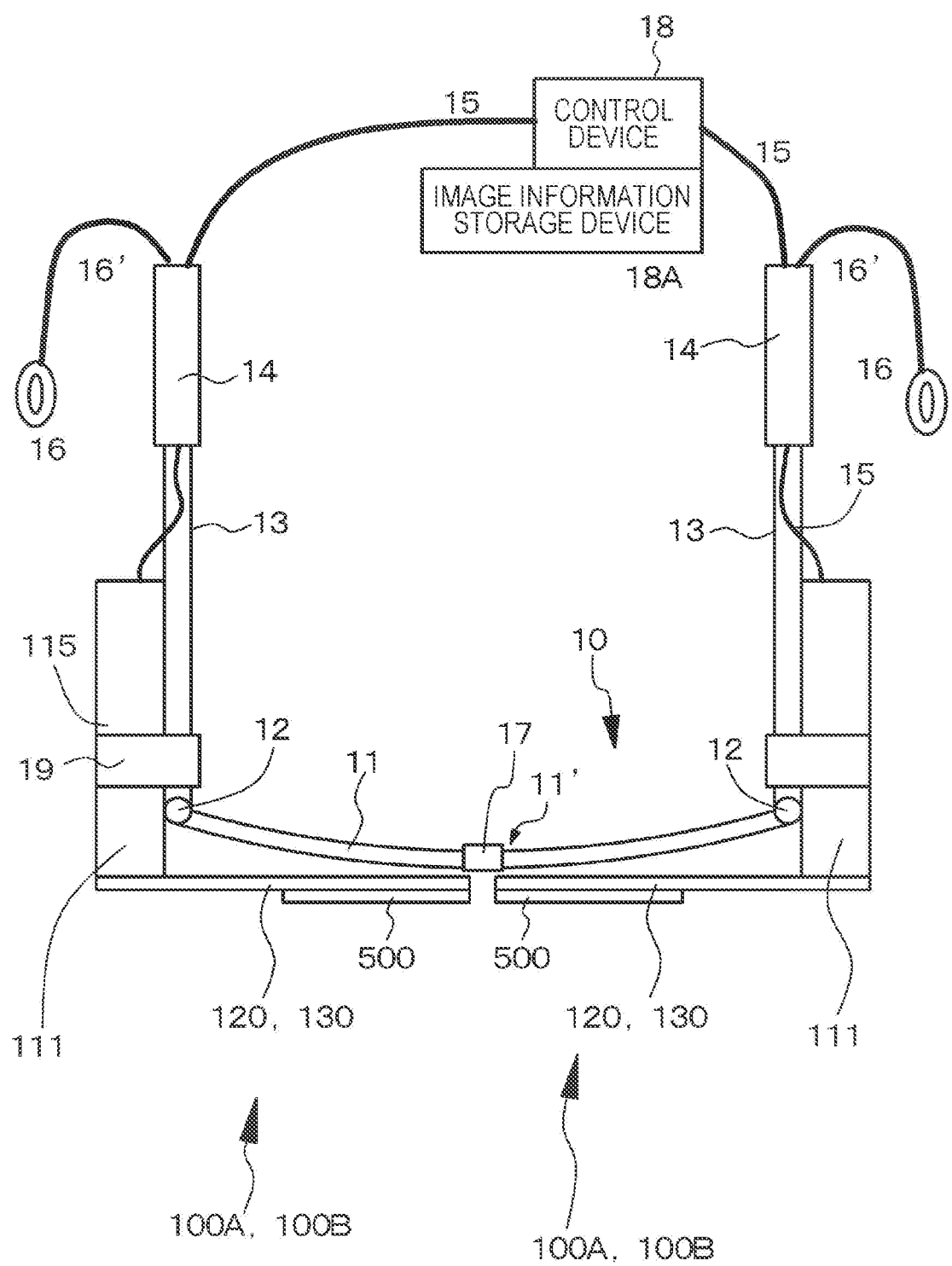
FIG. 23 is a schematic view of the display device of Example 6 as viewed from above.
Figure 24A:
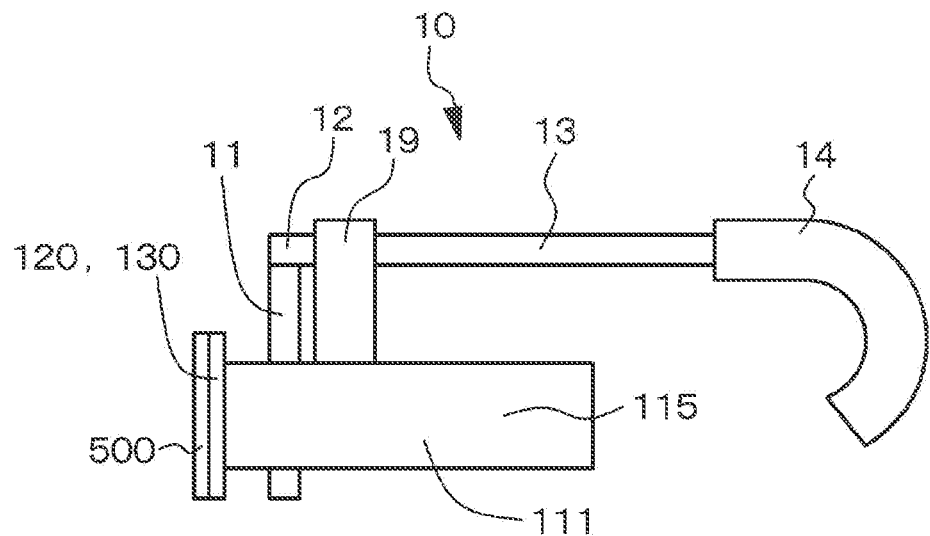
FIGS. 24A and 24B are a schematic view of the display device of Example 6 as viewed from a side and a schematic view of portions of a light guide device and a light control device in the display device of Example 6 as viewed from the front, respectively.
Figure 24B:
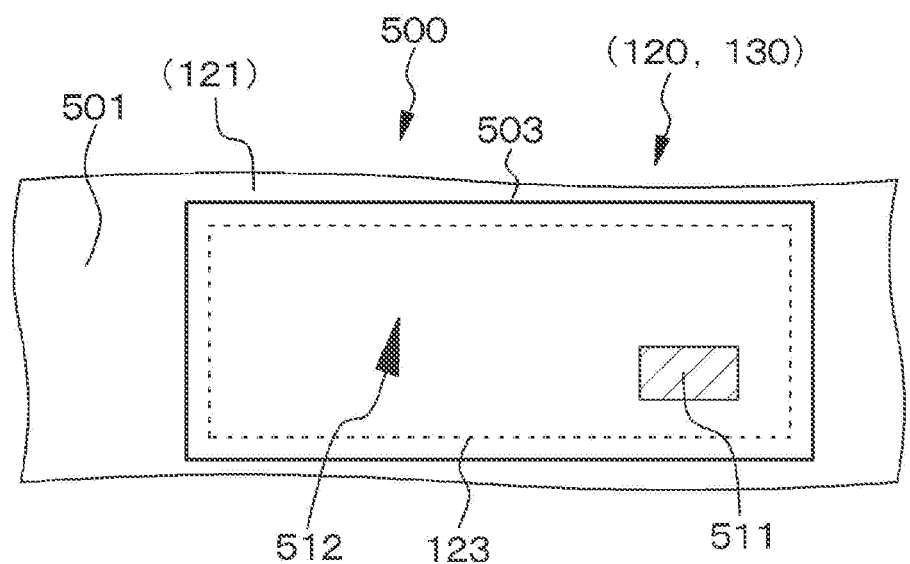
Figure 25A:
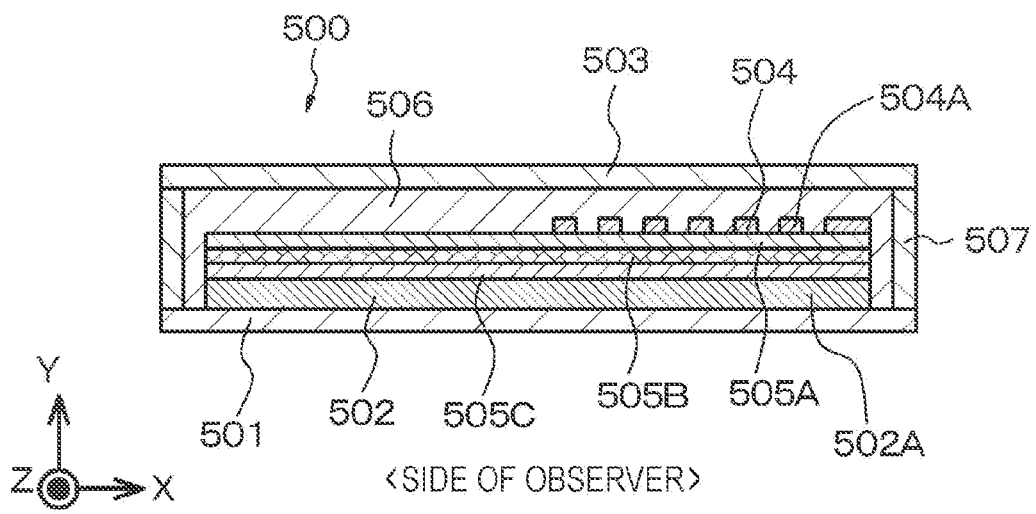
FIGS. 25A and 25B are a schematic cross-sectional view of the light control device in the display device of Example 6 and a schematic front view of the light control device, respectively.
Figure 25B:
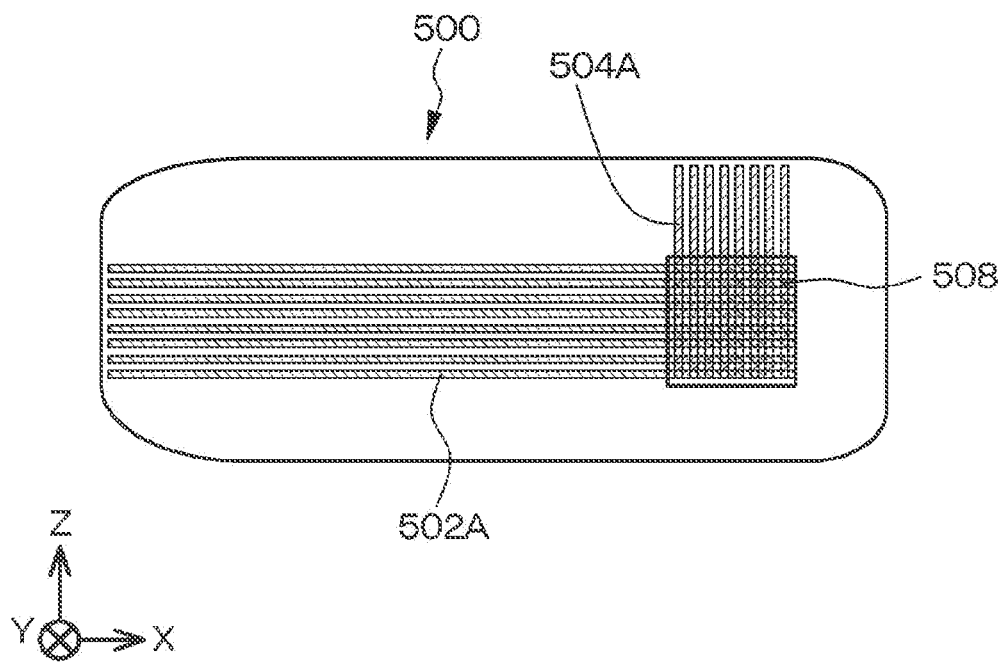

Example 6 is a modification of Examples 1 to 5. FIG. 22 illustrates a conceptual diagram of an image display device of Example 6. FIG. 23 illustrates a schematic view of the display device of Example 6 as viewed from above. FIG. 24A illustrates a schematic view thereof as viewed from a side. In addition, FIG. 24B illustrates a schematic front view of a light guide device and a light control device. FIG. 25A a illustrates a schematic cross-sectional view of the light control device. FIG. 25B illustrates a schematic plan view of the light control device.

In Example 6, a light control device 500 is disposed on a second surface side of the light guide plate 121 or 131. The light control device 500 adjusts the amount of external light incident from an outside. In addition, a virtual image forming region of the light guide device 120 or 130 overlaps with the light control device 500. If a virtual image is formed in a part of the virtual image forming region on the basis of light emitted from the image forming device 111, the light control device 500 is controlled such that a light shielding ratio of a virtual image projection region 511 of the light control device 500 including a projected image of a virtual image on the light control device 500 is higher than a light shielding ratio of another region 512 of the light control device 500. Incidentally, the position of the virtual image projection region 511 is not fixed in the light control device 500, but varies depending on the formation position of a virtual image. In addition, the number of the virtual image projection regions 511 also varies depending on the number of virtual images (the number of a series of virtual image groups, the number of blocked virtual image groups, and the like).

During operation of the light control device 500, if the light shielding ratio of a virtual image projection region of the light control device 500 including a projected image of a virtual image on the light control device 500 is assumed to be "1", the light shielding ratio of the other region 512 of the light control device 500 is, for example, 0.95 or less. Alternatively, the light shielding ratio of the other region of the light control device 500 is, for example, 30% or less. Meanwhile, during operation of the light control device 500, the light shielding ratio of the virtual image projection region 511 of the light control device 500 is 35% to 99%, for example, 80%. As described above, the light shielding ratio of the virtual image projection region 511 may be constant, or may vary depending on illuminance of an environment in which the display device is placed, as described later.

In Example 6 or either one of Examples 7 and 8 described later, the light control device 500 which is a kind of optical shutter for adjusting the amount of external light incident from an outside is disposed on the opposite side to a side where the image forming device 111 is disposed in the light guide device 120 or 130. That is, the light control device 500 is disposed in a region of the light guide device 120 or 130 on the opposite side to the observer 20. In this way, the light guide device 120 or 130 and the light control device 500 are disposed in this order from an observer side, but the light control device 500 and the light guide device 120 or 130 may be disposed in this order. In addition, the transparent protective member 124 also serves as a first substrate 501 of the light control device 500. This makes it possible to reduce the weight of the entire display device, and there is no fear to cause a user of the display device to feel uncomfortable. In addition, a second substrate 503 can be thinner than the transparent protective member 124. A similar configuration can be used also in Examples 7 and 8. However, the present disclosure is not limited thereto, and the transparent protective member 124 and the first substrate 501 of the light control device 500 may be constituted by different members. The size of the light control device 500 may be the same as, larger than, or smaller than that of the light guide plate 121 or 131. In short, the virtual image formation region (second deflecting unit 123 or 133) only needs to be located within a projected image of the light control device 500. A connector (not illustrated) is attached to the light control device 500, and the light control device 500 is electrically connected to a control circuit (specifically, control device 18) for controlling a light shielding ratio of the light control device 500 via the connector and wiring.

In Example 6 or either one of Examples 7 and 8 described later, as illustrated in the schematic cross-sectional view in FIG. 25A and the schematic plan view in FIG. 25B, the light control device 500 includes the first substrate 501, the second substrate 503 facing the first substrate 501, a first transparent electrode 502 provided on a surface facing the first substrate 501 facing the second substrate 503, a second transparent electrode 504 provided on a surface facing the second substrate 503 facing the first substrate 501, and a light control layer 505 sandwiched between the first transparent electrode 502 and the second transparent electrode 504. In addition, the first transparent electrode 502 includes a plurality of band-shaped first transparent electrode segments 502A extending in a first direction. The second transparent electrode 504 includes a plurality of band-shaped second transparent electrode segments 504A extending in a second direction different from the first direction. A light shielding ratio of a portion of the light control device corresponding to an overlap region between the first transparent electrode segments 502A and the second transparent electrode segments 504A (minimum unit region 508 in which the light shielding ratio of the light control device changes) is controlled on the basis of control of voltages applied to the first transparent electrode segments 502A and the second transparent electrode segments 504A. That is, the light shielding ratio is controlled on the basis of a simple matrix method. The first direction is perpendicular to the second direction. Specifically, the first direction extends in a transverse direction (X-axis direction), and the second direction extends in a longitudinal direction (Z-axis direction).

The second substrate 503 includes a plastic material. In addition, each of the first transparent electrode 502 and the second transparent electrode 504 includes a transparent electrode including indium-tin composite oxide (ITO), and is formed on the basis of a combination of a PVD method such as a sputtering method and a lift-off method. A protective layer 506 including an SiN layer, an SiO$_2$ layer, an Al$_2$O$_3$ layer, a TiO$_2$ layer, or a laminated film thereof is formed between the second transparent electrode 504 and the second substrate 503. By forming the protective layer 506, an ion blocking property preventing transfer of ions, water-proofness, moisture-proofness, and scratch resistance can be imparted to the light control device 500. In addition, the transparent protective member 124 (first substrate 501) and the second substrate 503 are sealed with a sealing material 507 including an ultraviolet curable resin or a thermosetting resin, such as an ultraviolet curable epoxy resin or an epoxy resin cured by an ultraviolet ray and heat. The first transparent electrode 502 and the second transparent electrode 504 are connected to the control device 18 via a connector and wiring (not illustrated).

A light shielding ratio (light transmittance) of the light control device 500 can be controlled by a voltage applied to the first transparent electrode 502 and the second transparent electrode 504. Specifically, for example, if a voltage is applied to the second transparent electrode 504 while the first transparent electrode 502 is grounded, a light shielding ratio of the light control layer 505 changes. A potential difference between the first transparent electrode 502 and the second transparent electrode 504 may be controlled, or a voltage applied to the first transparent electrode 502 and a voltage applied to the second transparent electrode 504 may be independently controlled.

Incidentally, if the number of pixels of the virtual image forming region (second deflecting unit 123 or 133) in a transverse direction in the light control device 500 is represented by $M_0$ and the number of pixels thereof in a longitudinal direction is represented by $N_0$, the number $M_1 \times N_1$ of a minimum unit region 508 in which a light shielding ratio of the light control device 500 changes satisfies, for example, $M_0 = M_1$ (that is, k=1) and $N_0 = N_1$ (that is, k'=1) provided that $M_1/M_0 = k$ and $N_1/N_0 = k'$. However, the present disclosure is not limited thereto, but may satisfy $1.1 \le k$, preferably $1.1 \le k \le 1.5$, and more preferably $1.15 \le k \le 1.3$ and $1.1 \le k'$, and preferably $1.1 \le k' \le 1.5$ and more preferably $1.15 \le k' \le 1.3$. Values of k and k' may be the same as or different from each other. In Examples, k=k'=1 is satisfied.

In Example 6 or either one of Examples 7 and 8 described later, the light control device 500 includes an optical shutter applying a color change of a substance generated by an oxidation-reduction reaction of an electrochromic material. Specifically, the light control layer includes an electrochromic material. More specifically, the light control layer has a laminated structure of a WO$_3$ layer 505A/Ta$_2$O$_5$ layer 505B/Ir$_x$Sn$_{1-x}$O layer 505C from the second transparent electrode side. The WO$_3$ layer 505A develops color reductively. In addition, the Ta$_2$O$_5$ layer 505B constitutes a solid electrolyte, and the Ir$_x$Sn$_{1-x}$O layer 505C develops color oxidatively.

In the Ir$_x$Sn$_{1-x}$O layer, Ir and H$_2$O react with each other, and exist as iridium hydroxide Ir(OH)$_n$. If a negative potential is applied to the second transparent electrode 504 and a positive potential is applied to the first transparent electrode 502, a proton H$^+$ moves from the Ir$_x$Sn$_{1-x}$O layer to the Ta$_2$O$_5$ layer, an electron is released to the first transparent electrode 502, the following oxidation reaction proceeds, and the Ir$_x$Sn$_{1-x}$O layer is colored.

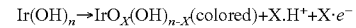

$$Ir(OH)_n \rightarrow IrO_X(OH)_{n-X}(\text{colored}) + X \cdot H^+ + X \cdot e^-$$

Meanwhile, a proton H$^+$ in the Ta$_2$O$_5$ layer moves into the WO$_3$ layer, and an electron is injected from the second transparent electrode 504 into the WO$_3$ layer. In the WO$_3$ layer, the following reduction reaction proceeds, and the WO$_3$ layer is colored.

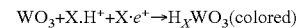

$$WO_3 + X \cdot H^+ + X \cdot e^- \rightarrow H_X WO_3(\text{colored})$$

Conversely, if a positive potential is applied to the second transparent electrode 504 and a negative potential is applied to the first transparent electrode 502, in the Ir$_x$Sn$_{1-x}$O layer, a reduction reaction proceeds in the opposite direction to the above, and decolorization occurs. In the WO$_3$ layer, an oxidation reaction proceeds in the opposite direction to the above, and decolorization occurs. Note that the Ta$_2$O$_5$ layer contains H$_2$O. H$_2$O is ionized by applying a voltage to the first transparent electrode and the second transparent electrode. The Ta$_2$O$_5$ includes a proton H$^+$ and an OH$^-$ ion, contributing to a coloring reaction and a decoloring reaction.

Information and data regarding an image displayed on the image display device 100A or 100B or a signal to be received by a receiving device is recorded, kept, and stored, for example, in a so-called cloud computer or a server. By inclusion of a communication unit (sending/receiving device) such as a mobile phone or a smartphone in the display device or by incorporation of a communication unit (receiving device) into the control device (control circuit or control unit) 18, various kinds of information, data, and signals can be transmitted and exchanged between the cloud computer or the server and the display device via the communication unit, a signal based on various kinds of information and data, that is, a signal for displaying an image in the image display device 100A or 100B can be received, and the receiving device can receive the signal.

Specifically, if an observer inputs a request for "information" to be obtained to a mobile phone or a smartphone, the mobile phone or the smartphone accesses a cloud computer or a server to obtain "information" from the cloud computer or the server. In this way, the control device 18 receives a signal for displaying an image in the image display device 100A or 100B. The control device 18 performs well-known image processing on the basis of this signal, and displays "information" in the image forming device 111 as an image. The "information" is displayed as a virtual image at a predetermined position controlled by the control device 18 on the basis of light emitted from the image forming device 111 in the light guide device 120 or 130. That is, a virtual image is formed in a part of the virtual image forming region (second deflecting unit 123 or 133).

In addition, in a case where the light control device 500 is provided, the light control device 500 is controlled such that a light shielding ratio of the virtual image projection region 511 of the light control device 500 including a projected image of a virtual image on the light control device 500 is higher than a light shielding ratio of the other region 512 of the light control device 500. Specifically, the control device 18 controls voltages applied to the first transparent electrode 502 and the second transparent electrode 504.

Here, the size and position of the virtual image projection region 511 of the light control device 500 are determined on the basis of a signal for displaying an image in the image forming device 111.

In some cases, a signal for displaying an image in the image display device 100A or 100B may be stored in the display device (specifically, the control device 18 or the image information storage device 18A).

Alternatively, an image imaged by the imaging device 17 included in the display device may be sent to a cloud computer or a server via a communication unit. The cloud computer or the server may retrieve various kinds of information and data corresponding to the image imaged by the imaging device 17. The various kinds of information and data retrieved may be sent to the display device via the communication unit. An image of the various kinds of information and data retrieved may be displayed on the image display device 100A or 100B. In addition, if input of "information" is performed together with such a form, for example, information such as a place where an observer is located or a direction in which the observer is facing can be weighted. Therefore, "Information" can be displayed on the image forming device 111 with higher accuracy.

A light shielding ratio of the virtual image projection region 511 of the light control device 500 may be increased before a virtual image is formed on the light guide device 120 or 130 on the basis of light emitted from the image forming device 111. Time from an increase in the light shielding ratio of the virtual image projection region 511 of the light control device 500 to formation of a virtual image may be 0.5 to 30 seconds, for example, but is not limited thereto. In this way, an observer can know in advance where and when a virtual image is formed in the light guide device, and therefore virtual image visibility of the observer can be improved. The light shielding ratio of the virtual image projection region 511 of the light control device 500 may increase sequentially as time elapses. That is, a so-called fade-in state can be formed.

In a case where no virtual image is formed, a light shielding ratio of the entire light control device 500 only needs to be set to the same value as a light shielding ratio of another region of the light control device 500. When formation of a virtual image is completed and the virtual image disappears, the light shielding ratio of the virtual image projection region 511 of the light control device 500 including a projected image of the virtual image on the light control device 500 may be immediately set to the same value as the light shielding ratio of another region of the light control device 500, or may be controlled so as to be the same value as the light shielding ratio of another region of the light control device 500 over time (for example, in three seconds). That is, a so-called fade-out state can be formed.

Figure 26A:
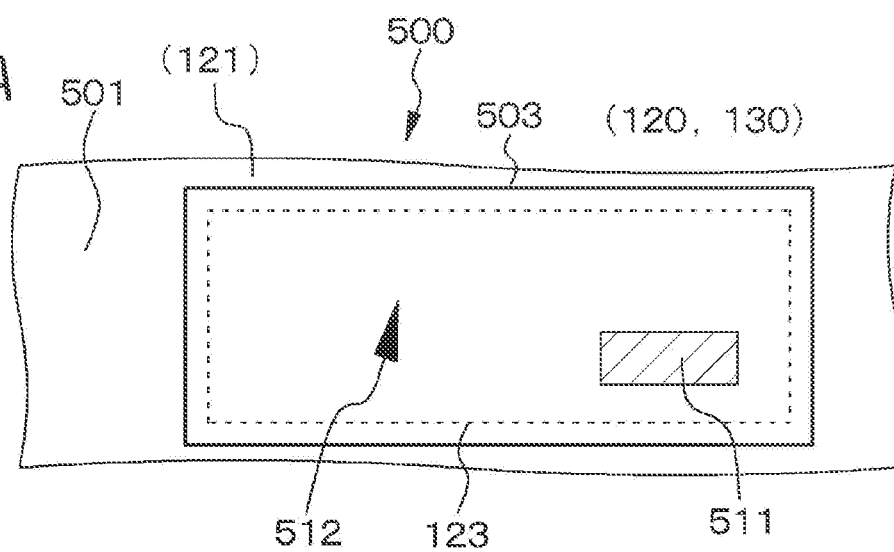
Figure 26B:
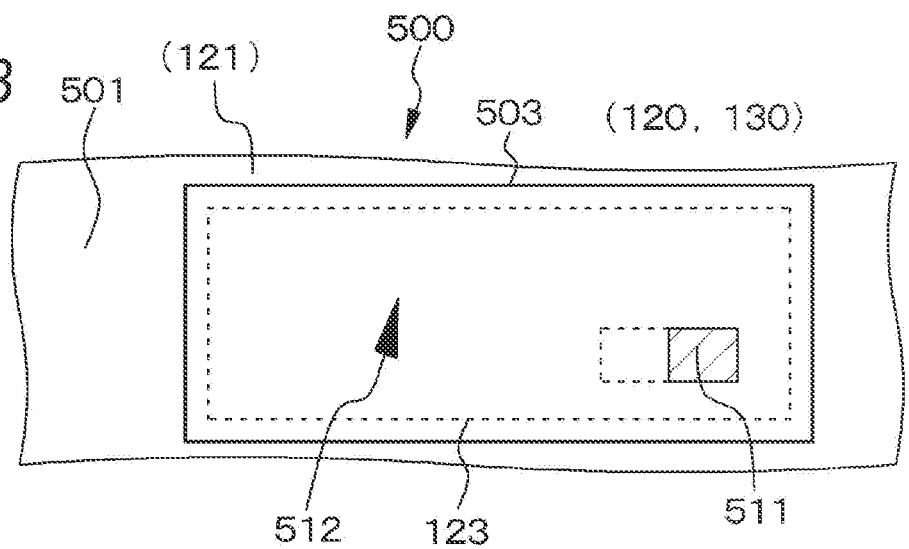
Figure 26C:
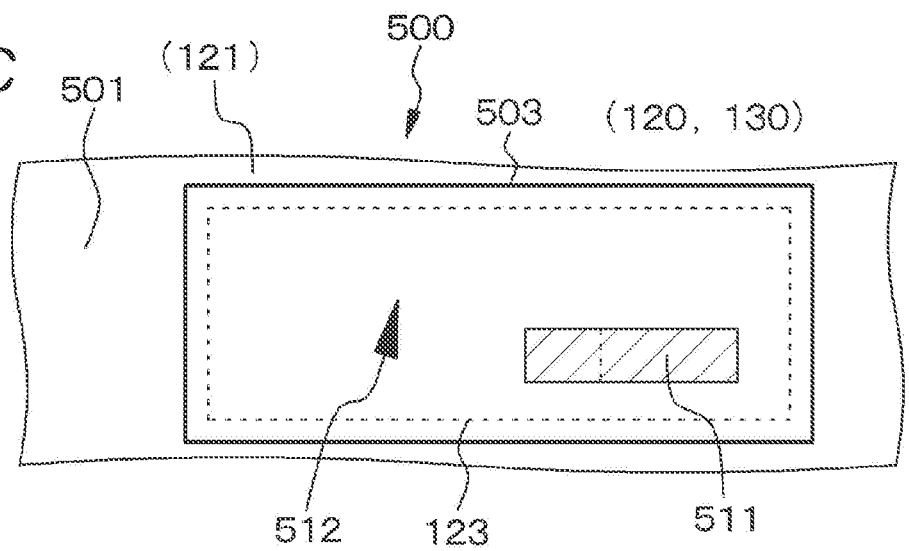

It is assumed that one virtual image is formed on the light guide device 120 or 130 on the basis of light emitted from the image forming device 111 and then a subsequent virtual image different from the one virtual image is formed. In this case, if the area of the virtual image projection region 511 of the light control device 500 corresponding to one virtual image is represented by $S_1$ and the area of the virtual image projection region 511 of the light control device 500 corresponding to a subsequent virtual image is represented by $S_2$, in a case of $S_2/S_1 < 0.8$ or $1 < S_2/S_1$, the virtual image projection region 511 of the light control device 500 on which a subsequent virtual image is formed may be a region of the light control device 500 including a projected image of a subsequent virtual image on the light control device 500 (refer to FIGS. 26A, 26B, and 26C), and in a case of $0.8 \leq S_2/S_1 \leq 1$, the virtual image projection region 511 of the light control device 500 on which a subsequent virtual image is formed may be a region of the light control device 500 including a projected image of one virtual image on the light control device 500 That is, from formation of one virtual image to formation of a subsequent virtual image, in a case where the area of a virtual image projection region is reduced by 0% to 20%, a virtual image projection region corresponding to one virtual image can be held (that is, the state illustrated in FIG. 26A is held).

Figure 27:
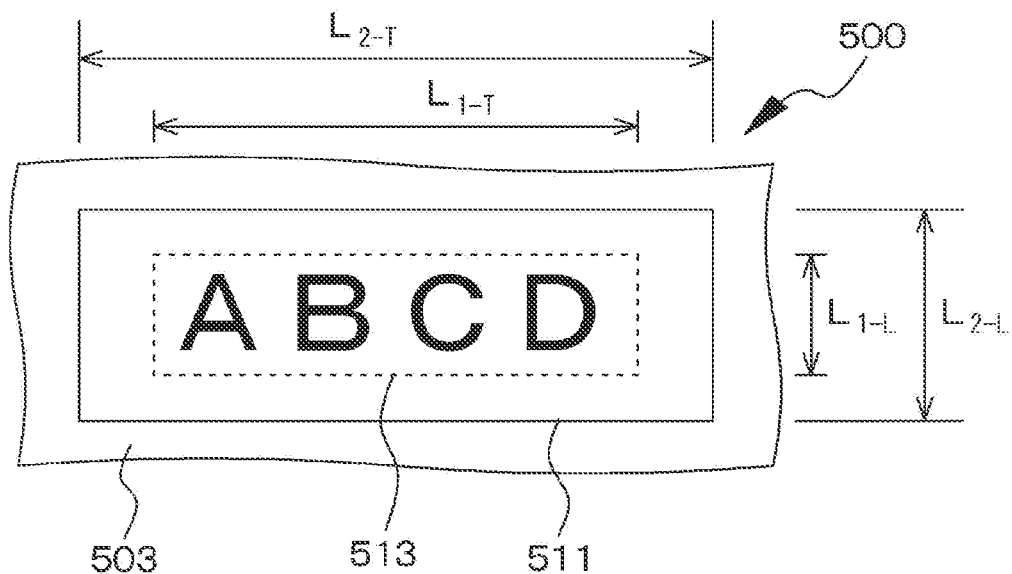
FIG. 27 is a diagram schematically illustrating a virtual rectangle circumscribed with a virtual image formed in a light guide device and a rectangular shape of a virtual image projection region of a light control device.

In addition, as illustrated in FIG. 27, assuming a virtual rectangle 513 circumscribed with a virtual image formed in the light guide device 120 or 130, the virtual image projection region 511 of the light control device 500 may be larger than the virtual rectangle 513. In addition, in this case, if the lengths of the virtual rectangle 513 circumscribed with a virtual image formed in the light guide device 120 or 130 in a transverse direction and a longitudinal direction are represented by $L_{1-T}$ and $L_{1-L}$, respectively, and the shape of the virtual image projection region 511 of the light control device 500 is a rectangular shape having lengths of $L_{2-T}$ and $L_{2-L}$ in the transverse direction and the longitudinal direction, respectively, $$1.0 \leq L_{2-T}/L_{1-T} \leq 1.5 \text{ and}$$

$$1.0 \leq L_{2-L}/L_{1-L} \leq 1.5$$

are preferably satisfied. Note that "ABCD" is formed as a virtual image in FIG. 27.

The light control device 500 may be in an operation state all the time, may be determined to be in an operation/non-operation (ON/OFF) state by instruction (operation) of an observer, or may be normally in a non-operation state while starting operation on the basis of a signal for displaying an image in the image display device 100A or 100B. In order to determine an operation/non-operation state by instruction (operation) of an observer, for example, the display device only needs to further include a microphone via which a voice is input and the light control device 500 is thereby controlled. Specifically, switching of operation/non-operation of the light control device 500 only needs to be controlled according to an instruction based on a real voice of an observer. Alternatively, information to be obtained may be input by voice input. Alternatively, the display device only needs to further include an infrared input/output device to control operation of the light control device 500. Specifically, switching of operation/non-operation of the light control device 500 only needs to be controlled by detection of the blink of an observer by the infrared input/output device.

As described above, in the display device of Example 6, when a virtual image is formed in a part of a virtual image forming region on the basis of light emitted from an image forming device, a light control device is controlled such that a light shielding ratio of a virtual image projection region of the light control device including a projected image of a virtual image on the light control device is higher than a light shielding ratio of another region of the light control device. Therefore, high contrast can be imparted to a virtual image observed by an observer. In addition, the entire light control device is not a region having a high light shielding ratio, but only a narrow region such as a virtual image projection region of the light control device including a projected image of a virtual image on the light control device is a region having a high light shielding ratio. Therefore, an observer using the display device can reliably and safely recognize an external environment.

A frame includes a front portion disposed in front of an observer, two temple portions rotatably attached to both ends of the front portion via hinges, and a nose pad. The light control device 500 may be disposed in the front portion. In addition, the light guide device may be attached to the light control device 500. Incidentally, the light guide device may be attached to the light control device 500 while being in a close contact thereto, or may be attached to the light control device 500 with a gap therebetween. Furthermore, in these cases, as described above, the front portion may have a rim, and the light control device 500 may be fitted in the rim. Alternatively, the light guide plate 121 or 131 (first substrate 501) and/or the second substrate 503 may be fitted in the rim, the light control device 500 and the light guide plate 121 or 131 may be fitted in the rim, or the light guide plate 121 or 131 may be fitted in the rim.

The light control layer 505 may be constituted by an optical shutter including a liquid crystal display device. In this case, specifically, the light control layer 505 may include a liquid crystal material layer containing, for example, a twisted nematic (TN) type liquid crystal material or a super twisted nematic (STN) type liquid crystal material. The first transparent electrode 502 and the second transparent electrode 504 are patterned. A light shielding ratio (light transmittance) of the region 512 as a part of the light control device 500 can be changed to a light shielding ratio different from a light shielding ratio of another region. Alternatively, one of the first transparent electrode 502 and the second transparent electrode 504 is a so-called solid electrode not patterned, the other is patterned and connected to a TFT. Then, a light shielding ratio of the minimum unit region 508 in which a light shielding ratio of the light control device 500 changes is controlled by the TFT. That is, the light shielding ratio may be controlled on the basis of an active matrix method. It goes without saying that the control of the light shielding ratio based on the active matrix method can be applied to the light control device 500 described in Example 6 or either one of Examples 7 and 8 described later.

In addition, it is also possible to use an optical shutter for controlling the light shielding ratio (light transmittance) by an electrowetting phenomenon. Specifically, a first transparent electrode and a second transparent electrode are provided, and a space between the first transparent electrode and the second transparent electrode is filled with an insulating first liquid and a conductive second liquid. Then, by applying a voltage between the first transparent electrode and the second transparent electrode, the shape of an interface formed by the first liquid and the second liquid changes, for example, from a flat shape to a curved shape, and the light shielding ratio (light transmittance) can be thereby controlled. Alternatively, an optical shutter applying an electrodeposition method (electrodeposition/electric field deposition) based on an electrodeposition/dissociation phenomenon generated by a reversible oxidation-reduction reaction of metal (for example, silver particles) can be used. Specifically, by dissolving $Ag^+$ and $I^-$ in an organic solvent and applying an appropriate voltage to an electrode, $Ag^+$ is reduced to precipitate Ag, and a light shielding ratio (light transmittance) of the light control device is thereby decreased. Meanwhile, Ag is oxidized to be dissolved as $Ag^+$, and the light shielding ratio (light transmittance) of the light control device is thereby increased.

In some cases, light passing through the light control device can be colored to a desired color by the light control device. In this case, a color to which light is colored by the light control device can be variable. Specifically, for example, it is only required to laminate a light control device colored in red, a light control device colored in green, and a light control device colored in blue.

The light control device may be detachably disposed in a region from which light of the light guide device is emitted. In this way, in order to detachably dispose the light control device, for example, it is only required to attach the light control device to the light guide device using a screw manufactured from transparent plastic, and to connect the light control device to a control circuit (for example, included in the control device 18 for controlling an image forming device) for controlling a light shielding ratio (light transmittance) of the light control device via a connector and wiring.

It goes without saying that the light control device of Example 7 described above can be applied to the display device described in any one of Examples 3 to 5.

Example 7

Figure 28A:
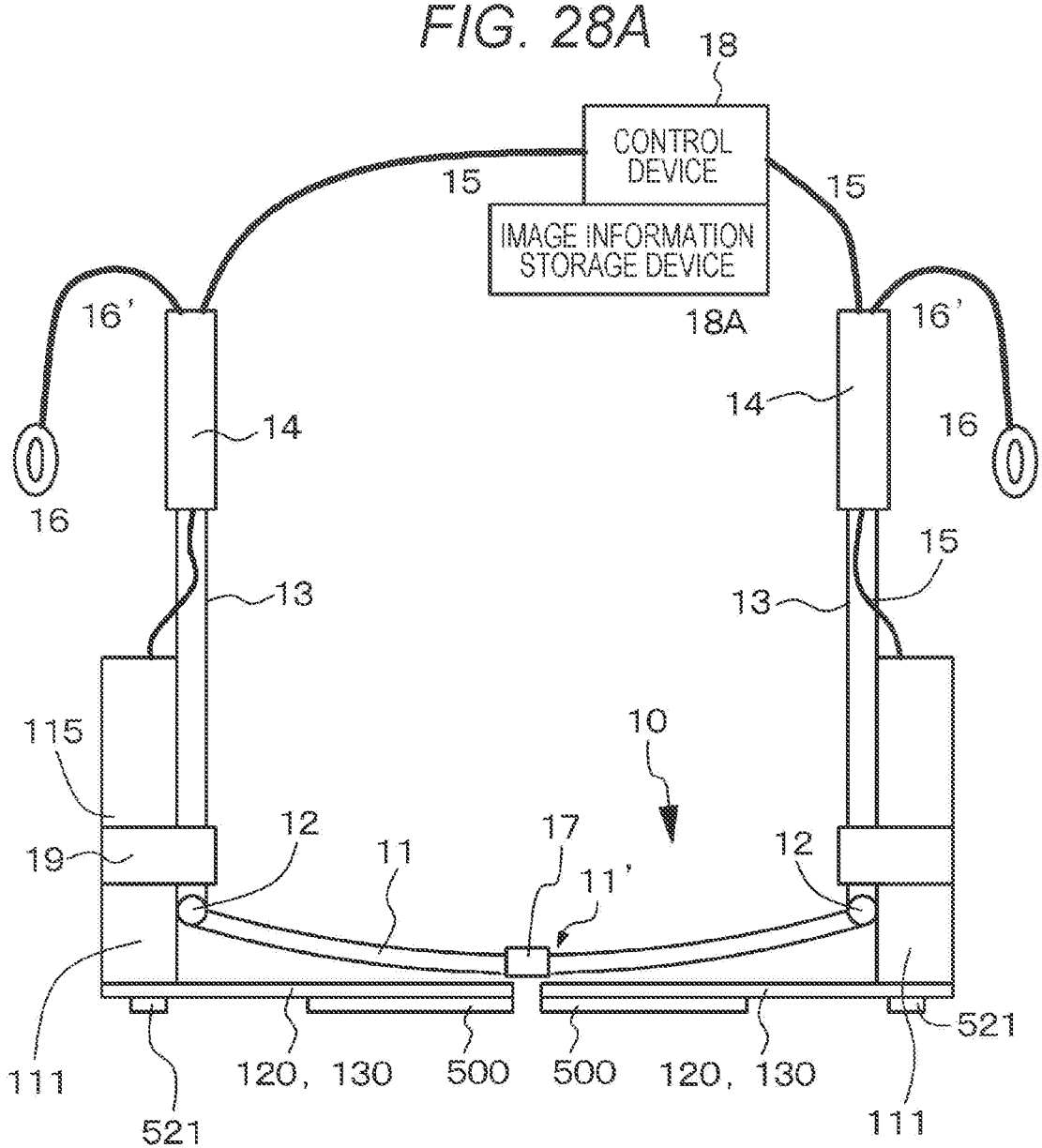
FIGS. 28A and 28B are a schematic view of a display device of Example 7 as viewed from above and a schematic diagram of a circuit for controlling an environmental illuminance measuring sensor, respectively.
Figure 28B:
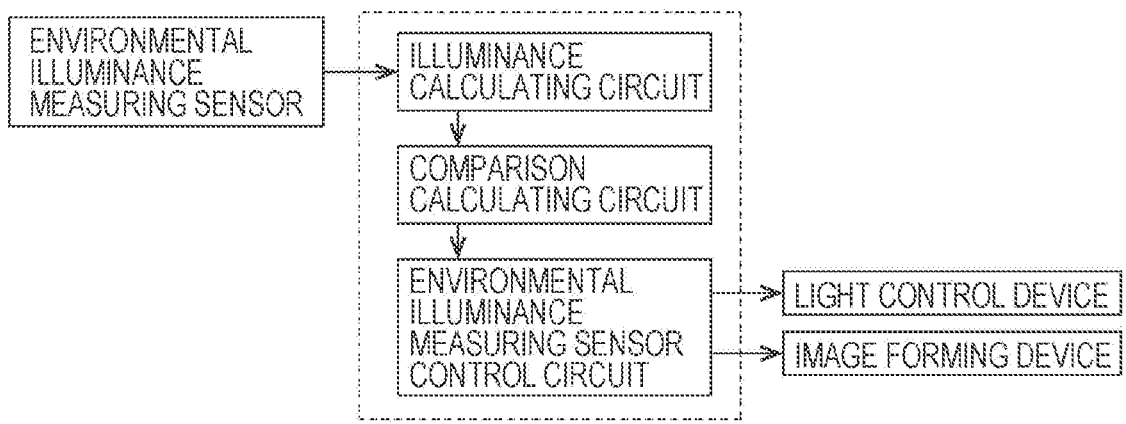

Example 7 is a modification of Example 6. FIG. 28A illustrates a schematic view of the display device of Example 7 as viewed from above. In addition, FIG. 28B illustrates a schematic diagram of a circuit for controlling an environmental illuminance measuring sensor.

The display device of Example 7 further includes an environmental illuminance measuring sensor 521 for measuring illuminance of an environment where the display device is placed, and controls a light shielding ratio of the light control device 500 on the basis of a measurement result of the environmental illuminance measuring sensor 521. At the same time, or independently, the display device of Example 7 controls brightness of an image formed by the image forming device 111 on the basis of the measurement result of the environmental illuminance measuring sensor 521. The environmental illuminance measuring sensor 521 having a well-known configuration and structure only needs to be disposed, for example, at an outer end portion of the light guide device 120 or 130 and an outer end portion of the light control device 500. The environmental illuminance measuring sensor 521 is connected to the control device 18 via a connector and wiring (not illustrated). The control device 18 includes a circuit for controlling the environmental illuminance measuring sensor 521. The circuit for controlling the environmental illuminance measuring sensor 521 includes an illuminance calculating circuit for receiving a measurement value from the environmental illuminance measuring sensor 521 to determine illuminance, a comparison calculating circuit for comparing an illuminance value determined by the illuminance calculating circuit with a standard value, and an environmental illuminance measuring sensor control circuit for controlling the light control device 500 and/or the image forming device 111 on the basis of the value determined by the comparison calculating circuit. These circuits may be constituted by well-known circuits. In control of the light control device 500, a light shielding ratio of the light control device 500 is controlled. Meanwhile, in control of the image forming device 111, brightness of an image formed by the image forming device 111 is controlled. Incidentally, control of the light shielding ratio in the light control device 500 and control of the brightness of an image in the image forming device 111 may be performed independently or with correlation.

For example, when a measurement result of the environmental illuminance measuring sensor 521 becomes a predetermined value (first illuminance measurement value) or more, the light shielding ratio of the light control device 500 is set to a predetermined value (first light shielding ratio) or more. Meanwhile, when a measurement result of the environmental illuminance measuring sensor 521 becomes a predetermined value (second illuminance measurement value) or less, the light shielding ratio of the light control device 500 is set to a predetermined value (second light shielding ratio) or less. Here, the first illuminance measurement value may be 10 lux, and the first light shielding ratio may be any value of 99% to 70%, the second illuminance measurement value may be 0.01 lux, and the second light shielding ratio may be any value of 49% to 1%.

Note that the environmental illuminance measuring sensor 521 in Example 7 can be applied to the display device described in any one of Examples 1 to 5. In addition, in a case where the display device includes the imaging device 17, the environmental illuminance measuring sensor 521 can be constituted by a light receiving element for exposure measurement included in the imaging device 17.

In the display device of Example 7 or Example 8 described below, a light shielding ratio of the light control device is controlled on the basis of a measurement result of the environmental illuminance measuring sensor, brightness of an image formed by the image forming device is controlled on the basis of a measurement result of the environmental illuminance measuring sensor, a light shielding ratio of the light control device is controlled on the basis of a measurement result of the transmitted light illuminance measuring sensor, and brightness of an image formed by the image forming device is controlled on the basis of a measurement result of the transmitted light illuminance measuring sensor. Therefore, it is possible not only to impart a high contrast to a virtual image observed by an observer but also to optimize an observation state of a virtual image depending on illuminance of an environment around the display device.

Example 8

Figure 29A:
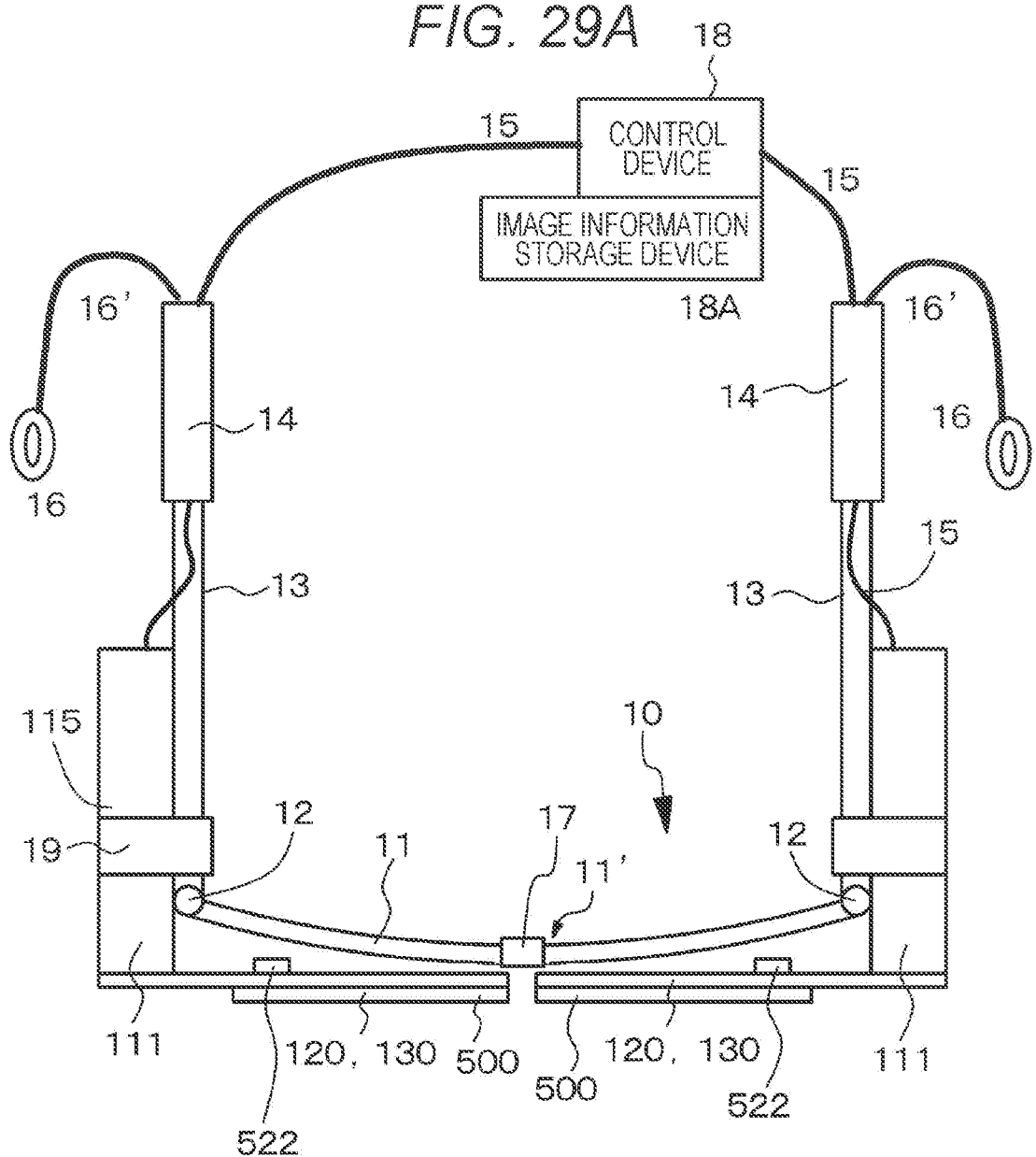
FIGS. 29A and 29B are a schematic view of a display device of Example 8 as viewed from above and a schematic diagram of a circuit for controlling a transmitted light illuminance measuring sensor, respectively.
Figure 29B:
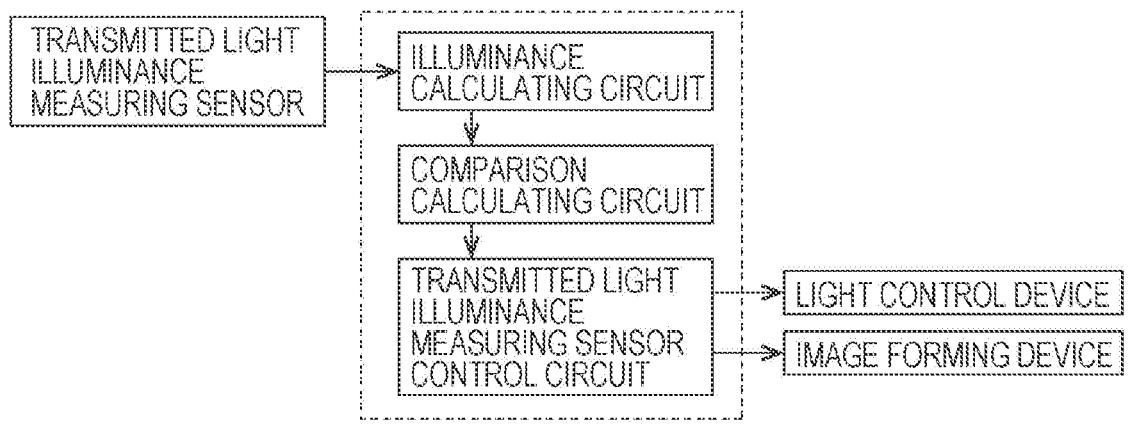

Example 8 is a modification of Example 6. FIG. 29A illustrates a schematic view of the display device of Example 8 as viewed from above. In addition, FIG. 29B illustrates a schematic diagram of a circuit for controlling a transmitted light illuminance measuring sensor.

The display device of Example 8 further includes a transmitted light illuminance measuring sensor 522 for measuring illuminance based on light which has passed through the light control device from an external environment, that is, for measuring whether environmental light passes through the light control device and is incident at desired illuminance adjusted, and controls a light shielding ratio of the light control device 500 on the basis of a measurement result of the transmitted light illuminance measuring sensor 522. At the same time, or independently, the display device of Example 8 controls brightness of an image formed by the image forming device 111 on the basis of the measurement result of the transmitted light illuminance measuring sensor 522. The transmitted light illuminance measuring sensor 522 having a well-known configuration and structure is disposed closer to an observer than the light guide device 120 or 130. Specifically, it is only required to dispose the transmitted light illuminance measuring sensor 522, for example, on an inner surface of the casing 115 or on a surface of the light guide plate 121 or 131 on an observer side. The transmitted light illuminance measuring sensor 522 is connected to the control device 18 via a connector and wiring (not illustrated). The control device 18 includes a circuit for controlling the transmitted light illuminance measuring sensor 522. The circuit for controlling the transmitted light illuminance measuring sensor 522 includes an illuminance calculating circuit for receiving a measurement value from the transmitted light illuminance measuring sensor 522 to determine illuminance, a comparison calculating circuit for comparing an illuminance value determined by the illuminance calculating circuit with a standard value, and a transmitted light illuminance measuring sensor control circuit for controlling the light control device 500 and/or the image forming device 111 on the basis of the value determined by the comparison calculating circuit. These circuits may be constituted by well-known circuits. In control of the light control device 500, a light shielding ratio of the light control device 500 is controlled. Meanwhile, in control of the image forming device 111, brightness of an image formed by the image forming device 111 is controlled. Incidentally, control of the light shielding ratio in the light control device 500 and control of the brightness of an image in the image forming device 111 may be performed independently or with correlation. Furthermore, in a case where a measurement result of the transmitted light illuminance measuring sensor 522 cannot be controlled to desired illuminance in view of illuminance of the environmental illuminance measuring sensor 521, that is, in a case where a measurement result of the transmitted light illuminance measuring sensor 522 is not desired illuminance, or in a case where even more delicate illumination adjustment is desired, it is only required to adjust a light transmittance of the light control device while a value of the transmitted light illuminance measuring sensor 522 is monitored. At least two transmitted light illuminance measuring sensors may be disposed, and illuminance based on light which has passed through a portion with a high light shielding ratio and illuminance based on light which has passed through a portion with a low light shielding ratio may be measured.

Note that the transmitted light illuminance measuring sensor 522 in Example 8 can be applied to the display device described in any one of Examples 1 to 5. Alternatively, the transmitted light illuminance measuring sensor 522 in Example 8 and the environmental illuminance measuring sensor 521 in Example 7 may be combined with each other. In this case, various tests may be performed, and control of a light shielding ratio in the light control device 500 and control of brightness of an image in the image forming device 111 may be performed independently or with correlation. By adjusting voltages applied to the first transparent electrode and the second transparent electrode in each of the right eye light control device and the left eye light control device, light shielding ratios in the right eye light control device and the left eye light control device can be equalized. A potential difference between the first transparent electrode and the second transparent electrode may be controlled, or a voltage applied to the first transparent electrode and a voltage applied to the second transparent electrode may be independently controlled. The light shielding ratios in the right eye light control device and the left eye light control device can be controlled, for example, on the basis of a measurement result of the transmitted light illuminance measuring sensor 522, or can be controlled and adjusted manually by observation of brightness of light which has passed through the right eye light control device and light guide device and brightness of light which has passed through the left eye light control device and light guide device by an observer and operation of a switch, a button, a dial, a slider, a knob, or the like by the observer.

Example 9

Figure 30:
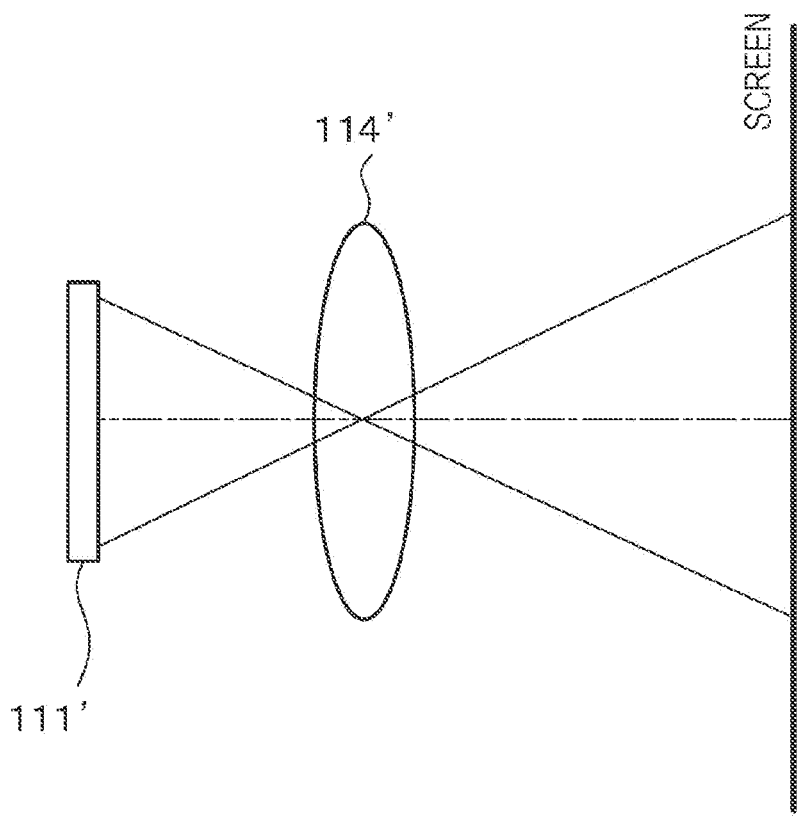
FIG. 30 is a conceptual diagram of an optical device (projector) of Example 9.

Example 9 relates to an optical device of the present disclosure, specifically, to a projector. As illustrated in the conceptual diagram of the optical device (projector) of Example 9 in FIG. 30, the optical device (projector) of Example 9 includes an image forming device 111' and a lens system 114' for projecting an image from the image forming device 111' on an outside (for example, a screen). The image forming device 111' has substantially a similar configuration and structure to the image forming device 111 described in Example 1. Specifically, the image forming device 111' includes a plurality of (for example, 1920×1080) pixels arranged in a two-dimensional matrix. Each pixel includes the light emitting element 300 described in Example 1. The image forming device 111' and the lens system 114' are housed in a casing (not illustrated). Light emitted from the light emitting element 300 constituting the image forming device 111' is incident on the lens system 114', and light emitted from the lens system 114' is projected on a screen. By connecting the optical device of Example 9 to a DVD player or a personal computer, an image can be projected on a screen on the basis of an image signal output from the DVD player or the personal computer. Alternatively, the optical device of Example 9 can be used as a displaying device in which an observer directly observes an image emitted from the optical device of Example 9. In this case, the lens system 114' can be omitted in some cases.

Hitherto, the present disclosure has been described on the basis of the preferable Examples. However, the present disclosure is not limited to these Examples. The configurations and structures of the optical device, the display device (head mounted display), the image display device, the image forming device, the light guide device, and the laminated structure described in Examples are illustrative and can be appropriately changed. For example, a surface relief type hologram (refer to U.S. Pat. No. 20040062505 A1) may be disposed on the light guide plate. In the light guide device, a diffraction grating member may be constituted by a transmission type diffraction grating member. Alternatively, one deflecting unit of the first deflecting unit and the second deflecting unit may be constituted by a reflection type diffraction grating member, and the other may be constituted by a transmission type diffraction grating member. Alternatively, the diffraction grating member may be a reflection type blazed diffraction grating member. The display device of the present disclosure can also be used as a stereoscopic displaying device. In this case, if necessary, it is only required to detachably attach a polarizing plate or a polarizing film to the light guide device, or to bond a polarizing plate or a polarizing film to the light guide device.

Figure 31:
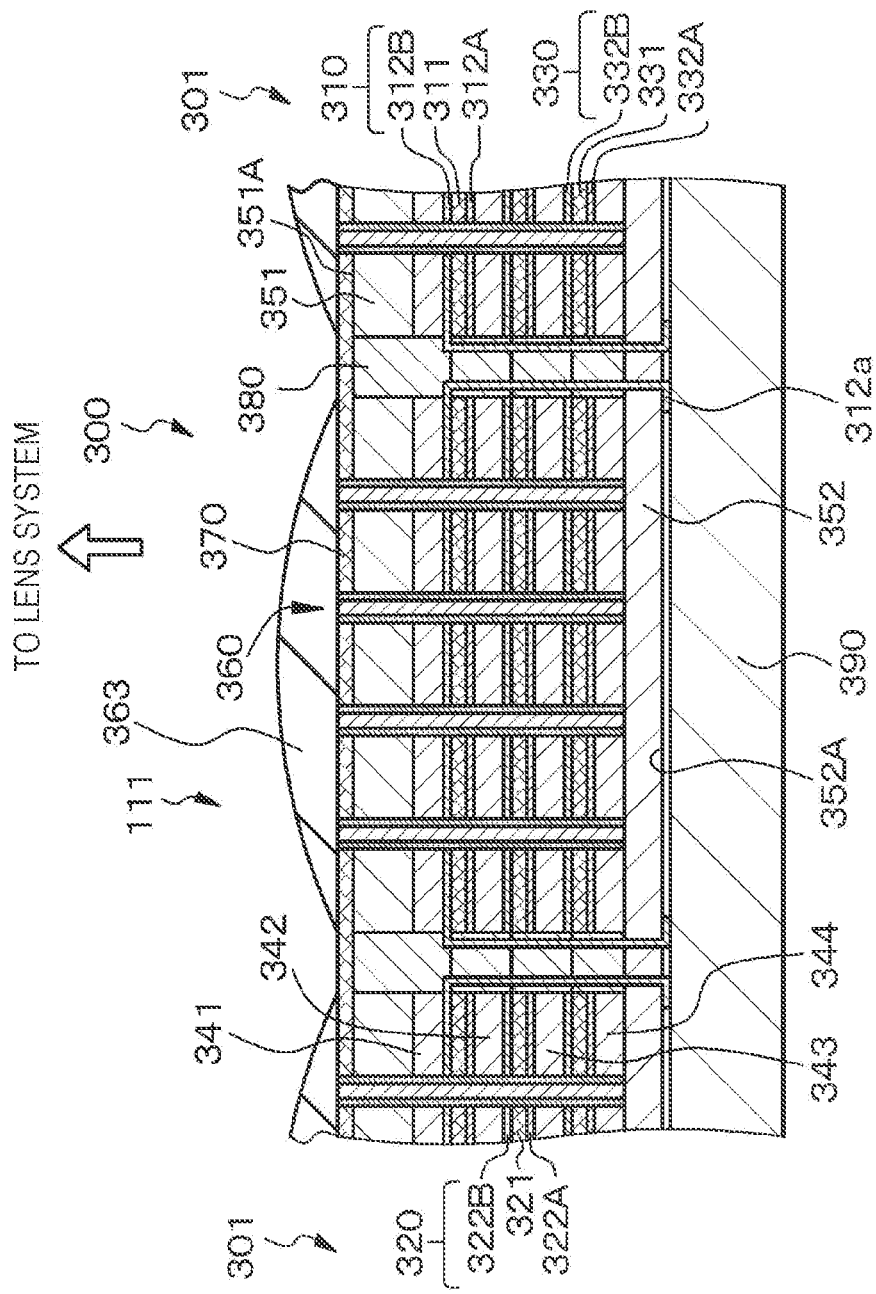
FIG. 31 is a schematic partial cross-sectional view obtained by cutting a light emitting element constituting a modified example of the display device of Example 1 along a virtual vertical plane.
Figure 32:
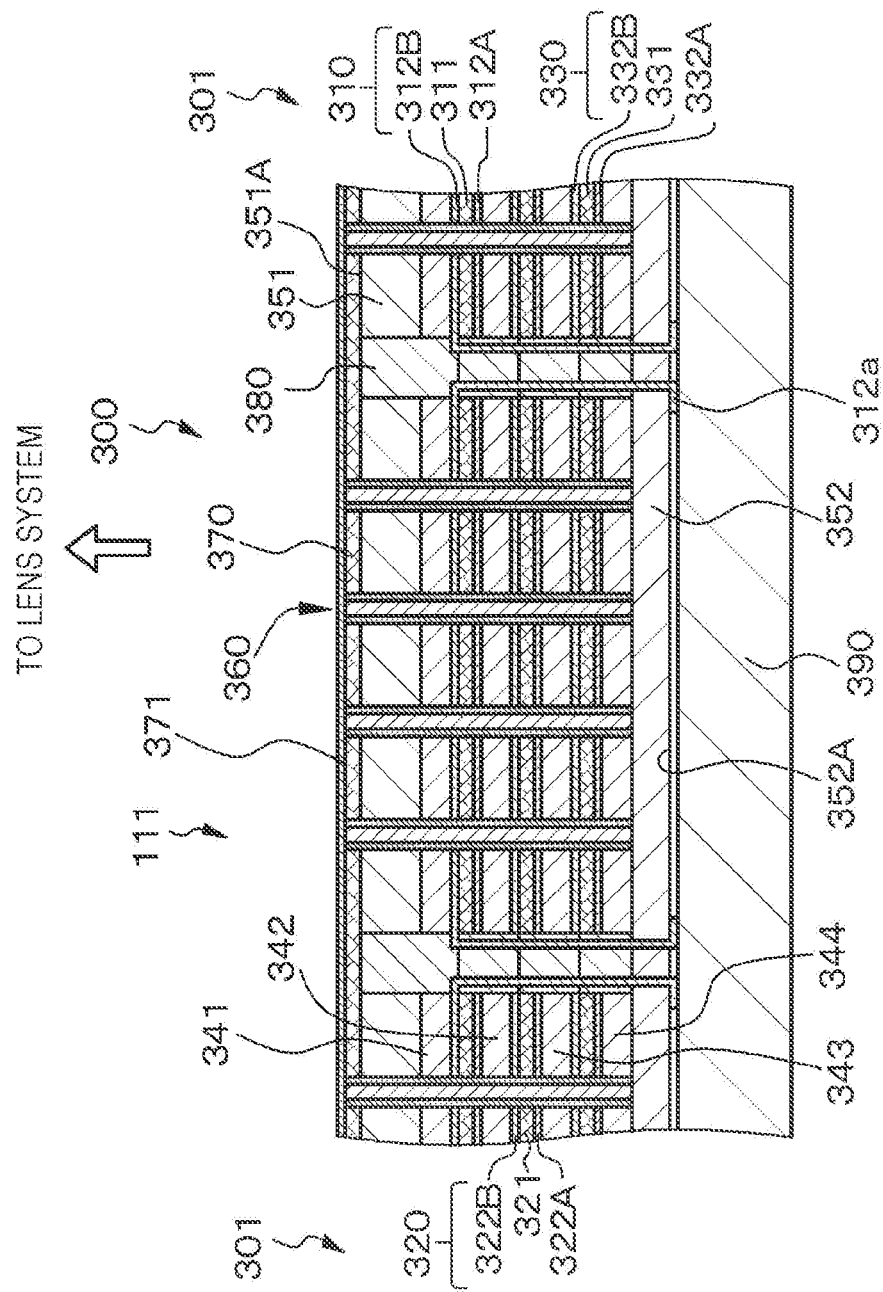
FIG. 32 is a schematic partial cross-sectional view obtained by cutting a light emitting element constituting another modified example of the display device of Example 1 along a virtual vertical plane.

In the optical device or the display device of the present disclosure, as illustrated in the schematic partial cross-sectional view of a light emitting element cut along a virtual vertical plane in FIG. 31, the light emitting element may further include a condenser lens 363 for condensing light emitted from the through hole 360. In addition, as illustrated in the schematic partial cross-sectional view of a light emitting element cut along a virtual vertical plane in FIG. 32, a protective film 371 including, for example, $SiO_2$ may be formed on top surfaces of the antireflection layer (light absorbing layer) 370, the core portion 361, and the clad layer 362. An AR coating layer may be formed on the protective film 371, or a moth-eye structure or a fine uneven structure may be formed on a top surface of the protective film 371.

In manufacturing a deflecting unit, by superimposing two photopolymer layers and making ultraviolet irradiation amounts of a photopolymer film constituting a lower layer and a photopolymer film constituting an upper layer different from each other, two diffraction grating layers having different slant angles of diffraction grating members which have been subjected to a heat treatment and the same surface pitch Λ of an interference fringe on a surface can be formed. In addition this makes it possible to adjust a width and efficiency of a diffraction wavelength. By matching the diffraction wavelength with a wavelength of a light source, it is possible to manufacture a high brightness light guide device. Specifically, by making a difference of about 5 J in ultraviolet irradiation amount at a wavelength of 365 nm, a wavelength difference of about 30 nm can be obtained. A heat treatment is performed at a temperature of 100° C. to 120° C. in a conventional oven.

Figure 33A:
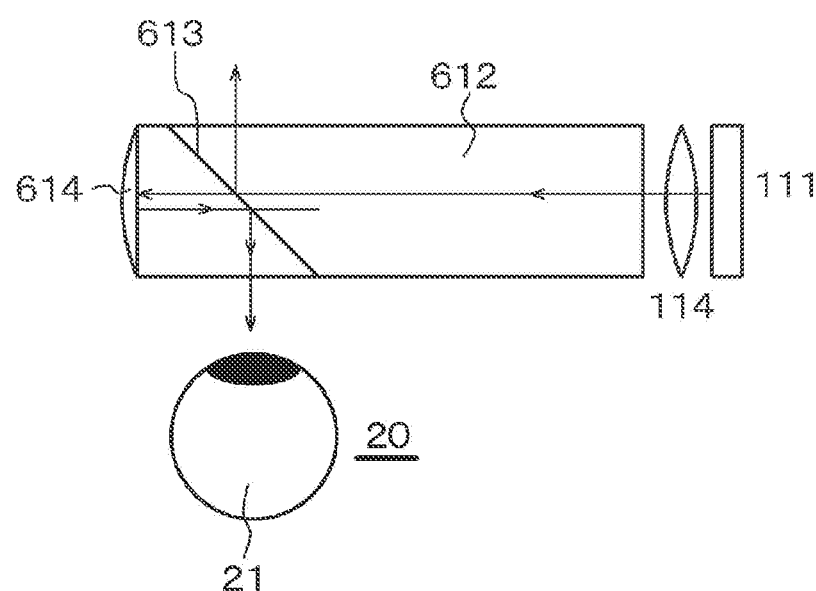
FIG. 33A is a schematic view of a light guide device in a modified example of the display device of Example 4 as viewed from above.

FIG. 33A illustrates a schematic view of a modified example of the light guide device constituting the light guide device described in Example 4 as viewed from above. Note that a light control device is not illustrated in FIGS. 33A and 33B.

In the example illustrated in FIG. 33A, light which has passed through the image forming device 111 and the lens system 114 travels through a light guide member 612 and collides with a semi-transmissive mirror 613. A part of the light passes through the semi-transmissive mirror 613, collides with a reflecting plate 614, is reflected, and collides with the semi-transmissive mirror 613 again. A part of the light is reflected by the semi-transmissive mirror 613 and travels toward the pupil 21 of the observer 20. As described above, the light guide device includes the light guide member 612, the semi-transmissive mirror 613, and the reflecting plate 614. The semi-transmissive mirror 613 corresponds to a virtual image forming region of the light guide device.

Figure 33B:
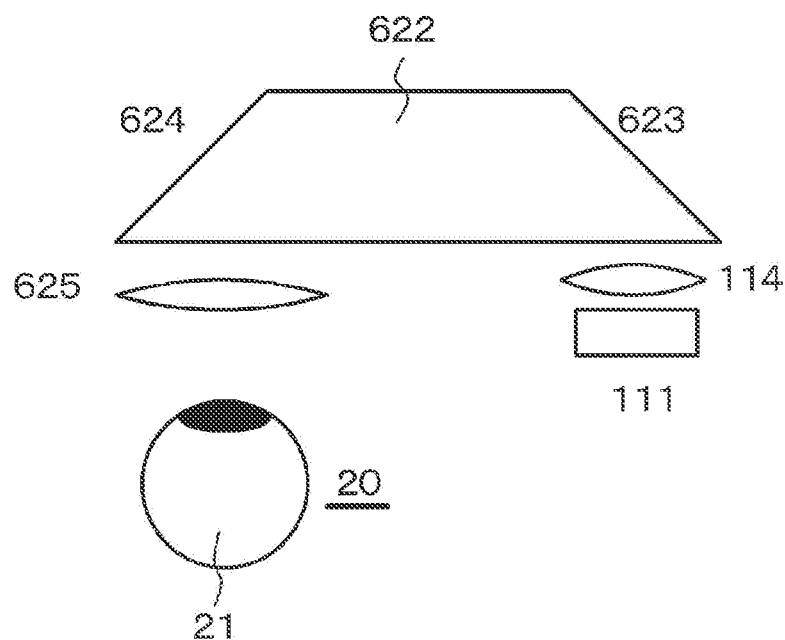
Figure 33C:
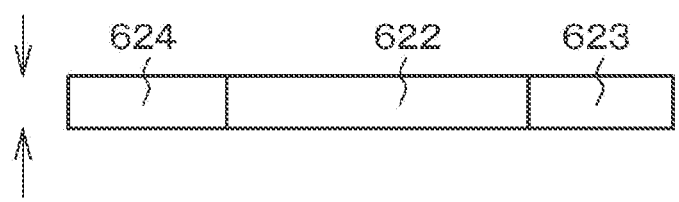
Figure 34:
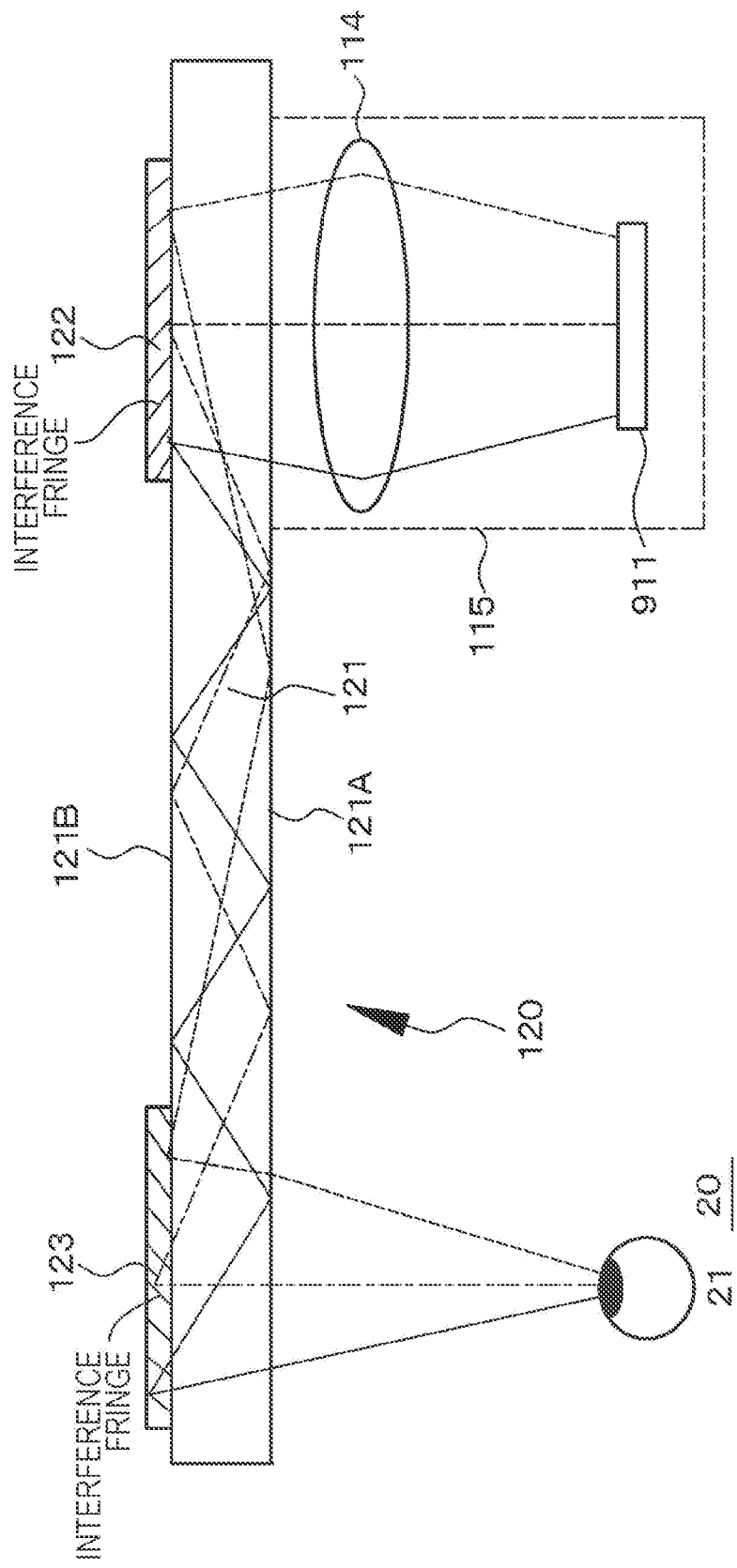
FIG. 34 is a conceptual diagram of a conventional image display device.

Alternatively, FIGS. 33B and 33C illustrate a schematic view of a light guide device in another modified example of the display device of Example 4 as viewed from above and a schematic view thereof as viewed from the front, respectively. This light guide device includes a hexahedron prism 622 and a convex lens 625. Light which has passed through the image forming device 111 and the lens system 114 is incident on a prism 622, collides with a prism surface 623, is reflected, travels through the prism 622, collides with a prism surface 624, is reflected, and reaches the pupil 21 of the observer 20 via the convex lens 625. The prism surface 623 and the prism surface 624 are inclined in a facing direction, and a planar shape of the prism 622 is a trapezoid, specifically, an isosceles trapezoid. Mirror coating has been applied to the prism surfaces 623 and 624. If a thickness (height) of a portion of the prism 622 facing the pupil 21 is thinner than 4 mm which is an average pupil diameter of a human, the observer 20 can view a virtual image from the prism 622 superimposed on an image of an outside world. Note that the present disclosure may have the following configurations.

[A01] An optical device including:
an image forming device; and
a lens system for projecting an image from the image forming device on an outside, in which
the image forming device includes light emitting elements arranged in a two-dimensional matrix,
each of the light emitting elements has a laminated structure including at least one layer of a light emitting laminate including a first electrode, a second electrode, and a light emitting layer provided between the first electrode and the second electrode,
the laminated structure has a through hole which is formed in a lamination direction of the laminated structure and through which light from the light emitting layer is emitted toward the lens system, and
an antireflection layer is formed in a portion of the laminated structure facing the lens system.

[A02] The optical device according to [A01], in which the antireflection layer is formed up to an edge portion of the through hole in the laminated structure.

[A03] The optical device according to [A01] or [A02], in which each of the light emitting elements has a laminated structure including three layers of a light emitting laminate that emits red light, a light emitting laminate that emits green light, and a light emitting laminate that emits blue light.

[A04] The optical device according to any one of [A01] to [A03], in which each of the light emitting elements further includes a condenser lens for condensing light emitted from the through hole.

[A05] The optical device according to any one of [A01] to [A04], in which
  the image forming device further includes a circuit board on which a light emitting element driving circuit is provided, and
  each of the light emitting elements is connected to the light emitting element driving circuit provided on the circuit board.

[A06] The optical device according to any one of [A01] to [A05], in which the image forming device further includes a support substrate constituting the laminated structure on a light emitting side.

[B01] <<Display device>>
A display device including:
(a) a frame mounted on the head of an observer; and
(b) an image display device attached to the frame, in which
the image display device includes:
(A) an image forming device;
(B) a light guide device for guiding an image from the image forming device to the pupil of an observer; and
(C) a lens system for making an image from the image forming device incident on the light guide device,
the image forming device includes light emitting elements arranged in a two-dimensional matrix,
each of the light emitting elements has a laminated structure including at least one layer of a light emitting laminate including a first electrode, a second electrode, and a light emitting layer provided between the first electrode and the second electrode,
the laminated structure has a through hole which is formed in a lamination direction of the laminated structure and through which light from the light emitting layer is emitted toward the lens system, and
an antireflection layer is formed in a portion of the laminated structure facing the lens system.

[B02] The display device according to [B01], in which the antireflection layer is formed up to an edge portion of the through hole in the laminated structure.

[B03] The display device according to [B01] or [B02], in which each of the light emitting elements has a laminated structure including three layers of a light emitting laminate that emits red light, a light emitting laminate that emits green light, and a light emitting laminate that emits blue light.

[B04] The display device according to any one of [B01] to [B03], in which each of the light emitting elements further includes a condenser lens condensing light emitted from the through hole.

[B05] The display device according to any one of [B01] to [B04], in which the image forming device further includes a circuit board on which a light emitting element driving circuit is provided, and each of the light emitting elements is connected to the light emitting element driving circuit provided on the circuit board.

[B06] The display device according to any one of [B01] to [B05], in which the image forming device further includes a support substrate constituting the laminated structure on a light emitting side.

[C01] The display device according to any one of [B01] to [B06], further including a light control device for adjusting the amount of external light incident from an outside, in which
  a virtual image forming region in which a virtual image is formed on the basis of light emitted from the image forming device in the light guide device overlaps with the light control device, and
  if a virtual image is formed in a part of the virtual image forming region on the basis of light emitted from the image forming device, the light control device is controlled such that a light shielding ratio of a virtual image projection region of the light control device including a projected image of a virtual image on the light control device is higher than a light shielding ratio of another region of the light control device.

[C02] The display device according to [C01], in which during operation of the light control device, if a light shielding ratio of a virtual image projection region of the light control device including a projected image of a virtual image on the light control device is assumed to be "1", a light shielding ratio of another region of the light control device is 0.95 or less.

[C03] The display device according to [C01] or [C02], in which during operation of the light control device, the light shielding ratio of the virtual image projection region of the light control device is 35% to 99%.

[C04] The display device according to any one of [C01] to [C03], in which the light shielding ratio of the virtual image projection region of the light control device is increased before a virtual image is formed on the light guide device on the basis of light emitted from the image forming device.

[C05] The display device according to any one of [C01] to [C04], in which
  in a case where one virtual image is formed on the light guide device on the basis of light emitted from the image forming device and then a subsequent virtual image different from the one virtual image is formed, if the area of the virtual image projection region of the light control device corresponding to the one virtual image is represented by $S_1$ and the area of the virtual image projection region of the light control device corresponding to the subsequent virtual image is represented by $S_2$,
  in a case of $S_2/S_1 < 0.8$ or $1 < S_2/S_1$, the virtual image projection region of the light control device on which the subsequent virtual image is formed is a region of the light control device including a projected image of the subsequent virtual image on the light control device, and
  in a case of $0.8 \leq S_2/S_1 \leq 1$, the virtual image projection region of the light control device on which the subsequent virtual image is formed is a region of the light control device including a projected image of the one virtual image on the light control device.

[C06] The display device according to any one of [C01] to [C05], in which
  assuming a virtual rectangle circumscribed with a virtual image formed in the light guide device,
  the virtual image projection region of the light control device is larger than the virtual rectangle.

[C07] The display device according to [C06], in which
if the lengths of the virtual rectangle circumscribed with a virtual image formed in the light guide device in a transverse direction and a longitudinal direction are represented by $L_{1-T}$ and $L_{1-L}$, respectively, and the shape of the virtual image projection region of the light control device is a rectangular shape having lengths of $L_{2-T}$ and $L_{2-L}$ in the transverse direction and the longitudinal direction, respectively, $$1.0 \leq L_{2-T}/L_{1-T} \leq 1.5 \text{ and}$$

$$1.0 \leq L_{2-L}/L_{1-L} \leq 1.5$$

are satisfied.

[C08] The display device according to any one of [C01] to [C07], in which
the light control device includes:
a first substrate;
a second substrate facing the first substrate;
a first transparent electrode provided on a surface facing the first substrate facing the second substrate;
a second transparent electrode provided on a surface facing the second substrate facing the first substrate; and
a light control layer sandwiched between the first transparent electrode and the second transparent electrode.

[C09] The display device according to [C08], in which
the first transparent electrode includes a plurality of band-shaped first transparent electrode segments extending in a first direction,
the second transparent electrode includes a plurality of band-shaped second transparent electrode segments extending in a second direction different from the first direction, and
a light shielding ratio of a portion of the light control device corresponding to an overlap region between the first transparent electrode segments and the second transparent electrode segments is controlled on the basis of control of voltages applied to the first transparent electrode segments and the second transparent electrode segments.

[C10] The display device according to any one of [C01] to [C09], further including an environmental illuminance measuring sensor for measuring illuminance of an environment where the display device is placed, in which
the display device controls a light shielding ratio of the light control device on the basis of a measurement result of the environmental illuminance measuring sensor.

[C11] The display device according to any one of [C01] to [C10], further including an environmental illuminance measuring sensor for measuring illuminance of an environment where the display device is placed, in which
the display device controls brightness of an image formed by the image forming device on the basis of a measurement result of the environmental illuminance measuring sensor.

[C12] The display device according to any one of [C01] to [C11], further including a transmitted light illuminance measuring sensor for measuring illuminance based on light which has passed through the light control device from an external environment, in which
the display device controls a light shielding ratio of the light control device on the basis of a measurement result of the transmitted light illuminance measuring sensor.

[C13] The display device according to any one of [C01] to [C12], further including a transmitted light illuminance measuring sensor for measuring illuminance based on light which has passed through the light control device from an external environment, in which
the display device controls brightness of an image formed by the image forming device on the basis of a measurement result of the transmitted light illuminance measuring sensor.

[C14] The display device according to [C12] or [C13], in which the transmitted light illuminance measuring sensor is disposed closer to an observer than the light guide device.

[C15] The display device according to any one of [C01] to [C14], in which light passing through the light control device is colored to a desired color by the light control device.

[C16] The display device according to [C15], in which a color to which light is colored by the light control device is variable.

[C17] The display device according to [C15], in which a color to which light is colored by the light control device is fixed.

[D01] The display device according to any one of [B01] to [B06], in which a light control device for adjusting the amount of external light incident from an outside is disposed in a region of the light guide device facing at least the pupil of an observer.

[D02] The display device according to [D01], in which the light control device includes:
a first substrate facing the light guide device and a second substrate facing the first substrate;
an electrode provided in each of the first substrate and the second substrate; and
a light transmission control material layer sealed between the first substrate and the second substrate.

[D03] The display device according to [D02], in which the first substrate also serves as a member constituting the light guide device.

[D04] The display device according to [D02] or [D03], in which the second substrate is thinner than the first substrate.

[D05] The display device according to any one of [D01] to [D04], in which the light control device is constituted by an optical shutter in which a light transmission control material layer includes a liquid crystal material layer.

[D06] The display device according to any one of [D01] to [D04], in which the light control device is constituted by an optical shutter in which a light transmission control material layer includes an inorganic electroluminescence material layer.

[D07] The display device according to any one of [D01] to [D06], further including an environmental illuminance measuring sensor for measuring illuminance of an environment where the display device is placed, in which the display device controls a light transmittance of the light control device or controls brightness of an image formed by the image forming device on the basis of a measurement result of the environmental illuminance measuring sensor.

[D08] The display device according to any one of [D01] to [D07], further including a transmitted light illuminance measuring sensor for measuring illuminance based on light which has passed through the light control device from an external environment, in which the display device controls a light transmittance of the light control device and/or controls brightness of an image formed by the image forming device on the basis of a measurement result of the transmitted light illuminance measuring sensor.

[D09] The display device according to [D08], in which the transmitted light illuminance measuring sensor is disposed closer to an observer than the light guide device.

[D10] The display device according to any one of [D01] to [D09], in which a first deflecting unit and a second deflecting unit are covered by one of substrates constituting the light control device.

[D11] The display device according to any one of [D01] to [D10], in which the second deflecting unit is located in a projected image of the light control device, or the light control device is located in a projected image of the second deflecting unit.

[E01] The display device according to any one of [B01] to [D11], in which a light shielding member for shielding external light incident on the light guide device is disposed on the opposite side to an observer with the light guide device as a reference.

[E02] The display device according to any one of [B01] to [D11], in which a light shielding member for shielding external light incident on the light guide device is disposed in a region of the light guide device on which light emitted from the image forming device is incident.

[E03] The display device according to [E01] or [E02], in which the region of the light guide device on which light emitted from the image forming device is incident is included in a projected image of the light shielding member on the light guide device.

[E04] The display device according to any one of [E01] to [E03], in which the light shielding member is disposed away from the light guide device on the opposite side to an observer with the light guide device as a reference.

[E05] The display device according to any one of [E01] to [E04], in which the light shielding member is disposed in a portion of the light guide device on the opposite side to an observer with the light guide device as a reference.

[E06] The display device according to any one of [E01] to [E05], in which
  a light shielding member for shielding external light incident on the light guide device is disposed in a region of the light guide device on which light emitted from the image forming device is incident, and
  a projected image of an end portion of the light control device on the light guide device is included in a projected image of the light shielding member on the light guide device.

[E07] The display device according to any one of [C01] to [D11], in which
  a light shielding member for shielding external light incident on the light guide device is disposed in a region of the light guide device on which light emitted from the image forming device is incident, and
  the light shielding member is disposed in the light control device.

[F01] <<Method for manufacturing light emitting element>>
A method for manufacturing a light emitting element, the method including steps of:
  forming a laminated structure including at least one layer of a light emitting laminate including a first electrode, a second electrode, and a light emitting layer provided between the first electrode and the second electrode;
  then forming an antireflection layer on the laminated structure; and
  then forming a through hole for emitting light from the light emitting layer toward an outside in the antireflection layer and the laminated structure in a lamination direction of the laminated structure.

[G01] <<Light emitting element>>
A light emitting element including a laminated structure including at least one layer of a light emitting laminate including a first electrode, a second electrode, and a light emitting layer provided between the first electrode and the second electrode, in which
  in the laminated structure, a through hole formed in a lamination direction of the laminated structure for emitting light from the light emitting layer to an outside is formed, and
  an antireflection layer is formed in the laminated structure on a light emitting side.

[G02] The light emitting element according to [G01], in which the antireflection layer is formed up to an edge portion of the through hole in the laminated structure.

REFERENCE SIGNS LIST

10 Frame
10' Nose pad
11 Front portion
11' Central portion of front portion
12 Hinge
13 Temple portion
14 Modern portion
15 Wiring (signal line, power supply line, or the like)
16 Headphone portion
16' Headphone portion wiring
17 Imaging device
18 Control device (control circuit or control unit)
18A Image information storage device
19 Attachment member
20 Observer
21 Pupil
100A, 100B, 200A, 200B Image display device
111, 111' Image forming device
114, 114' Lens system
115 Casing
120, 130, 220, 230 Light guide device
121, 131 Light guide plate
121A, 131A First surface of light guide plate
121B, 131B Second surface of light guide plate
122, 132 First deflecting unit
123, 133, 223 Second deflecting unit
122$a$, 123$a$ Interference fringe
124 Transparent protective member
125 Sealing member
221 Transparent member
231 Glass plate
233 Semi-transmissive mirror
300 Light emitting element
301 Laminated structure
310, 320, 330 Light emitting laminate (first light emitting laminate, second light emitting laminate, or third light emitting laminate)
311, 321, 331 Light emitting layer
312A, 322A, 332A First electrode
312B, 322B, 332B Second electrode
312$a$, 312$b$, 322$a$, 322$b$, 332$a$, 332$b$ Contact portion
341 First insulating layer
342 Second insulating layer
343 Third insulating layer
344 Fourth insulating layer
351 Support substrate
351A Surface of support substrate
352 Second support substrate
360 Through hole 361 Core portion
362 Clad layer
363 Condenser lens
370 Antireflection layer (light absorbing layer)
371 Protective film
380 Separation groove
390 Circuit board
401, 402 Light shielding member
500 Light control device
501 First substrate (transparent protective member also serves as first substrate)
502 First transparent electrode
502A First transparent electrode segment
503 Second substrate
504 Second transparent electrode
504A Second transparent electrode segment
505 Light control layer
505A $WO_3$ layer
505B $Ta_2O_5$ layer
505C $Ir_xSn_{1-x}O$ layer
506 Protective layer
507 Sealing material
508 Minimum unit region in which light shielding ratio of light control device changes
511 Virtual image projection region
512 Another region of light control device
513 Virtual rectangle
521 Environmental illuminance measuring sensor
522 Transmitted light illuminance measuring sensor
612 Light guide member
613 Semi-transmissive mirror
614 Reflecting plate
622 Prism
623, 624 Prism surface
625 Convex lens
CL Central light beam

The invention claimed is:

1. An optical device, comprising:
   an image forming device that includes:
      a plurality of light emitting elements, wherein each light emitting element of the plurality of light emitting elements includes:
         an antireflection layer; and
         a laminated structure that includes:
            a through hole;
            a first electrode;
            a second electrode; and
            a light emitting layer between the first electrode and the second electrode, wherein the light emitting layer is configured to emit light via the through hole;
      a circuit board;
      a first support substrate, wherein the first support substrate is between the first electrode and the circuit board; and
      an insulating layer between the first support substrate and the first electrode, wherein the insulating layer is in contact with each of the first electrode and the first support substrate; and
   a lens system configured to:
      receive the light emitted from the light emitting layer; and
      project an image to an outside of the optical device based on the received light.

2. The optical device according to claim 1, wherein the lens system is further configured to reflect the received light.

3. The optical device according to claim 1, wherein
   each light emitting element of the plurality of light emitting elements further includes a condenser lens on the antireflection layer, and
   the antireflection layer faces the lens system such that the light reflected by the lens system is not reflected by the image forming device.

4. The optical device according to claim 1, wherein the antireflection layer is up to an edge portion of the through hole in the laminated structure such that the antireflection layer is absent on the through hole.

5. The optical device according to claim 1, wherein
   the laminated structure further includes at least one layer of a light emitting laminate, and
   the at least one layer of the light emitting laminate includes one of:
      a first light emitting element configured to emit red light,
      a second light emitting element configured to emit green light, or
      a third light emitting element configured to emit blue light.

6. The optical device according to claim 3, wherein the condenser lens is configured to condense the light emitted via the through hole.

7. The optical device according to claim 1, wherein
   the image forming device further includes a light emitting element driving circuit on the circuit board, and
   each light emitting element of the plurality of light emitting elements is connected to the light emitting element driving circuit.

8. The optical device according to claim 1, wherein
   the image forming device further includes a second support substrate different from the first support substrate, and
   the second support substrate is on the second electrode.

9. A display device, comprising:
   a head mountable frame; and
   an image display device attached to the head mountable frame, wherein
   the image display device includes:
      an image forming device that includes:
         a plurality of light emitting elements, wherein
         each light emitting element of the plurality of light emitting elements includes:
            an antireflection layer; and
            a laminated structure that includes:
               a through hole;
               a first electrode;
               a second electrode; and
               a light emitting layer between the first electrode and the second electrode, wherein the light emitting layer is configured to emit light via the through hole;
         a circuit board;
         a first support substrate, wherein the first support substrate is between the first electrode and the circuit board; and
         an insulating layer between the first support substrate and the first electrode, wherein the insulating layer is in contact with each of the first electrode and the first support substrate; and
      a lens system configured to:
         receive the light emitted from the light emitting layer; and
         project an image to an outside of an optical device based on the received light.

10. The display device according to claim 9, wherein the lens system is further configured to reflect the received light.

11. The display device according to claim 9, wherein
each light emitting element of the plurality of light emitting elements further includes a condenser lens on the antireflection layer, and
the antireflection layer faces the lens system such that the light reflected by the lens system is not reflected by the image forming device.

12. The display device according to claim 9, wherein the antireflection layer is up to an edge portion of the through hole in the laminated structure such that the antireflection layer is absent on the through hole.

13. The display device according to claim 9, wherein
the laminated structure further includes at least one layer of a light emitting laminate, and
the at least one layer of the light emitting laminate includes one of:
  a first light emitting element configured to emit red light,
  a second light emitting element configured to emit green light, or
  a third light emitting element configured to emit blue light.

14. The display device according to claim 11, wherein the condenser lens is configured to condense the light emitted via the through hole.

15. The display device according to claim 9, wherein
the image forming device further includes a light emitting element driving circuit on the circuit board, and
each light emitting element of the plurality of light emitting elements is connected to the light emitting element driving circuit.

16. The display device according to claim 9, wherein
the image forming device further includes a second support substrate different from the first support substrate, and
the second support substrate is on the second electrode.

17. The optical device according to claim 7, wherein
the first support substrate includes a contact portion, and
each light emitting element of the plurality of light emitting elements is connected to the light emitting element driving circuit via the contact portion.

18. The optical device according to claim 1, wherein
the image forming device further includes a protective film on a surface of the antireflection layer, and
a shape of an upper surface of the protective film is a moth-eye shape.

* * * * *